(12) United States Patent
Yamazaki et al.

(10) Patent No.: US 11,094,804 B2
(45) Date of Patent: Aug. 17, 2021

(54) METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Masami Jintyou, Tochigi (JP); Yukinori Shima, Gunma (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 16/429,194

(22) Filed: Jun. 3, 2019

(65) Prior Publication Data

US 2019/0326420 A1    Oct. 24, 2019

Related U.S. Application Data

(63) Continuation of application No. 14/645,781, filed on Mar. 12, 2015, now Pat. No. 10,361,290.

(30) Foreign Application Priority Data

Mar. 14, 2014 (JP) .................. 2014-051798

(51) Int. Cl.
*H01L 21/00* (2006.01)
*H01L 29/66* (2006.01)
(Continued)

(52) U.S. Cl.
CPC .... *H01L 29/66969* (2013.01); *H01L 21/0234* (2013.01); *H01L 21/0262* (2013.01);
(Continued)

(58) Field of Classification Search
CPC ......... H01L 29/66969; H01L 21/02326; H01L 21/0234; H01L 21/02554; H01L 21/02565;
(Continued)

(56) References Cited

U.S. PATENT DOCUMENTS 5,528,032 A    6/1996  Uchiyama
5,731,856 A    3/1998  Kim et al.
(Continued)

FOREIGN PATENT DOCUMENTS

EP    1737044 A    12/2006
EP    2226847 A     9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Mohammad M Hoque
(74) *Attorney, Agent, or Firm* — Fish & Richardson P.C.

(57) ABSTRACT

Provided is a method for manufacturing a semiconductor device whose electric characteristics are prevented from being varied and whose reliability is improved. In the method, an insulating film is formed over an oxide semiconductor film, a buffer film is formed over the insulating film, oxygen is added to the buffer film and the insulating film, a conductive film is formed over the buffer film to which oxygen is added, and an impurity element is added to
(Continued)

the oxide semiconductor film using the conductive film as a mask. An insulating film containing hydrogen and overlapping with the oxide semiconductor film may be formed after the impurity element is added to the oxide semiconductor film.

6 Claims, 38 Drawing Sheets

(51) Int. Cl.
- H01L 29/786 (2006.01)
- H01L 29/49 (2006.01)
- H01L 21/02 (2006.01)
- H01L 29/423 (2006.01)

(52) U.S. Cl.
CPC .. *H01L 21/02326* (2013.01); *H01L 21/02472* (2013.01); *H01L 21/02483* (2013.01); *H01L 21/02554* (2013.01); *H01L 21/02565* (2013.01); *H01L 21/02573* (2013.01); *H01L 29/42384* (2013.01); *H01L 29/4908* (2013.01); *H01L 29/4966* (2013.01); *H01L 29/7869* (2013.01); *H01L 29/78621* (2013.01)

(58) Field of Classification Search
CPC ......... H01L 21/02573; H01L 21/02472; H01L 21/02483; H01L 21/0262; H01L 29/4966; H01L 29/7869; H01L 29/4908; H01L 21/47573; H01L 21/477
USPC ........................................................ 438/104
See application file for complete search history.

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,015,550 B2 | 3/2006 | Sugimae et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,003,981 B2 | 8/2011 | Iwasaki et al. | |
| 8,384,076 B2 | 2/2013 | Park et al. | |
| 8,461,007 B2 | 6/2013 | Yamazaki | |
| 8,530,289 B2 | 9/2013 | Yamazaki | |
| 8,546,225 B2 | 10/2013 | Yamazaki | |
| 8,546,892 B2 | 10/2013 | Imoto et al. | |
| 8,624,240 B2 | 1/2014 | Sato et al. | |
| 8,686,416 B2 | 4/2014 | Honda et al. | |
| 8,748,240 B2 | 6/2014 | Yamazaki | |
| 8,835,921 B2 | 9/2014 | Honda et al. | |
| 8,916,424 B2 | 12/2014 | Isobe et al. | |
| 8,936,965 B2 | 1/2015 | Imoto et al. | |
| 8,946,790 B2 | 2/2015 | Yokoi et al. | |
| 8,956,912 B2 | 2/2015 | Yamazaki | |
| 9,099,303 B2 | 8/2015 | Yamazaki | |
| 9,117,662 B2 | 8/2015 | Isobe et al. | |
| 9,196,690 B2 | 11/2015 | Honda et al. | |
| 9,496,375 B2 | 11/2016 | Isobe et al. | |
| 9,564,457 B2 | 2/2017 | Yamazaki | |
| 2001/0046027 A1 | 11/2001 | Tai et al. | |
| 2002/0024298 A1* | 2/2002 | Fukunaga | H01L 51/5203 |
| | | | 313/506 |
| 2002/0056838 A1 | 5/2002 | Ogawa | |
| 2002/0132454 A1 | 9/2002 | Ohtsu et al. | |
| 2003/0113972 A1 | 6/2003 | Hayashi et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0233575 A1 | 10/2005 | Abe | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishilh | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0202743 A1* | 8/2009 | Schaepkens | H01L 31/03926 |
| | | | 427/576 |

(56) References Cited

U.S. PATENT DOCUMENTS

| | | |
|---|---|---|
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0224871 A1 | 9/2010 | Yamaguchi et al. |
| 2010/0304529 A1 | 12/2010 | Sasaki et al. |
| 2011/0095288 A1 | 4/2011 | Morosawa et al. |
| 2011/0212570 A1 | 9/2011 | Yamazaki et al. |
| 2011/0263083 A1 | 10/2011 | Yamazaki |
| 2011/0284844 A1 | 11/2011 | Endo et al. |
| 2011/0303913 A1 | 12/2011 | Yamazaki et al. |
| 2012/0001167 A1 | 1/2012 | Morosawa |
| 2012/0112182 A1 | 5/2012 | Ishii et al. |
| 2012/0112184 A1 | 5/2012 | Yamazaki et al. |
| 2012/0187396 A1 | 7/2012 | Yamazaki et al. |
| 2012/0187397 A1 | 7/2012 | Yamazaki et al. |
| 2012/0231580 A1 | 9/2012 | Yamazaki et al. |
| 2012/0256177 A1 | 10/2012 | Yamazaki |
| 2012/0313152 A1 | 12/2012 | Yokoi et al. |
| 2012/0315730 A1 | 12/2012 | Koezuka et al. |
| 2013/0052799 A1* | 2/2013 | Ohki ............... H01L 21/76254 438/458 |
| 2013/0092924 A1 | 4/2013 | Sasagawa et al. |
| 2013/0126862 A1 | 5/2013 | Yamazaki |
| 2013/0146870 A1 | 6/2013 | Yamazaki |
| 2013/0157422 A1 | 6/2013 | Yamazaki |
| 2013/0161610 A1 | 6/2013 | Yamazaki |
| 2013/0161611 A1 | 6/2013 | Yamazaki et al. |
| 2013/0164920 A1 | 6/2013 | Yamazaki |
| 2013/0187150 A1 | 7/2013 | Yamazaki et al. |
| 2013/0196468 A1* | 8/2013 | Yamazaki ........... H01L 29/4908 438/104 |
| 2013/0203214 A1 | 8/2013 | Isobe et al. |
| 2013/0330877 A1 | 12/2013 | Yamazaki |
| 2015/0091008 A1 | 4/2015 | Yokoi et al. |
| 2015/0155312 A1 | 6/2015 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-220817 A | 8/2007 |
| JP | 2007-220818 A | 8/2007 |
| JP | 2012-009836 A | 1/2012 |
| JP | 2012-109550 A | 6/2012 |
| JP | 2012-129511 A | 7/2012 |
| JP | 2012-216791 A | 11/2012 |
| JP | 2013-016785 A | 1/2013 |
| JP | 2013-149968 A | 8/2013 |
| JP | 2013-153148 A | 8/2013 |
| JP | 2013-168646 A | 8/2013 |
| JP | 2013-175718 A | 9/2013 |
| JP | 2013-179286 A | 9/2013 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED

(56) References Cited

OTHER PUBLICATIONS

Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Patnaik.P, "Aluminum Oxide", Handbook of Inorganic Chemicals, 2003, p. 11, McGraw-Hill.

\* cited by examiner

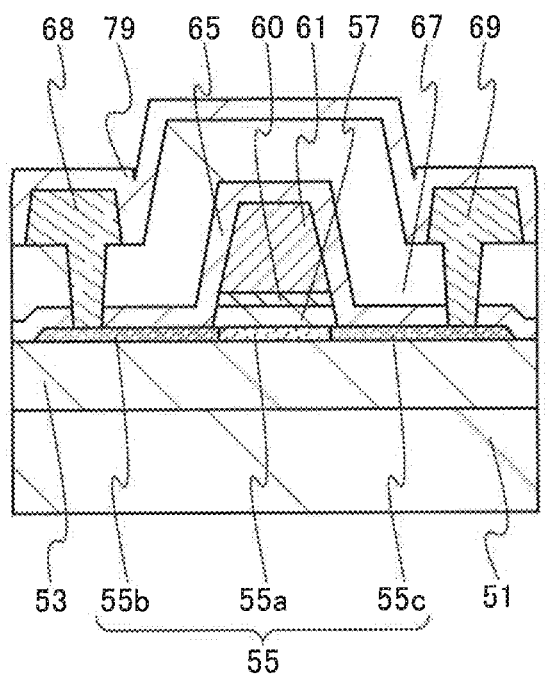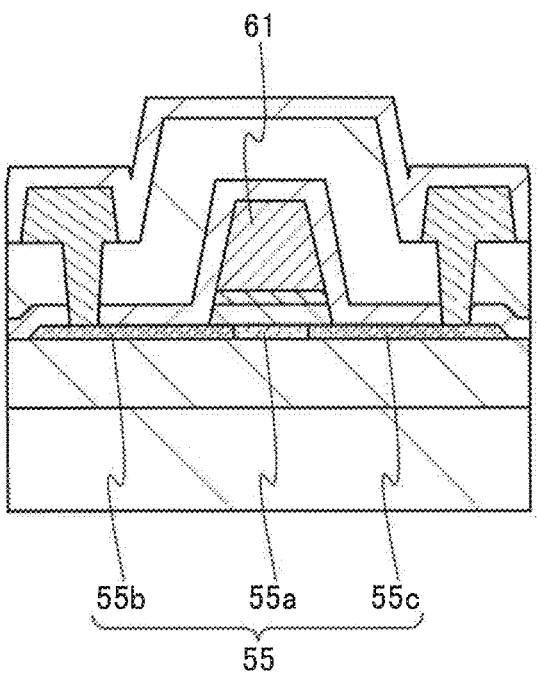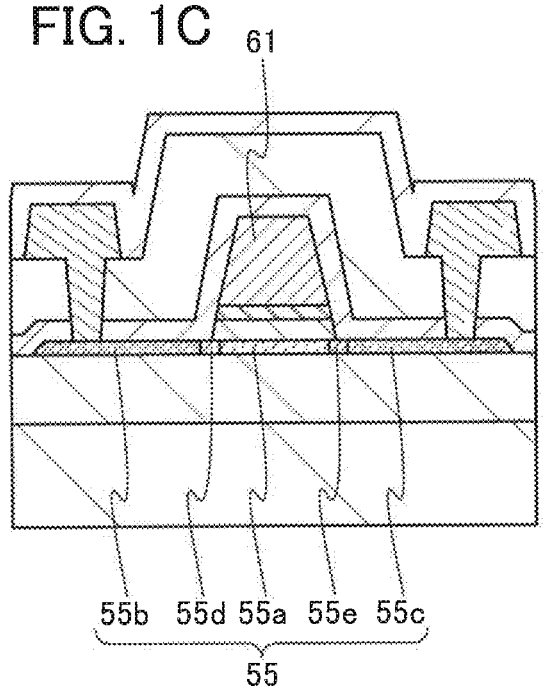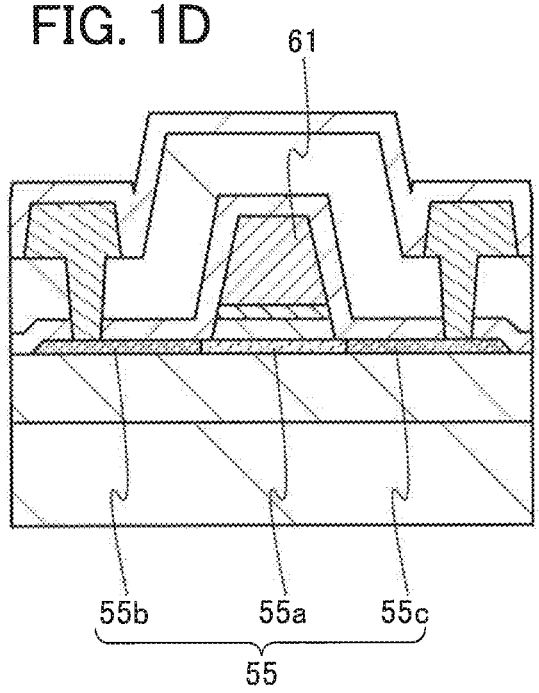

FIG. 37A
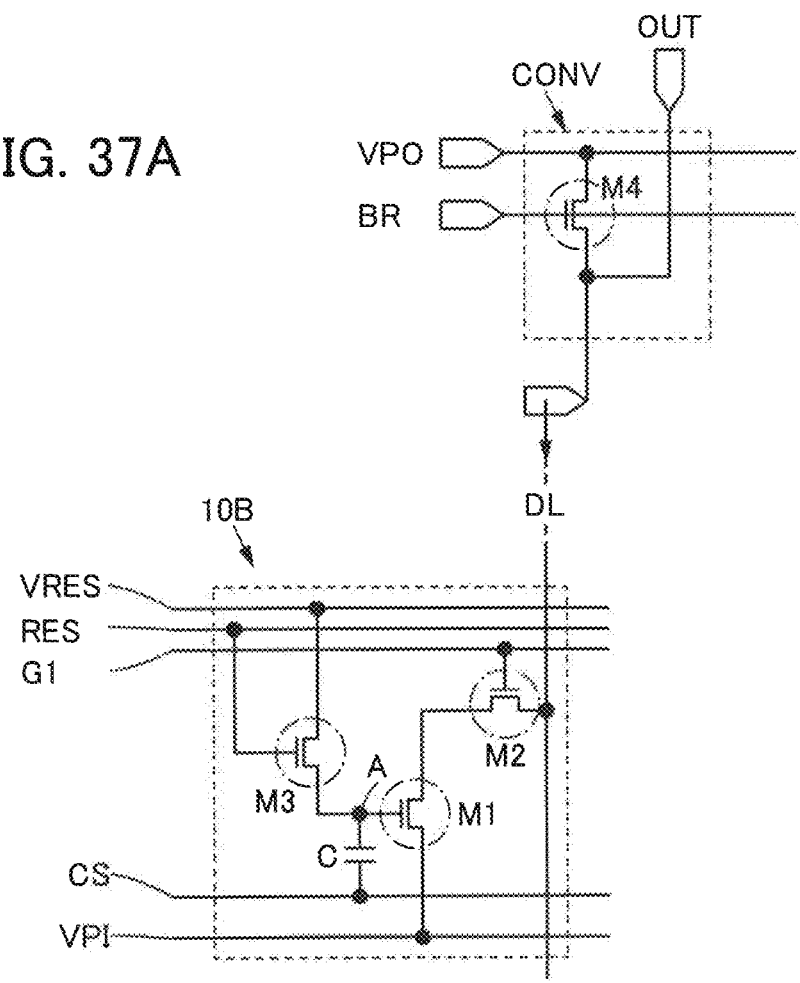
FIG. 37B1
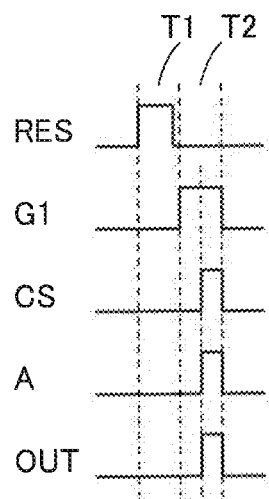
FIG. 37B2
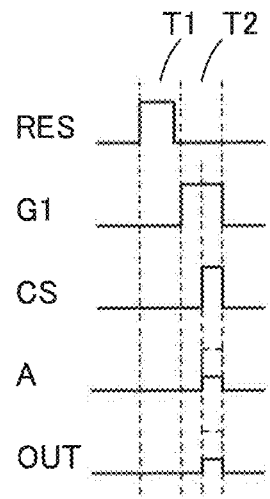

METHOD FOR MANUFACTURING SEMICONDUCTOR DEVICE

CROSS-REFERENCE TO RELATED APPLICATIONS

This application is a continuation of U.S. application Ser. No. 14/645,781, filed Mar. 12, 2015, now allowed, which claims the benefit of a foreign priority application filed in Japan as Serial No. 2014-051798 on Mar. 14, 2014, both of which are incorporated by reference.

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof. Specifically, one embodiment of the present invention relates to a semiconductor device including a field-effect transistor.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), an input/output device, and an electronic device may each include a semiconductor device.

2. Description of the Related Art

Attention has been focused on a technique for forming a transistor using a semiconductor thin film formed over a substrate having an insulating surface (also referred to as thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

A semiconductor device in which an insulating film that releases oxygen by heat is used as a base insulating film of an oxide semiconductor film where a channel is formed is disclosed (see Patent Document 1, for example).

REFERENCE

Patent Document

[Patent Document 1] Japanese Published Patent Application No. 2012-9836

SUMMARY OF THE INVENTION

In a transistor formed using an oxide semiconductor film, oxygen vacancies in a channel region in the oxide semiconductor film cause defects of the electric characteristics of the transistor. For example, the threshold voltage of the transistor that contains oxygen vacancies in the channel region in the oxide semiconductor film easily shifts in the negative direction; thus, the transistor tends to have normally-on characteristics. This is because charge is generated because of the oxygen vacancies in the channel region, resulting in low resistance.

In addition, in the case where a channel region of a transistor using an oxide semiconductor film contains oxygen vacancies, electric characteristics of the transistor, typified by the threshold voltage, are changed with time or changed by a gate bias-temperature (BT) stress test under light irradiation.

In view of the above problems, one object of one embodiment of the present invention is to provide a method for manufacturing a semiconductor device whose electric characteristics are prevented from being varied and whose reliability is improved. Another object of one embodiment of the present invention is to provide a method for manufacturing a semiconductor device with low power consumption. Another object of one embodiment of the present invention is to provide a novel method for manufacturing a semiconductor device. Another object of one embodiment of the present invention is to suppress a change in electric characteristics and to improve reliability of a semiconductor device including a transistor formed using an oxide semiconductor. Another object of one embodiment of the present invention is to provide a semiconductor device with low power consumption. Another object of one embodiment of the present invention is to provide a novel semiconductor device.

Note that the descriptions of these objects do not preclude the existence of other objects. In one embodiment of the present invention, there is no need to achieve all the objects. Other objects will be apparent from and can be derived from the description of the specification, the drawings, the claims, and the like.

One embodiment of the present invention is a method for manufacturing a semiconductor device. In the method, an insulating film is formed over an oxide semiconductor film, a buffer film is formed over the insulating film, oxygen is added to the buffer film and the insulating film, a conductive film is formed over the buffer film to which oxygen is added, and an impurity element is added to the oxide semiconductor film using the conductive film as a mask.

Note that after the impurity element is added to the oxide semiconductor film, an insulating film containing hydrogen and overlapping with the oxide semiconductor film may be formed.

Alternatively, an impurity element may be added to the oxide semiconductor film using the conductive film as a mask after the insulating film to which oxygen is added and the buffer film to which oxygen is added are etched to expose part of the oxide semiconductor film, and the insulating film containing hydrogen and overlapping with the oxide semiconductor film may be formed.

One embodiment of the present invention is a method for manufacturing a semiconductor device. In the method, an insulating film is formed over an oxide semiconductor film, a buffer film whose end portion overlaps with the oxide semiconductor film is formed over the insulating film, oxygen is added to the buffer film and the insulating film, a conductive film is formed over the buffer film to which oxygen is added, and an impurity element is added to the oxide semiconductor film using the conductive film as a mask.

Note that after the impurity element is added to the oxide semiconductor film, an insulating film containing hydrogen and overlapping with the oxide semiconductor film may be formed.

Alternatively, an impurity element may be added to the oxide semiconductor film using the conductive film as a mask after the insulating film to which oxygen is added is etched to expose part of the oxide semiconductor film, and the insulating film containing hydrogen and overlapping with the oxide semiconductor film may be formed.

Heat treatment may be performed after oxygen is added to the buffer film and the insulating film.

In the case where the buffer film to which oxygen is added is an insulator, the conductive film serves as a gate electrode. In the case where the buffer film to which oxygen is added is a semiconductor, the conductive film and the buffer film to which oxygen is added collectively serve as a gate electrode.

The buffer film may contain one or more of indium, zinc, titanium, aluminum, tungsten, tantalum, and molybdenum.

Note that the impurity element is one or more of hydrogen, boron, nitrogen, fluorine, aluminum, phosphorus, and a rare gas. Alternatively, the impurity element is hydrogen and one or more of boron, nitrogen, fluorine, aluminum, phosphorus, and rare gas.

The oxide semiconductor film has a region in contact with the insulating film containing hydrogen. A typical example of the insulating film containing hydrogen is a nitride insulating film. A typical example of the nitride insulating film is a silicon nitride film.

The gate electrode and the oxide semiconductor film may contain the same metal element. In that case, the gate electrode is formed of a conductive oxide semiconductor film.

According to one embodiment of the present invention, a semiconductor device whose electric characteristics are prevented from being varied and whose reliability is improved can be manufactured. According to one embodiment of the present invention, a semiconductor device with low power consumption can be manufactured. According to one embodiment of the present invention, a method for manufacturing a novel semiconductor device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 1A to 1D are cross-sectional views each illustrating one embodiment of a semiconductor device.

FIGS. 37A, 37B1, and 37B2 illustrate configurations and driving methods of a sensor circuit 19 and a converter CONV of one embodiment.

DETAILED DESCRIPTION OF THE INVENTION

Figure 2:
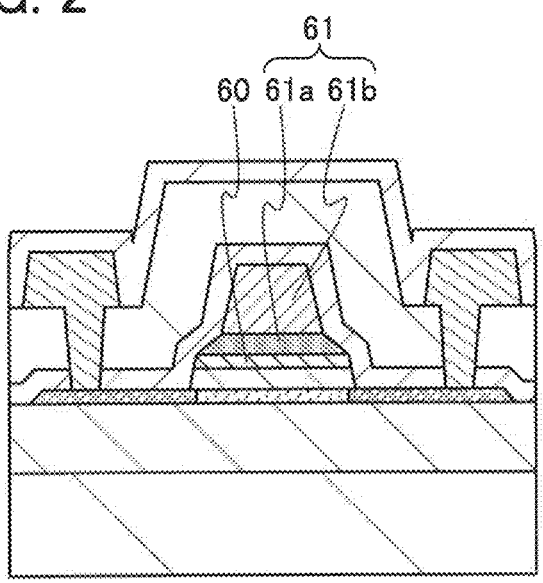
FIG. 2 is a cross-sectional view illustrating one embodiment of a semiconductor device.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components.

Note that the term such as "over" or "below" in this specification and the like does not necessarily mean that a component is placed "directly on" or "directly under" another component. For example, the expression "a gate electrode over a gate insulating film" does not preclude the case where there is an additional component between the gate insulating film and the gate electrode.

In addition, in this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, a transistor is an element having at least three terminals: a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Functions of a "source" and a "drain" are sometimes replaced with each other when a transistor of opposite polarity is used or when the direction of flow of current is changed in circuit operation, for example Therefore, the terms "source" and "drain" can be used to denote the drain and the source, respectively, in this specification and the like.

Note that in this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, embodiments of a semiconductor device and a method for manufacturing the semiconductor device will be described with reference to FIGS. 1A to 1D, FIG. 2, FIGS. 3A to 3D, and FIGS. 4A to 4C.

<Structure of Semiconductor Device>

FIGS. 1A to 1D are each a cross-sectional view of a top-gate self-aligned transistor that is an example of a transistor in a semiconductor device.

A transistor illustrated in FIG. 1A includes an oxide semiconductor film 55, an insulating film 57 in contact with the oxide semiconductor film 55, a buffer film 60 over the insulating film 57, and a conductive film 61 in contact with the buffer film 60 and overlapping with the oxide semiconductor film 55.

The oxide semiconductor film 55 includes a first region 55a and second regions 55b and 55c between which the first region 55a is positioned. The first region 55a has a function of a channel region. The second regions 55b and 55c have functions of a source region and a drain region. Since the resistivity of the second regions 55b and 55c is lower than that of the first region 55a, the second regions 55b and 55c can be referred to as low-resistance regions.

The oxide semiconductor film 55 of the transistor is formed over an insulating film 53 over a substrate 51. An insulating film 65 containing hydrogen in contact with the second regions 55b and 55c of the oxide semiconductor film 55 may be provided.

Furthermore, an insulating film 67 in contact with the insulating film 65 containing hydrogen may be provided. In addition, a pair of conductive films 68 and 69 may be provided so as to be in contact with the second regions 55b and 55c of the oxide semiconductor film 55 in openings in the insulating film 65 containing hydrogen and the insulating film 67. Moreover, an insulating film 79 may be provided over the insulating film 67 and the pair of conductive films 68 and 69.

In the oxide semiconductor film 55, the first region 55a contains fewer oxygen vacancies than the second regions 55b and 55c.

When oxygen vacancies occur in a channel region of a transistor, electrons serving as carriers are generated because of the oxygen vacancies; as a result, the transistor tends to have normally-on characteristics. Since the first region 55a in the oxide semiconductor film 55 has a function of a channel region, reducing oxygen vacancies in the first region 55a is a key factor for stable transistor characteristics.

In methods for forming a transistor of this embodiment, a buffer film (film to be the buffer film 60 in FIGS. 1A to 1D) is formed over an insulating film (insulating film to be the insulating film 57 in FIGS. 1A to 1D), and excess oxygen is added to the insulating film through the buffer film. In the step of adding oxygen, the buffer film suppresses release of oxygen and reduces damage to the insulating film. As a result, the insulating film contains excess oxygen. Then, excess oxygen in the insulating film is moved to an oxide semiconductor film (oxide semiconductor film to be the oxide semiconductor film 55 in FIGS. 1A to 1D) by heat treatment, whereby oxygen vacancies in the oxide semiconductor film can be reduced. To add excess oxygen, an ion implantation method, an ion doping method, or plasma treatment can be used, for example.

Note that if excess oxygen is directly added to the insulating film without forming the buffer film over the insulating film, a surface of the insulating film is etched by several nanometers. The surface of the insulating film contains added oxygen; this means that the etching results in release of part of the added oxygen. Consequently, oxygen contained in the insulating film is insufficient to reduce oxygen vacancies in the oxide semiconductor film. However, since oxygen is added to the insulating film through the buffer film formed over the insulating film, the buffer film can prevent etching of the surface of the insulating film. Accordingly, oxygen sufficient to reduce oxygen vacancies in the oxide semiconductor film can be added to the insulating film.

In addition, since oxygen is added to the insulating film through the buffer film, damage to the insulating film can be reduced while excess oxygen is added to the insulating film. This means that the buffer film serves as a buffer for the insulating film when excess oxygen is introduced to the insulating film through the buffer film.

The buffer film 60 contains one or more of indium, zinc, titanium, aluminum, tungsten, tantalum, and molybdenum. The buffer film 60 is formed using, for example, a metal oxide containing any of the above metal elements, or a metal oxynitride containing any of the above metal elements.

The buffer film 60 is an insulator or a semiconductor depending on the metal element. In the case where the buffer film 60 is formed using an insulator, that is, in the case where the buffer film 60 is an insulating film, the insulating film 57 and the buffer film 60 collectively have a function of a gate insulating film and the conductive film 61 has a function of a gate electrode. In contrast, in the case where the buffer film 60 is formed using a semiconductor, that is, in the case where the buffer film 60 is a semiconductor film, the insulating film 57 has a function of a gate insulating film and the buffer film 60 and the conductive film 61 collectively have a function of a gate electrode.

In the oxide semiconductor film 55, the second regions 55b and 55c each have a region containing an impurity element.

When a source gas for the oxide semiconductor film contains an impurity element, the first region 55a and the second regions 55b and 55c contain the impurity element. In that case, the second regions 55b and 55c each have a region in which the concentration of the impurity element is different from, typically higher than, that of the first region 55a. In the case where the oxide semiconductor film 55 is formed by a sputtering method using a rare gas as a sputtering gas, for example, the oxide semiconductor film 55 contains the rare gas. In addition, the rare gas is intentionally added to the second regions 55b and 55c to form oxygen vacancies, whereby a region with a high concentration of the rare gas is formed in each of the second regions 55b and 55c. As a result, a region with a higher concentration of the rare gas than that of the first region 55a is formed in each of the second regions 55b and 55c. Note that an impurity element different from that added to the first region 55a may be added to the second regions 55b and 55c.

Typical examples of the impurity element are one or more of a rare gas, hydrogen, boron, nitrogen, fluorine, aluminum, and phosphorus. Typical examples of the rare gas are helium, neon, argon, krypton, and xenon.

In the case where boron, nitrogen, fluorine, aluminum, or phosphorus is contained as the impurity element in the second regions 55b and 55c, the impurity concentration of each of the second regions 55b and 55c is higher than that in the first region 55a.

Furthermore, the second regions 55b and 55c in the oxide semiconductor film 55 contain hydrogen and one or more of a rare gas, boron, nitrogen, fluorine, aluminum, and phosphorus. In addition, the second regions 55b and 55c each have a region in which the hydrogen concentration is different from, specifically higher than, that of the first region 55a. This is because hydrogen contained in the insulating film 65 is directly diffused or diffused through the insulating film 57 into the second regions 55b and 55c of the oxide semiconductor film 55.

The hydrogen concentration of each of the second regions 55b and 55c, which is measured by secondary ion mass spectrometry (SIMS), is higher than or equal to $8\times10^{19}$ atoms/cm$^3$, preferably higher than or equal to $1\times10^{20}$ atoms/cm$^3$, further preferably higher than or equal to $5\times10^{20}$ atoms/cm$^3$. The hydrogen concentration of the first region 55a, which is measured by SIMS, is lower than or equal to $5\times10^{19}$ atoms/cm$^3$, preferably lower than or equal to $1\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$, yet still further preferably lower than or equal to $1\times10^{16}$ atoms/cm$^3$.

When the hydrogen concentration of the first region 55a is set in the range described above, generation of electrons serving as carriers in the first region 55a can be suppressed, and the transistor has positive threshold voltage (normally-off characteristics).

When hydrogen is contained in the oxide semiconductor film in which oxygen vacancies are generated by addition of the impurity element, hydrogen enters an oxygen vacant site and forms a donor level in the vicinity of the conduction band. As a result, the conductivity of the oxide semiconductor film is increased, so that the oxide semiconductor film becomes a conductor. The oxide semiconductor film having become a conductor can be referred to as an oxide conductor film. That is, it can be said that, in the oxide semiconductor film 55, the first region 55a is formed of an oxide semiconductor, and the second regions 55b and 55c are formed of an oxide conductor. In the oxide semiconductor film 55, the second regions 55b and 55c have higher hydrogen concentrations than the first region 55a, and have more oxygen vacancies than the first region 55a because of addition of the impurity element. The resistivity of each of the second regions 55b and 55c is preferably greater than or equal to $1\times10^{-3}$ Ωcm and less than $1\times10^{4}$ Ωcm, further preferably greater than or equal to $1\times10^{-3}$ Ωcm and less than $1\times10^{-1}$ Ωcm.

Oxide semiconductors generally have a visible light transmitting property because of their large energy gap. In contrast, an oxide conductor is an oxide semiconductor having a donor level in the vicinity of the conduction band. Thus, the influence of light absorption due to the donor level is small, so that an oxide conductor has a visible light transmitting property comparable to that of an oxide semiconductor.

In the case where the buffer film 60 of the transistor illustrated in FIG. 1A is formed using an insulating film, the interfaces of the first region 55a with the second regions 55b and 55c may be substantially aligned with edges of the conductive film 61. In that case, a channel length is a distance between the second regions 55b and 55c.

Alternatively, in the case where the buffer film 60 is formed using an insulating film, the second regions 55b and 55c may each have a region overlapping with part of the conductive film 61 as in a transistor illustrated in FIG. 1B. Such a region can be referred to as an overlap region Lov. Note that the length of the overlap region Lov is preferably less than 20%, 10%, 5%, or 2% of a channel length L. In that case, the channel length is the distance between the second regions 55b and 55c.

Further alternatively, in the case where the buffer film 60 is formed using an insulating film, a third region 55d may be provided between the first region 55a and the second region 55b and a third region 55e may be provided between the first region 55a and the second region 55c as in a transistor illustrated in FIG. 1C. Note that the third regions 55d and 55e have lower impurity concentration and higher resistivity than the second regions 55b and 55c, and serve as electric-field relaxation regions. In that case, a channel length is the distance between the third regions 55d and 55e.

Still further alternatively, in the case where the buffer film 60 is formed using an insulating film, the second regions 55b and 55c do not necessarily overlap with the conductive film 61 as in a transistor illustrated in FIG. 1D. In other words, the interfaces of the first region 55a with the second regions 55b and 55c do not necessarily overlap with the conductive film 61. A region which is in the first region 55a and does not overlap with the conductive film 61 can be referred to as an offset region Loff. In that case, a channel length is the width of a region which is in the first region 55a and overlaps with the conductive film 61. Note that the length of the offset region L is preferably less than 20%, 10%, 5%, or 2% of the channel length.

In the case where the buffer film 60 in each of the transistors illustrated in FIGS. 1A to 1D is formed using a semiconductor film, the buffer film 60 and the conductive film 61 collectively serve as a gate electrode.

Thus, in the case where the buffer film 60 in FIG. 1A is formed using a semiconductor film, the interfaces of the first region 55a with the second regions 55b and 55c may be substantially aligned with the edges of the buffer film 60.

In the case where the buffer film 60 in FIG. 1B is formed using a semiconductor film, the overlap regions Lov are regions where the second regions 55b and 55c overlap with at least the buffer film 60.

In the case where the buffer film 60 in FIG. 1D is formed using a semiconductor film, the channel length is the width of a region which is in the first region 55a and overlaps with the buffer film 60.

The components illustrated in FIGS. 1A to 1D will be described in detail below.

A variety of substrates can be used as the substrate 51 without limitation to a particular type of substrate. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. Examples of a flexible substrate, an attachment film, a base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, when a transistor is formed using a semiconductor substrate, a single crystal substrate, an SOI substrate, or the like, it is possible to form a transistor with few variations in characteristics, size, shape, or the like and with high current supply capability and a small size. By forming a circuit with the use of such a transistor, power consumption of the circuit can be reduced or the circuit can be highly integrated.

Alternatively, a flexible substrate may be used as the substrate 51, and the transistor may be provided directly on the flexible substrate. Alternatively, a separation layer may be provided between the substrate 51 and the transistor. The separation layer can be used when part or the whole of a semiconductor device formed over the separation layer is completed and separated from the substrate 51 and transferred to another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a transistor with excellent properties or a transistor with low power consumption can be formed, a device with high durability can be formed, heat resistance can be provided, or reduction in weight or thickness can be achieved.

The insulating film 53 can be formed to have a single-layer structure or a stacked-layer structure including an insulating film containing oxygen or an insulating film containing nitrogen. A typical example of an insulating film containing oxygen is an oxide insulating film A typical example of an insulating film containing nitrogen is a nitride insulating film. Note that in the insulating film 53, an insulating film containing oxygen is preferably used for at least a region in contact with the oxide semiconductor film 55, in order to improve characteristics of the interface with the oxide semiconductor film 55. An oxide insulating film that has a function of releasing oxygen by heat treatment is preferably used as the insulating film 53, in which case oxygen contained in the insulating film 53 can be moved to the oxide semiconductor film 55 by the heat treatment.

The insulating film 53 may be formed to have a single-layer structure or a stacked-layer structure using, for example, silicon oxide, silicon oxynitride, silicon nitride oxide, silicon nitride, aluminum oxide, hafnium oxide, gallium oxide, or Ga—Zn oxide.

Note that in this specification and the like, a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. Furthermore, a silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

The oxide semiconductor film 55 is typically formed of a metal oxide such as an In—Ga oxide, an In—Zn oxide, or an In-M-Zn oxide (M is Al, Ga, Y, Zr, Sn, La, Ce, or Nd).

Note that in the case where the oxide semiconductor film 55 is an In-M-Zn oxide film, the proportions of In and M when the summation of In and M is assumed to be 100 atomic % are preferably as follows: the proportion of In is greater than or equal to 25 atomic % and the proportion of M is less than 75 atomic %, further preferably, the proportion of In is greater than or equal to 34 atomic % and the proportion of M is less than 66 atomic %.

The energy gap of the oxide semiconductor film 55 is 2 eV or more, preferably 2.5 eV or more, further preferably 3 eV or more.

The thickness of the oxide semiconductor film 55 is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor film 55 is an In-M-Zn oxide film (M is Al, Ga, Y, Zr, Sn, La, Ce, or Nd), it is preferable that the atomic ratio of metal elements of a sputtering target used for forming the In-M-Zn oxide film satisfy the following: the number of In atoms is greater than or equal to the number of M atoms, and the number of Zn atoms is greater than or equal to the number of M atoms. As the atomic ratio of metal elements of such a sputtering target, InM:Zn=1:1:1, In:M:Zn=1:1:1.2, InM:Zn=2:1:1.5, InM:Zn=2:1:2.3, In:M:Zn=2:1:3, InM:Zn=3:1:2, or the like is preferable. Note that the proportion of each metal element in the atomic ratio of the oxide semiconductor film 55 to be formed varies within a range of ±40% of that in the above atomic ratio of the sputtering target as an error.

When silicon or carbon that is an element belonging to Group 14 is contained in the oxide semiconductor film 55, oxygen vacancies are increased in the oxide semiconductor film 55, and the oxide semiconductor film 55 becomes an n-type film. Thus, the concentration of silicon or carbon in the oxide semiconductor film 55, which is measured by SIMS, is lower than or equal to $2\times10^{18}$ atoms/cm$^3$, preferably lower than or equal to $2\times10^{17}$ atoms/cm$^3$. As a result, the transistor has positive threshold voltage (normally-off characteristics).

The concentration of alkali metal or alkaline earth metal in the oxide semiconductor film 55, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, which may increase the off-state current of the transistor. Thus, it is preferable to reduce the concentration of alkali metal or alkaline earth metal in the oxide semiconductor film 55. As a result, the transistor has positive threshold voltage (normally-off characteristics).

In addition, when nitrogen is contained in the oxide semiconductor film 55, electrons serving as carriers are generated to increase the carrier density, so that the oxide semiconductor film 55 easily becomes an n-type film. Thus, a transistor including an oxide semiconductor that contains nitrogen is likely to be normally on. For this reason, nitrogen in the first region 55a in the oxide semiconductor film 55 is preferably reduced as much as possible. The concentration of nitrogen measured by SIMS is preferably set to be, for example, less than or equal to $5\times10^{18}$ atoms/cm$^3$.

When impurities in the first region 55a in the oxide semiconductor film 55 are reduced, the carrier density of the first region 55a in the oxide semiconductor film 55 can be lowered. The carrier density of the first region 55a in the oxide semiconductor film 55 is preferably less than $8\times10^{11}$/cm$^3$, further preferably less than $1\times10^{11}$/cm$^3$, still further preferably greater than or equal to $1\times10^{-9}$/cm$^3$ and less than $1\times10^{10}$/cm$^3$.

An oxide semiconductor film having a low impurity concentration and a low density of defect states can be used for the first region 55a in the oxide semiconductor film 55, in which case the transistor can have more excellent electric characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the first region 55a in the oxide semiconductor film 55 in which a channel region is formed is likely to have positive threshold voltage (normally-off characteristics). A highly purified intrinsic or substantially highly purified intrinsic oxide semiconductor film has a low density of defect states and accordingly has few carrier traps in some cases. Furthermore, a highly purified intrinsic or substantially highly purified intrinsic oxide semiconductor film has an extremely low off-state current; even in the case of a semiconductor element has a channel width of $1\times10^6$ μm and a channel length L of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the first region 55a in the oxide semiconductor film 55 has a small variation in electric characteristics and high reliability in some cases.

The oxide semiconductor film 55 may have, for example, a non-single-crystal structure. The non-single crystal structure includes a c-axis aligned crystalline oxide semiconductor (CAAC-OS) which will be described later, a polycrystalline structure, a microcrystalline structure which will be described later, or an amorphous structure, for example. Among the non-single crystal structure, the amorphous structure has the highest density of defect states, whereas CAAC-OS has the lowest density of defect states.

Note that the oxide semiconductor film 55 may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure of two or more of a region having an amorphous structure, a region having a microcrystalline structure, a region having a polycrystalline structure, a CAAC-OS region, and a region having a single-crystal structure in some cases.

The insulating film 57 is preferably formed to have a single-layer structure or a stacked-layer structure including an insulating film containing oxygen or an insulating film containing nitrogen. Typically, an oxide insulating film can be used as the insulating film containing oxygen, and a nitride insulating film can be used as the insulating film containing nitrogen. Note that in the insulating film 57, an insulating film containing oxygen typified by an oxide insulating film is preferably used for at least a region in contact with the oxide semiconductor film 55, in order to improve characteristics of the interface with the oxide semiconductor film 55.

For the oxide insulating film, silicon oxide, silicon oxynitride, aluminum oxide, hafnium oxide, gallium oxide, or a Ga—Zn oxide can be used, for example. For the nitride insulating film, silicon nitride oxide, or silicon nitride can be used, for example.

Furthermore, when an insulating film having a blocking effect against oxygen, hydrogen, water, and the like is provided as the insulating film 57, it is possible to prevent outward diffusion of oxygen from the first region 55a in the oxide semiconductor film 55 and entry of hydrogen, water, or the like into the first region 55a in the oxide semiconductor film 55 from the outside. The insulating film having a blocking effect against oxygen, hydrogen, water, and the like can be formed using aluminum oxide, aluminum oxynitride, gallium oxide, gallium oxynitride, yttrium oxide, yttrium oxynitride, hafnium oxide, hafnium oxynitride, or the like.

The insulating film 57 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The conductive film 61 can be formed using a metal element selected from aluminum, chromium, copper, tantalum, titanium, molybdenum, nickel, iron, cobalt, and tungsten; an alloy containing any of these metal elements as a component; an alloy containing these metal elements in combination; or the like. Furthermore, one or more metal elements selected from manganese and zirconium may be used. The conductive film 61 may have a single-layer structure or a stacked structure of two or more layers. For example, any of the following can be used: a single-layer structure of an aluminum film containing silicon; a single-layer structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film in which aluminum and one or more elements selected from titanium, tantalum, tungsten, molybdenum, chromium, neodymium, and scandium are combined may be used.

The conductive film 61 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide. It is also possible to have a stacked-layered structure formed using the above light-transmitting conductive material and the above metal element.

Alternatively, as illustrated in FIG. 2, the conductive film 61 may have a stacked-layer structure including a conductive film 61a in contact with the buffer film 60 and a conductive film 61b in contact with the conductive film 61a. An edge of the conductive film 61a does not necessarily overlap with the conductive film 61b. That is, the edge of the conductive film 61a may extend beyond the conductive film 61b.

The insulating film 65 containing hydrogen is preferably formed using a nitride insulating film. For the nitride insulating film, silicon nitride, silicon nitride oxide, aluminum nitride, aluminum nitride oxide, or the like can be used. The hydrogen concentration of the insulating film 65 containing hydrogen is preferably greater than or equal to $1 \times 10^{22}$ atoms/cm$^3$, in which case hydrogen can be diffused into the oxide semiconductor film.

The pair of conductive films 68 and 69 is formed to have a single-layer structure or a stacked-layer structure using any of metals such as aluminum, titanium, chromium, nickel, copper, yttrium, zirconium, molybdenum, iron, cobalt, silver, tantalum, and tungsten and an alloy containing any of these metals as a main component. For example, a single-layer structure of an aluminum film containing silicon; a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a two-layer structure in which a copper film is stacked over a copper film containing manganese; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; a three-layer structure in which a copper film containing manganese, a copper film, and a copper film containing manganese are stacked in this order; and the like can be given. Note that a transparent conductive material containing indium oxide, tin oxide, or zinc oxide may be used.

The insulating films 67 and 79 can be formed using the same material as the insulating film 53 or the insulating film 57 as appropriate.

Note that when the pair of conductive films 68 and 69 contains copper, the insulating film 79 is preferably formed using an insulating film containing nitrogen, in which case diffusion of copper can be prevented. A typical example of the insulating film containing nitrogen is a nitride insulating film. A nitride insulating film can be formed using silicon nitride, silicon nitride oxide, aluminum nitride, aluminum nitride oxide, or the like.

<Method for Manufacturing Semiconductor Device>

Next, a method for manufacturing the transistor illustrated in FIG. 1A will be described with reference to FIGS. 3A to 3D, and FIGS. 4A to 4C.

Films included in the transistor (e.g., an insulating film, an oxide semiconductor film, a metal oxide film, and a conductive film) can be formed by a sputtering method, a chemical vapor deposition (CVD) method, a vacuum vapor deposition method, or a pulsed laser deposition (PLD) method. Alternatively, a coating method or a printing method can be used. Although a sputtering method and a plasma-enhanced chemical vapor deposition (PECVD) method are typical examples of a film formation method, a thermal CVD method may be used. As the thermal CVD method, a metal organic chemical vapor deposition (MOCVD) method or an atomic layer deposition (ALD) method may be used, for example. The films are preferably stacked successively without being exposed to the air using a multi-chamber deposition apparatus including a load lock chamber, in which case the amount of impurities at the interfaces between the films can be reduced.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at a time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute transistor.

Figure 3A:
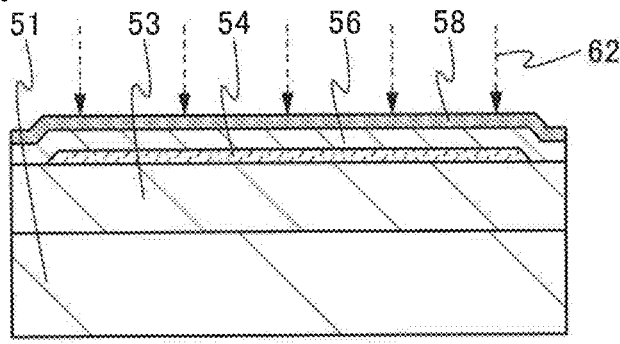
FIGS. 3A to 3D are cross-sectional views illustrating one embodiment of a manufacturing process of a semiconductor device.

As illustrated in FIG. 3A, the insulating film 53 and an oxide semiconductor film 54 are formed over the substrate 51. Then, an insulating film 56 is formed over the oxide semiconductor film 54 and a buffer film 58 is formed over the insulating film 56. Subsequently, oxygen 62 is added to the insulating film 56 through the buffer film 58.

The insulating film 53 can be formed by a sputtering method, a CVD method, an evaporation method, a pulsed laser deposition (PLD) method, a printing method, a coating method, or the like as appropriate. The insulating film 53 can be formed in the following manner: an insulating film is formed over the substrate 51, and then oxygen is added to the insulating film. Examples of the oxygen that is added to the insulating film include an oxygen radical, an oxygen atom, an oxygen atomic ion, an oxygen molecular ion, and the like. As a method for adding the oxygen, an ion doping method, an ion implantation method, plasma treatment, or the like can be given.

A formation method of the oxide semiconductor film 54 is described below. An oxide semiconductor film is formed over the insulating film 53 by a sputtering method, a coating method, a pulsed laser deposition method, a laser ablation method, a thermal CVD method, or the like. Then, after a mask is formed over the oxide semiconductor film by a lithography process, the oxide semiconductor film is partly etched using the mask. Thus, the oxide semiconductor film 54 illustrated in FIG. 3A can be formed. After that, the mask is removed.

Alternatively, by using a printing method for forming the oxide semiconductor film 54, the oxide semiconductor film 54 subjected to element isolation can be formed directly.

As a power supply device for generating plasma in the case of forming the oxide semiconductor film by a sputtering method, an RF power supply device, an AC power supply device, a DC power supply device, or the like can be used as appropriate.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen to a rare gas is preferably increased.

Furthermore, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

For the deposition of the CAAC-OS film to be described later, the following conditions are preferably used.

By suppressing entry of impurities into the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

After the oxide semiconductor film is formed, dehydrogenation or dehydration may be performed by heat treatment. The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

The heat treatment is performed under an inert gas atmosphere containing nitrogen or a rare gas such as helium, neon, argon, xenon, or krypton. Furthermore, the heat treatment may be performed under an inert gas atmosphere first, and then under an oxygen atmosphere. It is preferable that the above inert gas atmosphere and the above oxygen atmosphere not contain hydrogen, water, and the like. The treatment time is from 3 minutes to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration of the oxide semiconductor film can be lower than or equal to $5 \times 10^{19}$ atoms/cm$^3$, preferably lower than or equal to $1 \times 10^{19}$ atoms/cm$^3$, further preferably lower than $5 \times 10^{18}$ atoms/cm$^3$, still further preferably lower than or equal to $1 \times 10^{18}$ atoms/cm$^3$, still further preferably lower than or equal to $5 \times 10^{17}$ atoms/cm$^3$, still further preferably lower than or equal to $1 \times 10^{16}$ atoms/cm$^3$.

For example, in the case where an oxide semiconductor film, e.g., an In—Ga—Zn—O$_X$ (X>0) film is formed using a deposition apparatus employing ALD, an In(CH$_3$)$_3$ gas and an O$_3$ gas) are sequentially introduced plural times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas) are introduced at a time to form a ZnO layer. Note that the order of these layers is not limited to this example A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas), it is preferable to use an O$_3$ gas), which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Instead of a Zn(CH$_3$)$_2$ gas, a Zn(C$_2$H$_5$)$_2$ gas may be used.

Here, a 35-nm-thick oxide semiconductor film is formed by a sputtering method, a mask is formed over the oxide semiconductor film, and then part of the oxide semiconductor film is selectively etched. Then, after the mask is removed, heat treatment is performed in a mixed atmosphere containing nitrogen and oxygen. Thus, the oxide semiconductor film 54 is formed.

When the heat treatment is performed at a temperature higher than 350° C. and lower than or equal to 650° C., preferably higher than or equal to 450° C. and lower than or equal to 600° C., it is possible to obtain an oxide semiconductor film whose proportion of CAAC, which will be described later, is greater than or equal to 60% and less than 100%, preferably greater than or equal to 80% and less than 100%, further preferably greater than or equal to 90% and less than 100%, still further preferably greater than or equal to 95% and less than or equal to 98%. Furthermore, it is possible to obtain an oxide semiconductor film having a low content of hydrogen, water, and the like. That is, an oxide semiconductor film with a low impurity concentration and a low density of defect states can be formed.

The insulating film 56 becomes a gate insulating film in a later step. The insulating film 56 is formed by a sputtering method, a CVD method, a vacuum evaporation method, a pulsed laser deposition (PLD) method, a thermal CVD method, or the like.

In the case where the insulating film 56 is formed using a silicon oxide film or a silicon oxynitride film, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

In the case where a gallium oxide film is formed as the insulating film 56, an MOCVD method can be used.

In the case where a hafnium oxide film is formed as the insulating film 56 by a thermal CVD method such as an MOCVD method or an ALD method, two kinds of gases, i.e., ozone (O$_3$) as an oxidizer and a source material gas that is obtained by vaporizing a liquid containing a solvent and a hafnium precursor compound (hafnium alkoxide or hafnium amide such as tetrakis(dimethylamide)hafnium (TD-MAH)), are used. Note that the chemical formula of tetrakis (dimethylamide)hafnium is Hf[N(CH$_3$)$_2$]4. Examples of another material liquid include tetrakis(ethylmethylamide) hafnium.

In the case where an aluminum oxide film is formed as the insulating film 56 by a thermal CVD method such as an MOCVD method or an ALD method, two kinds of gases, i.e., H$_2$O as an oxidizer and a source material gas that is obtained by vaporizing liquid containing a solvent and an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionate). Note that the ALD method enables the insulating film 56 to have excellent coverage and small thickness.

In the case where a silicon oxide film is formed as the insulating film 56 by a thermal CVD method such as an MOCVD method or an ALD method, hexachlorodisilane is adsorbed on a deposition surface, chlorine contained in adsorbate is removed, and radicals of an oxidizing gas (e.g., 02 or dinitrogen monoxide) are supplied to react with the adsorbate.

Here, as the insulating film 56, a silicon oxynitride film is formed by a plasma CVD method.

The buffer film 58 contains at least one of indium, zinc, titanium, aluminum, tungsten, tantalum, and molybdenum. The buffer film 58 is formed using, for example, a conductive material such as an alloy containing any of the above metal elements, a metal oxide containing any of the above metal elements, a metal nitride containing any of the above metal elements, or a metal nitride oxide containing any of the above metal elements.

The buffer film 58 can be formed using, for example, a tantalum nitride film, a titanium film, an indium tin oxide (ITO) film, an aluminum film, or an oxide semiconductor film (e.g., an IGZO film having an atomic ratio of In:Ga: Zn=1:4:5).

The thickness of the buffer film 58 can be greater than or equal to 1 nm and less than or equal to 20 nm, or greater than or equal to 2 nm and less than or equal to 10 nm. In that case, a larger amount of oxygen can be added to the buffer film 58 and the insulating film 56.

In the case where the buffer film 58 is a semiconductor or a conductor, oxygen ionized by an ion doping method, an ion implantation method, plasma treatment, or the like is likely to move toward the buffer film 58. Thus, the buffer film 58 formed using a semiconductor or a conductor is preferably used because a larger amount of oxygen can be added to the insulating film 56 through the buffer film 58.

In this embodiment, a 5-nm-thick tantalum nitride film is formed as the buffer film 58 with a sputtering apparatus.

Examples of a method for adding the oxygen 62 to the insulating film 56 through the buffer film 58 include an ion doping method, an ion implantation method, and plasma treatment. The plasma treatment may be performed, for example, in such a manner that the substrate is set on the parallel-plate cathode side in a dry etching apparatus or an ashing apparatus, and an RF power is supplied so that a bias is applied to the substrate side. The bias application to the substrate side is preferable because the oxygen 62 can be efficiently introduced into the insulating film 56. Since the buffer film 58 is provided over the insulating film 56, damage caused to the insulating film 56 when the oxygen 62 is added can be relieved. Furthermore, the buffer film 58 serves as a protective film for preventing oxygen from being released from the insulating film 56. Thus, a larger amount of oxygen can be added to the insulating film 56. Alternatively, oxygen can be added to the insulating film 56 and the vicinity of the interface between the insulating film 56 and the buffer film 58.

In the case where oxygen is added by plasma treatment, by making oxygen excited by a microwave to generate high density oxygen plasma, the amount of oxygen added to the insulating film 56 can be increased.

Figure 3B:
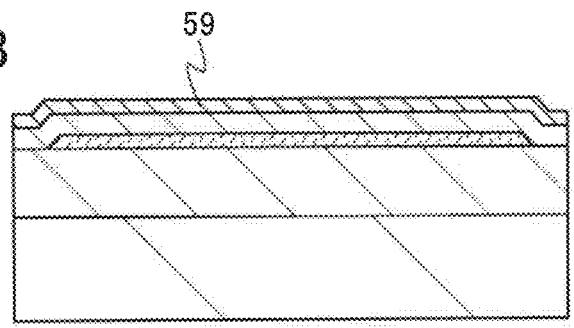

A buffer film 59 formed by the addition of oxygen to the buffer film 58 is illustrated in FIG. 3B. In some cases, part of a metal element contained in the buffer film 58 illustrated in FIG. 3A is oxidized because of the addition of the oxygen 62. In that case, the buffer film 59 illustrated in FIG. 3B includes a metal oxide containing any of metal elements (indium, zinc, titanium, aluminum, tungsten, tantalum, and molybdenum) or a metal oxynitride containing any of the metal elements. Note that the buffer film 59 is an insulator or a semiconductor.

Next, heat treatment may be performed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. Through this step, oxygen contained in the insulating film 56 can be moved to the oxide semiconductor film 54 to reduce oxygen vacancies in the oxide semiconductor film 54. Note that the heat treatment is not necessarily performed in this step, in which case oxygen contained in the insulating film 56 may be moved to the oxide semiconductor film 54 by heat treatment performed later.

Figure 3C:
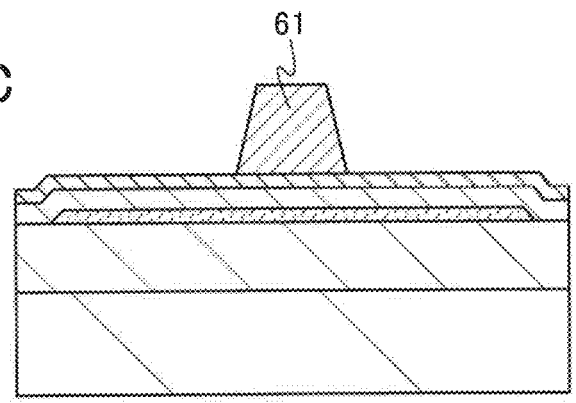

Next, the conductive film 61 is formed over the buffer film 59 (see FIG. 3C).

A formation method of the conductive film 61 is described below. First, a conductive film is formed by a sputtering method, a vacuum evaporation method, a pulsed laser deposition (PLD) method, a thermal CVD method, or the like, and then a mask is formed over the conductive film by a lithography process. Then, part of the conductive film is etched using the mask to form the conductive film 61. After that, the mask is removed.

Note that the conductive film 61 may be formed by an electrolytic plating method, a printing method, an inkjet method, or the like instead of the above formation method.

Alternatively, a tungsten film can be formed as the conductive film with the use of a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Figure 3D:
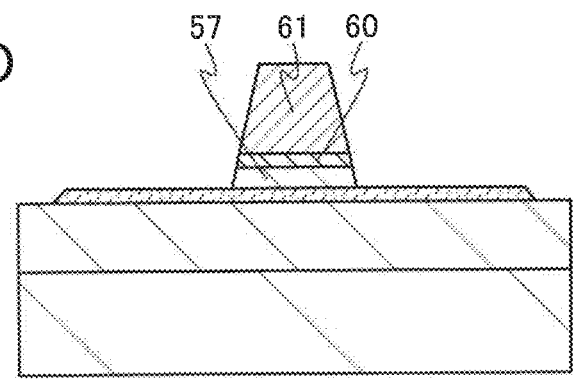

Next, as illustrated in FIG. 3D, the insulating film 56 and the buffer film 59 are etched using the conductive film 61 as a mask to form the insulating film 57 and the buffer film 60.

Figure 4A:
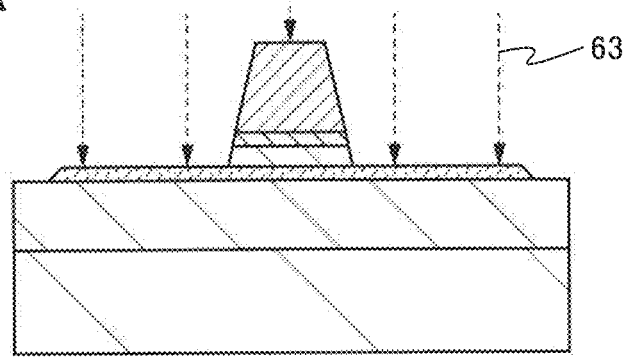
FIGS. 4A to 4C are cross-sectional views illustrating one embodiment of a manufacturing process of a semiconductor device.

Subsequently, as illustrated in FIG. 4A, an impurity element 63 is added to the oxide semiconductor film 54 using the conductive film 61 as a mask. As a result, the impurity element is added to an exposed portion of the oxide semiconductor film 54. Because of damages due to the addition of the impurity element 63, defects typified by oxygen vacancies are formed in the oxide semiconductor film 54. Note that depending on the impurity element used, the impurity element forms oxygen vacancies in the oxide semiconductor film 54 and then is released without remaining in the oxide semiconductor film 54. Here, the expression "adding an impurity element to an oxide semiconductor film" also includes such a case.

The impurity element 63 is added by, for example, an ion doping method, an ion implantation method, or a plasma treatment method. For the plasma treatment method, plasma is generated in a gas atmosphere containing the impurity element to be added, and ions of the impurity element accelerated by plasma treatment are made to collide with the oxide semiconductor film 54, whereby oxygen vacancies can be formed in the oxide semiconductor film 54. A dry etching apparatus, a plasma CVD apparatus, a high-density plasma CVD apparatus using microwaves, or the like can be used to generate the plasma. For performing plasma treatment, the substrate 51 may be set to a parallel plate on the cathode side and an RF power may be supplied so that a bias is applied to the substrate 51 side. As the RF power, for example, power density can be greater than or equal to 0.1 $W/cm^2$ and less than or equal to 2 $W/cm^2$. Consequently, the amount of impurity elements added to the oxide semiconductor film 54 can be increased and more oxygen vacancies can be formed in the oxide semiconductor film 54.

Note that, as a source gas of the impurity element 63, one or more of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, one or more of $B_2H_6$, $PH_3$, $N_2$, $NH_3$, $AlH_3$, $AlCl_3$, $F_2$, HF, and $H_2$ which are diluted with a rare gas can be used. By addition of the impurity element 63 to the oxide semiconductor film 54 using one or more of $B_2H_6$, $PH_3$, $N_2$, $NH_3$, $AlH_3$, $AlCl_3$, $F_2$, HF, and $H_2$ which are diluted with a rare gas, the rare gas and one or more of hydrogen, boron, carbon, nitrogen, fluorine, aluminum, silicon, phosphorus, and chlorine can be added at a time to the oxide semiconductor film 54.

Alternatively, after a rare gas is added to the oxide semiconductor film 54, at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ may be added to the oxide semiconductor film 54.

Further alternatively, after one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ is added to the oxide semiconductor film 54, a rare gas may be added to the oxide semiconductor film 54.

In the case where an ion doping method or an ion implantation method is used, implantation conditions such as acceleration voltage and a dose may be appropriately set. For example, in the case where argon is added by an ion implantation method, the acceleration voltage is set to 10 kV and the dose is set to greater than or equal to $1\times10^{13}$ ions/cm$^2$ and less than or equal to $1\times10^{16}$ ions/cm$^2$, e.g., $1\times10^{14}$ ions/cm$^2$. In the case where a phosphorus ion is added by an ion implantation method, the acceleration voltage is set to 30 kV and the dose is set to greater than or equal to $1\times10^{13}$ ions/cm$^2$ and less than or equal to $5\times10^{16}$ ions/cm$^2$, e.g., $1\times10^{15}$ ions/cm$^2$.

Note that oxygen vacancies may be formed in the oxide semiconductor film 54 by, instead of the addition of the impurity element 63, irradiating the oxide semiconductor film 54 with ultraviolet light or the like. Alternatively, oxygen vacancies may be formed in the oxide semiconductor film 54 by irradiating the oxide semiconductor film 54 with laser.

Note that if the impurity element 63 is added with the conductive film 61 being exposed, part of the conductive film 61 is peeled off and attached to a side surface of the insulating film 57 in some cases. This results in an increase in the leakage current of the transistor. Accordingly, the top surface of the conductive film 61 is covered with a mask when the impurity element 63 is added to the oxide semiconductor film 54, in which case attachment of part of the conductive film 61 to the side surface of the insulating film 57 can be prevented.

Figure 4B:
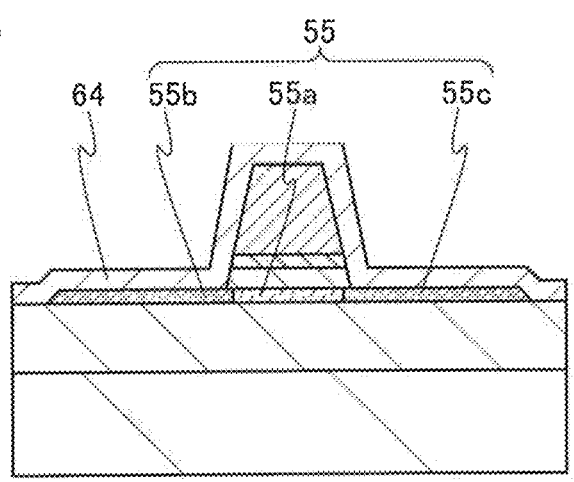
Figure 4C:
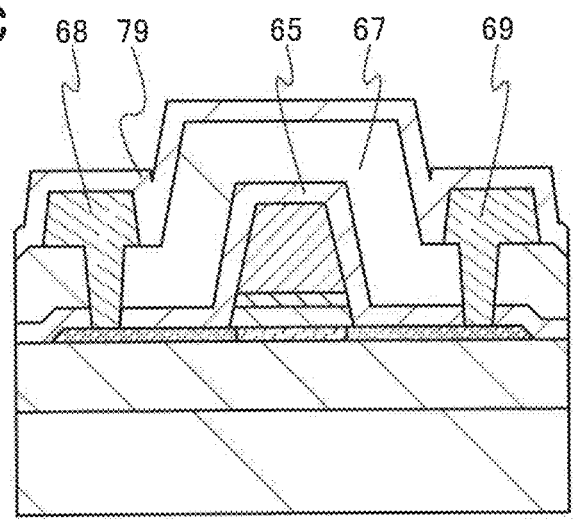

Next, as illustrated in FIG. 4B, an insulating film 64 containing hydrogen is formed over the oxide semiconductor film 54, the insulating film 57, the buffer film 60, and the conductive film 61. The insulating film 64 containing hydrogen is formed by a sputtering method, a CVD method, a vacuum evaporation method, a pulsed laser deposition (PLD) method, or the like. When an atomic layer deposition (ALD) method is used for forming the insulating film 64 containing hydrogen, the insulating film 64 containing hydrogen excellent in step coverage can be obtained.

The insulating film 64 contains hydrogen. Thus, when the oxide semiconductor film 54 is in contact with the insulating film 64 at a region to which the impurity element is added, hydrogen contained in the insulating film 64 is moved to the region to which the impurity element is added. As a result, the oxide semiconductor film 55 that includes the first region 55a to which the impurity element is not added and the second regions 55b and 55c containing the impurity element and hydrogen is formed. Note that hydrogen contained in the insulating film 64 is diffused into part of the oxide semiconductor film 55 through part of the insulating film 57. Thus, part of the second regions 55b and 55c may overlap with the insulating film 57. Through the above steps, the second regions 55b and 55c that overlap with part of the conductive film 61 can be formed.

The second regions 55b and 55c contain hydrogen and oxygen vacancies formed by the addition of the impurity element. The second regions 55b and 55c have high conductivity because of the interaction between the oxygen vacancies and hydrogen. That is, the second regions 55b and 55c are low-resistance regions.

Next, heat treatment may be performed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. The heat treatment further increases the conductivity of the second regions 55b and 55c. In addition, the heat treatment can move oxygen contained in the insulating film 57 to the oxide semiconductor film 55.

Then, an insulating film to be the insulating film 67 having openings may be formed over the insulating film 64 containing hydrogen. The insulating film can reduce parasitic capacitance between the conductive film 61 and the pair of conductive films 68 and 69 to be formed later.

Subsequently, the insulating film 64 containing hydrogen is partly etched to form the insulating film 65 having openings, so that the second regions 55b and 55c are partly exposed. After that, the pair of conductive films 68 and 69 is formed. Next, the insulating film 79 is formed over the insulating film 67 and the pair of conductive films 68 and 69 (see FIG. 4C).

The pair of conductive films 68 and 69 can be formed by a method similar to that of the conductive film 61 as appropriate. The insulating film 79 can be formed in a manner similar to that of the insulating film 53 or 56.

Through the above-described steps, the transistor illustrated in FIG. 1A can be fabricated.

In this embodiment, oxygen is added to the insulating film through the buffer film and oxygen contained in the insulating film is moved to the oxide semiconductor film; thus, oxygen vacancies in the oxide semiconductor film can be reduced. Then, an impurity element is added to the oxide semiconductor film using the conductive film that has a function of a gate electrode as a mask. In the oxide semiconductor film, a region overlapping with the conductive film that has a function of a gate electrode has a function of a channel region, whereas regions to which the impurity element is added have functions of a source region and a drain region. Thus, in any of the transistors described in this embodiment, the channel region contains a small number of oxygen vacancies and the impurity element is not added to the channel region. In contrast, the impurity element is added to the source and drain regions; thus, the source and drain regions have low resistivity. From the above, according to this embodiment, a normally-off transistor having high on-state current can be fabricated. Furthermore, a highly reliable transistor can be fabricated.

In addition, since a region with small variation in resistivity can be formed in the transistors described in this embodiment, the on-state current can be higher than that of a conventional transistor, and variations among transistors can be reduced.

The structures, the methods, and the like described in this embodiment can be combined as appropriate with any of the structures, the methods, and the like described in the other embodiments.

Embodiment 2

In this embodiment, structures and manufacturing methods of semiconductor devices that are different from those described in Embodiment 1 will be described with reference to FIGS. 5A to 5D, FIGS. 6A to 6D, FIGS. 7A to 7D, FIGS. 8A to 8D, and FIGS. 9A to 9C.

Transistors described in this embodiment are different from those in Embodiment 1 in that an edge of the buffer film 60 extends beyond the conductive film 61.

<Structure 1 of Semiconductor Device>

Structures of transistors included in semiconductor devices will be described with reference to FIGS. 5A to 5D.

Figure 5A:
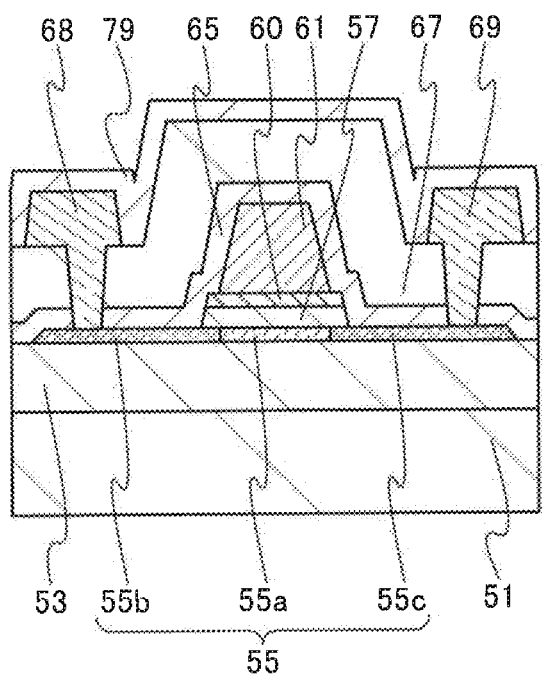
FIGS. 5A to 5D are cross-sectional views each illustrating one embodiment of a semiconductor device.

A transistor illustrated in FIG. 5A includes the oxide semiconductor film 55, the insulating film 57 in contact with the oxide semiconductor film 55, the buffer film 60 over the insulating film 57, and the conductive film 61 in contact with the buffer film 60 and overlaps with the oxide semiconductor film 55. The edge of the buffer film 60 extends beyond the conductive film 61. This means that the area of the top surface of the buffer film 60 is larger than the area of the top surface of the conductive film 61. Furthermore, a side surface of the insulating film 57 is substantially aligned with the side surface of the buffer film 60.

Other components are the same as those of the transistors described in Embodiment 1; thus, detailed descriptions thereof are omitted here.

In methods for forming a transistor described in this embodiment, oxygen is added to an insulating film (insulating film to be the insulating film 57 in FIGS. 5A to 5D) in contact with an oxide semiconductor film (oxide semiconductor film to be the oxide semiconductor film 55 in FIGS. 5A to 5D) through an island-shaped buffer film (buffer film to be the buffer film 60 in FIGS. 5A to 5D) that covers at least a channel region. As a result, the insulating film contains excess oxygen. Then, excess oxygen in the insulating film is moved to the oxide semiconductor film by heat treatment, whereby at least oxygen vacancies in the channel region can be reduced. In contrast, a source region and a drain region may contain a large number of oxygen vacancies because the resistivity of the source and drain regions is preferably low. For this reason, when oxygen is added to the insulating film through the island-shaped buffer film that covers at least the channel region, and oxygen contained in the insulating film is selectively added to the oxide semiconductor film 55, a transistor with low off-state current and high on-state current, that is, a transistor with excellent electric characteristics can be fabricated.

In the case where the buffer film 60 of the transistor illustrated in FIG. 5A is formed using an insulating film, the interfaces of the first region 55a with the second regions 55b and 55c may be substantially aligned with edges of the conductive film 61.

Figure 5B:
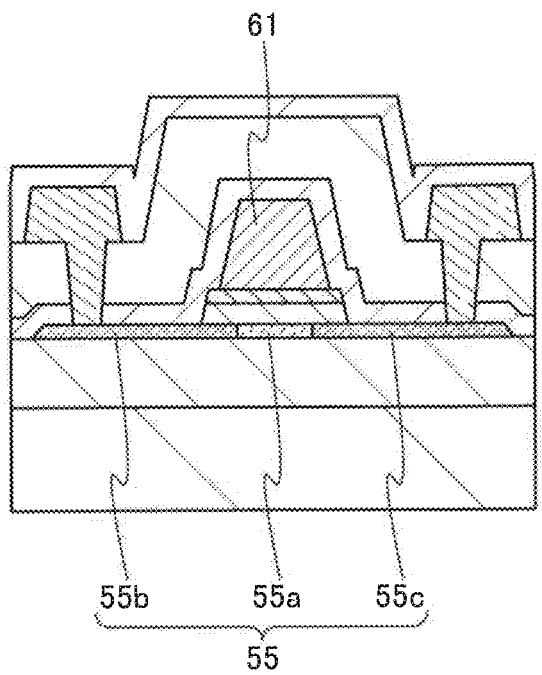

Alternatively, in the case where the buffer film 60 is formed using an insulating film, the second regions 55b and 55c may each have an overlap region Lov overlapping with part of the conductive film 61 as in a transistor illustrated in FIG. 5B.

Figure 5C:
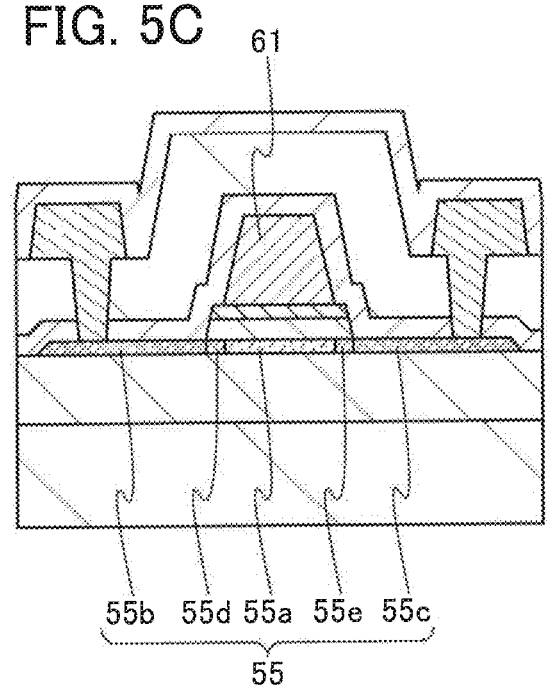

Further alternatively, in the case where the buffer film 60 is formed using an insulating film, the third region 55d may be provided between the first region 55a and the second region 55b and the third region 55e may be provided between the first region 55a and the second region 55c as in a transistor illustrated in FIG. 5C.

Figure 5D:
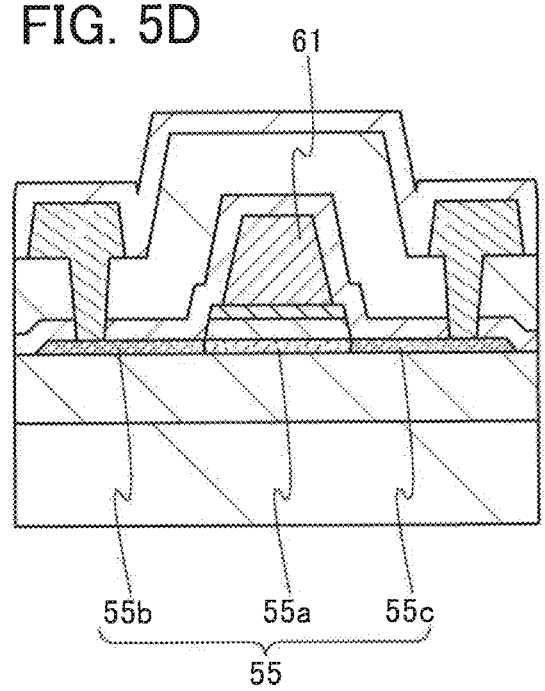

Still further alternatively, in the case where the buffer film 60 is formed using an insulating film, the second regions 55b and 55c do not necessarily overlap with the conductive film 61 and may have offset regions Loff as in a transistor illustrated in FIG. 5D.

In the case where the buffer film 60 in each of the transistors illustrated in FIGS. 5A to 5D is formed using a semiconductor film, the buffer film 60 and the conductive film 61 collectively serve as a gate electrode.

Thus, in the case where the buffer film 60 in FIG. 5A is formed using a semiconductor film, the interfaces of the first region 55a with the second regions 55b and 55c may be substantially aligned with the edges of the buffer film 60.

In the case where the buffer film 60 in FIG. 5B is formed using a semiconductor film, the overlap regions Lov are regions where the second regions 55b and 55c overlap with at least the buffer film 60.

In the case where the buffer film 60 in FIG. 5D is formed using a semiconductor film, the channel length is the width of a region which is in the first region 55a and overlaps with the buffer film 60.

<Structure 2 of Semiconductor Device>

Structures of transistors included in semiconductor devices will be described with reference to FIGS. 6A to 6D.

Transistors illustrated in FIGS. 6A to 6D are different from those in FIGS. 5A to 5D in that the insulating film 56 positioned between the oxide semiconductor film 55 and the buffer film 60 is not etched. In other words, the insulating film 56 covers a surface of the oxide semiconductor film 55 on the buffer film 60 side.

Other components are the same as those of the transistors described in Embodiment 1; thus, detailed descriptions thereof are omitted here.

The insulating film 56 preferably has a thickness such that an impurity element can be moved to the oxide semiconductor film 55 through the insulating film 56. The thickness of the insulating film 56 can be typically greater than or equal to 5 nm and less than or equal to 100 nm and preferably greater than or equal to 10 nm and less than or equal to 30 nm.

Figure 6A:
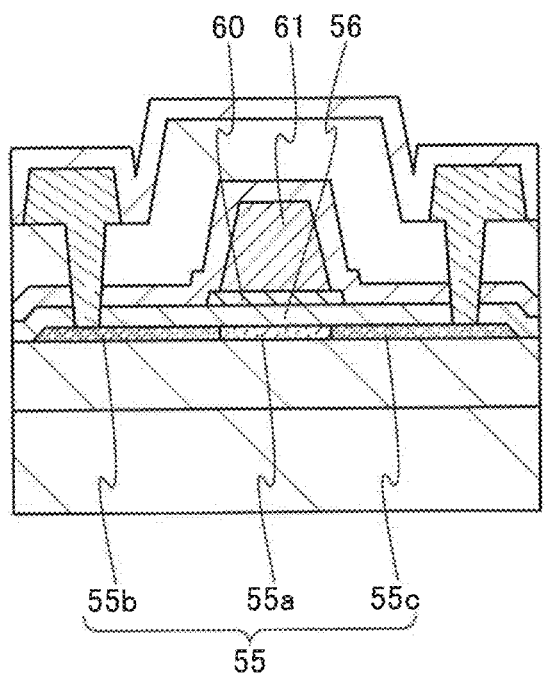
FIGS. 6A to 6D are cross-sectional views each illustrating one embodiment of a semiconductor device.

In the case where the buffer film 60 of the transistor illustrated in FIG. 6A is formed using an insulating film, the interfaces of the first region 55a with the second regions 55b and 55c may be substantially aligned with edges of the conductive film 61.

Figure 6B:
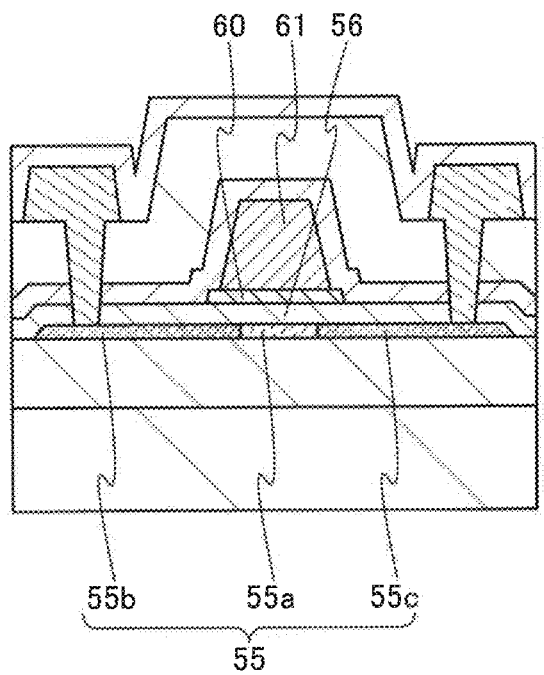

Alternatively, in the case where the buffer film 60 is formed using an insulating film, the second regions 55b and 55c may each have an overlap region Lov overlapping with part of the conductive film 61 as in a transistor illustrated in FIG. 6B.

Figure 6C:
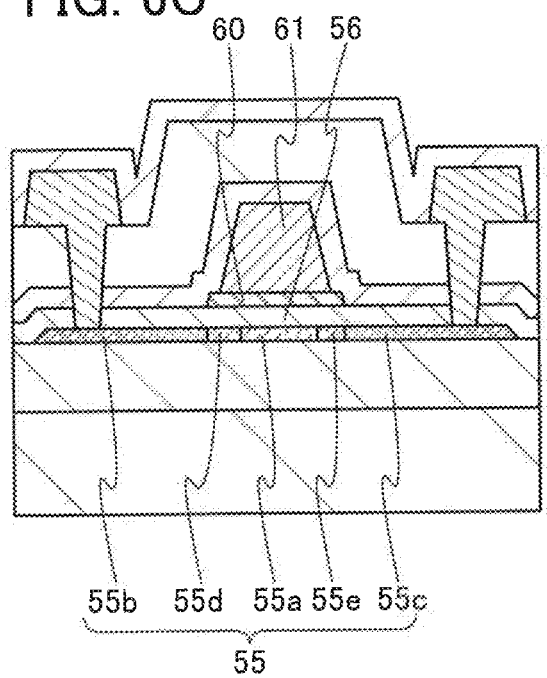

Further alternatively, in the case where the buffer film 60 is formed using an insulating film, the third region 55d may be provided between the first region 55a and the second region 55b and the third region 55e may be provided between the first region 55a and the second region 55c as in a transistor illustrated in FIG. 6C.

Figure 6D:
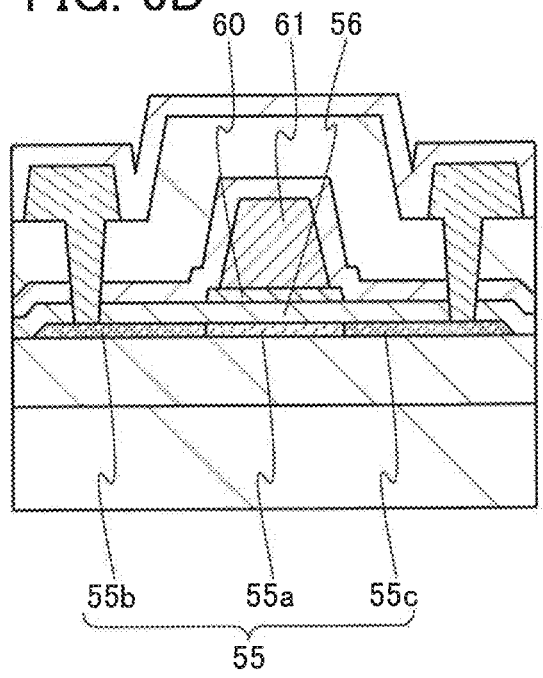

Still further alternatively, in the case where the buffer film 60 is formed using an insulating film, the second regions 55b and 55c do not necessarily overlap with the conductive film 61 and may have offset regions Loff as in a transistor illustrated in FIG. 6D.

In the case where the buffer film 60 in each of the transistors illustrated in FIGS. 6A to 6D is formed using a semiconductor film, the buffer film 60 and the conductive film 61 collectively serve as a gate electrode.

Thus, in the case where the buffer film 60 in FIG. 6A is formed using a semiconductor film, the interfaces of the first region 55a with the second regions 55b and 55c may be substantially aligned with the edges of the buffer film 60.

In the case where the buffer film 60 in FIG. 6B is formed using a semiconductor film, the overlap regions Lov are regions where the second regions 55b and 55c overlap with at least the buffer film 60.

In the case where the buffer film 60 in FIG. 6D is formed using a semiconductor film, the channel length is the width of a region which is in the first region 55a and overlaps with the buffer film 60.

<Method 1 for Manufacturing Semiconductor Device>

Next, a method for manufacturing the transistor illustrated in FIG. 5A will be described with reference to FIGS. 7A to 7D and FIGS. 8A to 8C.

Figure 7A:
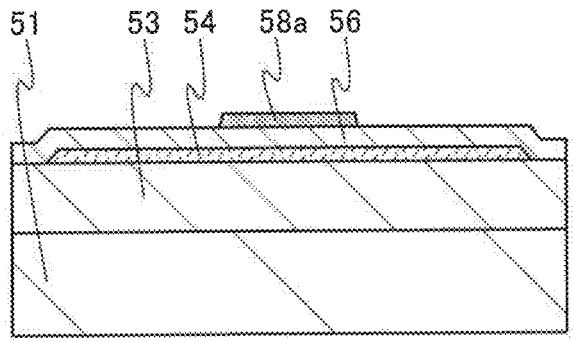
FIGS. 7A to 7D are cross-sectional views illustrating one embodiment of a manufacturing process of a semiconductor device.

In a manner similar to that described in Embodiment 1, the insulating film 53 over the substrate 51, the oxide semiconductor film 54 over the insulating film 53, the insulating film 56 over the oxide semiconductor film 54, and a buffer film 58a over the insulating film 56 are formed as illustrated in FIG. 7A. The buffer film 58a is etched and a side surface of the buffer film 58a overlaps with the oxide semiconductor film 54.

The buffer film 58a is provided in a region overlapping with a region where the conductive film 61 having a function of a gate electrode is to be formed. In other words, the buffer film 58*a* is provided in a region overlapping with a region to be a channel region in the oxide semiconductor film 55 or in a region overlapping with a region which is in the insulating film 56 and serves as a gate insulating film Note that the region which is in the insulating film 56 and serves as a gate insulating film includes at least a region between the oxide semiconductor film 54 and the conductive film 61.

Figure 7B:
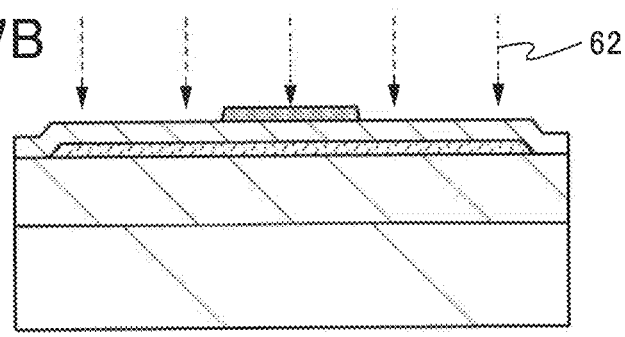

Next, in a manner similar to that described in Embodiment 1, the oxygen 62 is added to the buffer film 58*a* as illustrated in FIG. 7B. In the insulating film 56, a surface of a region to which the oxygen 62 is directly added is etched by several nanometers, resulting in release of part of the added oxygen. Consequently, the amount of oxygen added to the insulating film 56 might be insufficient. Meanwhile, in the insulating film 56, oxygen sufficient to reduce oxygen vacancies in the region to be the channel region in the oxide semiconductor film 55 can be added through the buffer film 58*a*, because the buffer film 58*a* serves as a protective film for the etching of the surface of the insulating film 56 by several nanometers.

In addition, since oxygen is added to the insulating film 56 through the buffer film 58*a*, damage to a region of the insulating film 56, which serves as a gate insulating film, can be reduced while excess oxygen is added to the insulating film 56.

Oxygen is added to the insulating film 56 through the island-shaped buffer film 58*a* provided in the region overlapping with the region to be the channel region in the oxide semiconductor film 55. As a result, oxygen contained in the insulating film 56 can be selectively added to the region to be the channel region in the oxide semiconductor film 55.

Figure 7C:
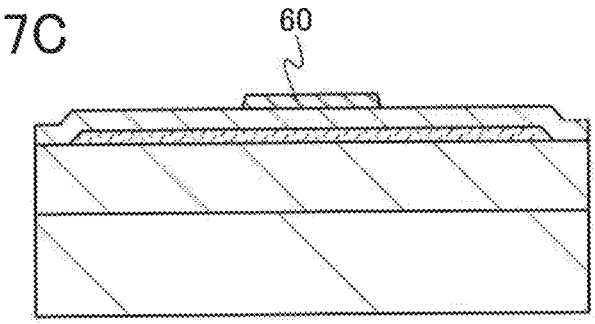

The buffer film 58*a* to which the oxygen 62 is added becomes the buffer film 60 formed of a metal oxide containing any of metal elements (indium, zinc, titanium, aluminum, tungsten, tantalum, and molybdenum) or a metal oxynitride containing any of the metal elements (see FIG. 7C). Note that the buffer film 60 is an insulator or a semiconductor.

Next, heat treatment may be performed in a manner similar to that in Embodiment 1. Through this step, oxygen contained in the insulating film 56 can be moved to the oxide semiconductor film 54 to reduce oxygen vacancies in the oxide semiconductor film 54. Note that the heat treatment is not necessarily performed in this step, in which case oxygen contained in the insulating film 56 may be moved to the oxide semiconductor film 54 by heat treatment performed later.

Figure 7D:
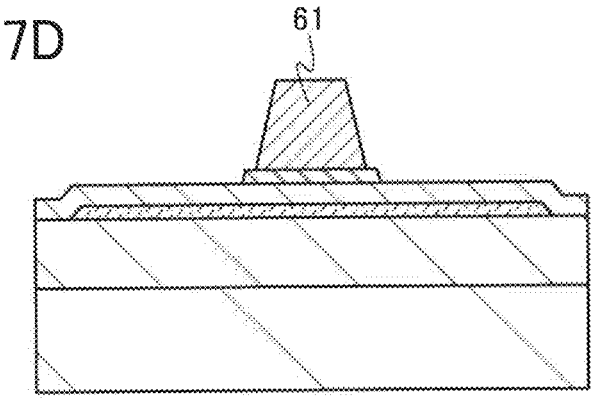

Then, in a manner similar to that described in Embodiment 1, the conductive film 61 is formed over the buffer film 60 as illustrated in FIG. 7D.

Figure 8A:
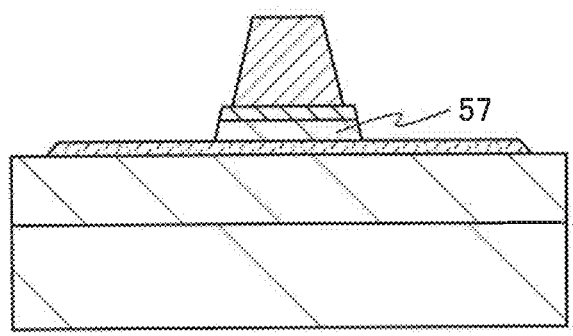
FIGS. 8A to 8D are cross-sectional views illustrating one embodiment of a manufacturing process of a semiconductor device.

Next, as illustrated in FIG. 8A, the insulating film 56 is etched using the buffer film 60 and the conductive film 61 as a mask to form the insulating film 57.

Figure 8B:
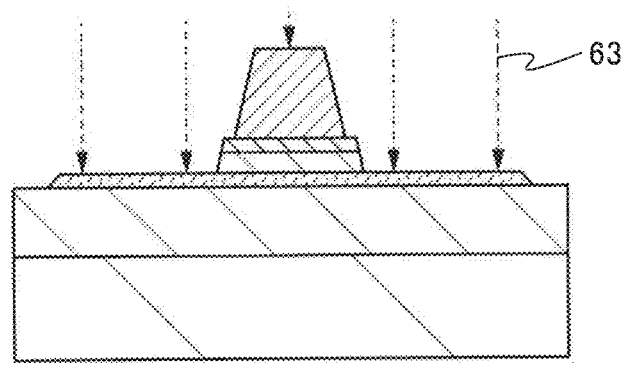

Subsequently, in a manner similar to that described in Embodiment 1, the impurity element 63 is added to the oxide semiconductor film 54 using the buffer film 60 and the conductive film 61 as a mask, as illustrated in FIG. 8B.

Next, heat treatment may be performed in a manner similar to that described in Embodiment 1 to increase the conductivity of regions to be the second regions 55*b* and 55*c*. The heat treatment can move oxygen contained in the insulating film 57 to the oxide semiconductor film 54.

Figure 8C:
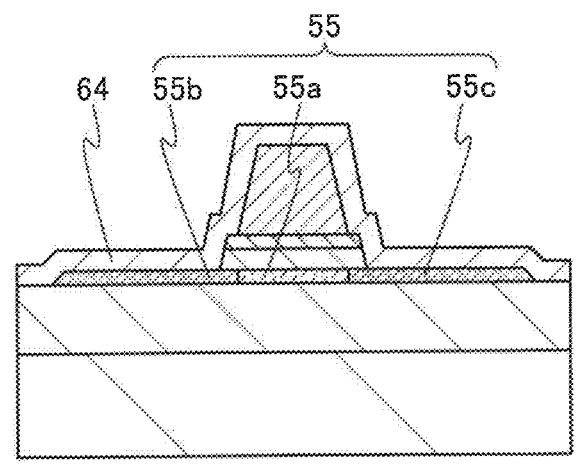
Figure 8D:
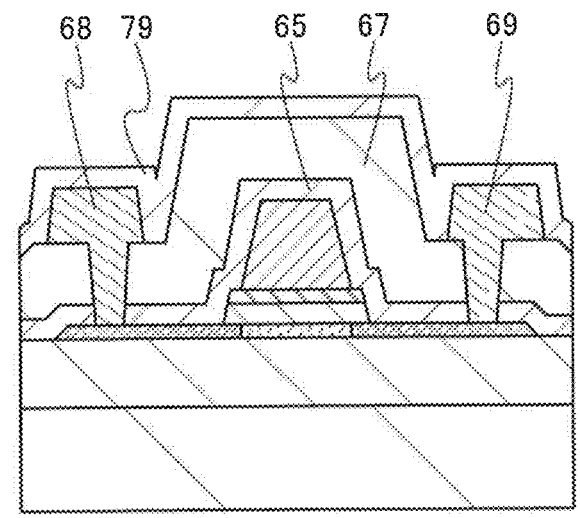

Next, in a manner similar to that described in Embodiment 1, the insulating film 64 containing hydrogen is formed over the oxide semiconductor film 54, the insulating film 57, the buffer film 60, and the conductive film 61 as illustrated in FIG. 8C. As a result, the oxide semiconductor film 55 that includes the first region 55*a* to which the impurity element is not added and the second regions 55*b* and 55*c* containing the impurity element and hydrogen is formed.

Then, in a manner similar to that described in Embodiment 1, an insulating film to be the insulating film 67 having openings may be formed over the insulating film 64 containing hydrogen. Subsequently, the insulating film 64 containing hydrogen is partly etched to form the insulating film 65 having openings, so that the second regions 55*b* and 55*c* are partly exposed. After that, the pair of conductive films 68 and 69 may be formed. Next, the insulating film 79 may be formed over the insulating film 67 and the pair of conductive films 68 and 69 (see FIG. 8D).

Through the above-described steps, the transistor illustrated in FIG. 5A can be fabricated.

<Method 2 for Manufacturing Semiconductor Device>

Next, a method for manufacturing the transistor illustrated in FIG. 6A will be described with reference to FIGS. 7A to 7D and FIGS. 9A to 9C.

Figure 9A:
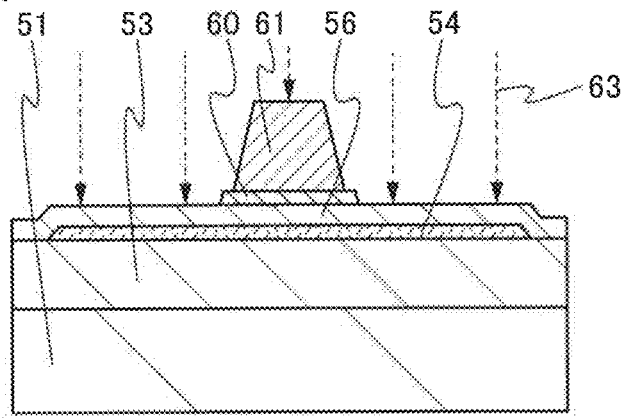
FIGS. 9A to 9C are cross-sectional views illustrating one embodiment of a manufacturing process of a semiconductor device.

Through the steps described in <Method 1 for Manufacturing Semiconductor Device> and in FIGS. 7A to 7D, the insulating film 53 over the substrate 51, the oxide semiconductor film 54 over the insulating film 53, the insulating film 56 over the oxide semiconductor film 54, the buffer film 60 over the insulating film 56, and the conductive film 61 over the buffer film 60 are formed as illustrated in FIG. 9A.

Subsequently, as illustrated in FIG. 9A, the impurity element 63 is added to the oxide semiconductor film 54 through the insulating film 56, using the buffer film 60 and the conductive film 61 as a mask.

Figure 9B:
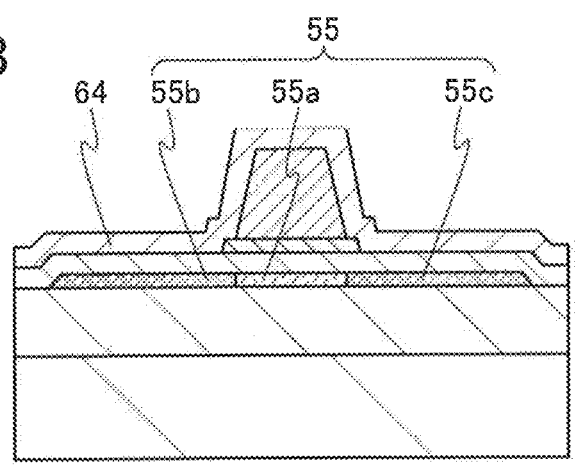
Figure 9C:
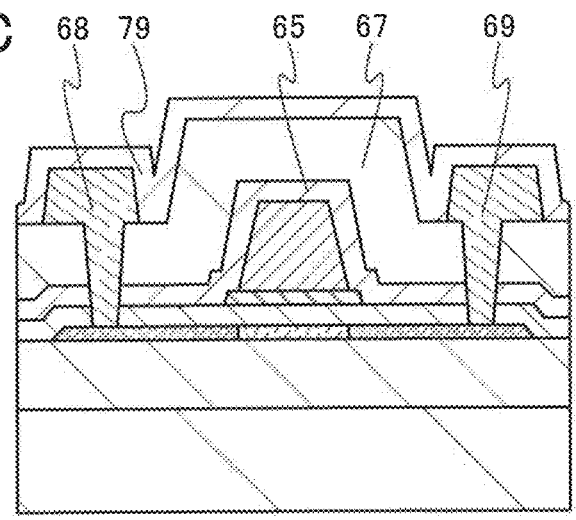

Next, as illustrated in FIG. 9B, the insulating film 64 containing hydrogen is formed over the insulating film 56, the buffer film 60, and the conductive film 61. As a result, the oxide semiconductor film 55 that includes the first region 55*a* to which the impurity element is not added and the second regions 55*b* and 55*c* containing the impurity element and hydrogen is formed.

Then, in a manner similar to that described in Embodiment 1, an insulating film to be the insulating film 67 having openings may be formed over the insulating film 64 containing hydrogen. Subsequently, the insulating film 64 containing hydrogen is partly etched to form the insulating film 65 having openings, so that the second regions 55*b* and 55*c* are partly exposed. After that, the pair of conductive films 68 and 69 may be formed. Next, the insulating film 79 may be formed over the insulating film 67 and the pair of conductive films 68 and 69 (see FIG. 9C).

Through the above-described steps, the transistor illustrated in FIG. 6A can be fabricated.

In this embodiment, oxygen is added to the insulating film through the buffer film and oxygen contained in the insulating film is moved to the oxide semiconductor film; thus, oxygen vacancies in the oxide semiconductor film can be reduced. Then, an impurity element is added to the oxide semiconductor film using the conductive film that has a function of a gate electrode as a mask. In the oxide semiconductor film, a region overlapping with the conductive film that has a function of a gate electrode has a function of a channel region, whereas regions to which the impurity element is added have functions of a source region and a drain region. Thus, in any of the transistors described in this embodiment, the channel region contains a small number of oxygen vacancies and the impurity element is not added to the channel region. In contrast, the impurity element is added to the source and drain regions; thus, the source and drain regions have low resistivity. From the above, according to this embodiment, a normally-off transistor having high on-state current can be fabricated. Furthermore, a highly reliable transistor can be fabricated.

Furthermore, in this embodiment, since oxygen can be selectively added to the insulating film overlapping with a channel region in the oxide semiconductor film, oxygen vacancies in the channel region are selectively reduced. Consequently, according to this embodiment, a normally-off transistor having high on-state current can be fabricated. Furthermore, a highly reliable transistor can be fabricated.

The structures, the methods, and the like described in this embodiment can be combined as appropriate with any of the structures, the methods, and the like described in the other embodiments.

Embodiment 3

In this embodiment, structures and manufacturing methods of semiconductor devices that are different from those described in Embodiments 1 and 2 will be described with reference to FIGS. 3A to 3D, FIGS. 7A to 7D, FIGS. 10A to 10D, FIGS. 11A to 11D, FIGS. 12A to 12D, and FIGS. 13A to 13C.

Transistors described in this embodiment are different from those described in Embodiments 1 and 2 in that an insulating film containing hydrogen is not formed over the oxide semiconductor film 55 or the insulating film 57.
<Structure 1 of Semiconductor Device>

Structures of transistors included in semiconductor devices will be described with reference to FIGS. 10A to 10D.

Figure 10A:
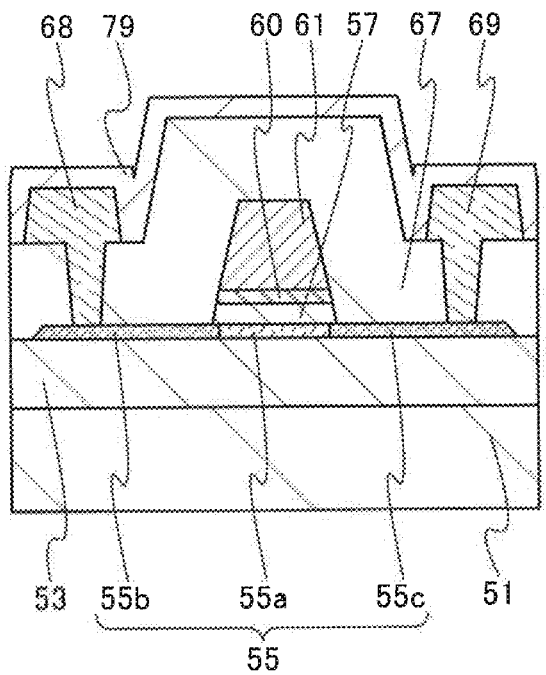
FIGS. 10A to 10D are cross-sectional views each illustrating one embodiment of a semiconductor device.

A transistor illustrated in FIG. 10A includes the oxide semiconductor film 55, the insulating film 57 in contact with the oxide semiconductor film 55, the buffer film 60 over the insulating film 57, and the conductive film 61 in contact with the buffer film 60 and overlaps with the oxide semiconductor film 55.

The oxide semiconductor film 55 included in the transistor is formed over the insulating film 53 over the substrate 51. In addition, the insulating film 67 may be provided in contact with the second regions 55*b* and 55*c* of the oxide semiconductor film 55, and the pair of conductive films 68 and 69 may be provided in contact with the second regions 55*b* and 55*c* of the oxide semiconductor film 55 in openings in the insulating film 67. Moreover, an insulating film 79 may be provided over the insulating film 67 and the pair of conductive films 68 and 69.

Other components are the same as those of the transistors described in Embodiment 1; thus, detailed descriptions thereof are omitted here.

In the case where the buffer film 60 of the transistor illustrated in FIG. 10A is formed using an insulating film, the interfaces of the first region 55*a* with the second regions 55*b* and 55*c* may be substantially aligned with edges of the conductive film 61.

Figure 10B:
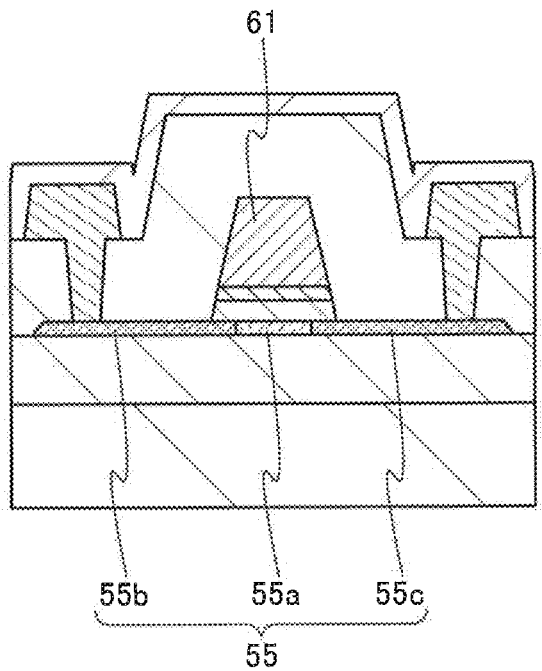

Alternatively, in the case where the buffer film 60 is formed using an insulating film, the second regions 55*b* and 55*c* may each have an overlap region Lov overlapping with part of the conductive film 61 as in a transistor illustrated in FIG. 10B.

Figure 10C:
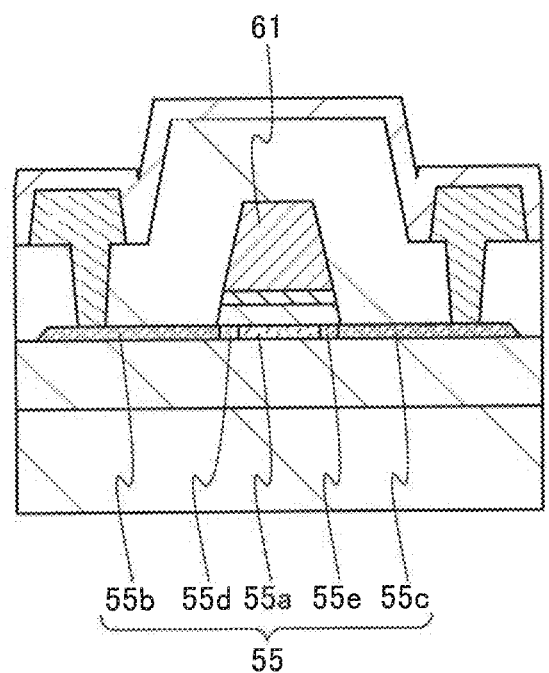

Further alternatively, in the case where the buffer film 60 is formed using an insulating film, the third region 55*d* may be provided between the first region 55*a* and the second region 55*b* and the third region 55*e* may be provided between the first region 55*a* and the second region 55*c* as in a transistor illustrated in FIG. 10C.

Figure 10D:
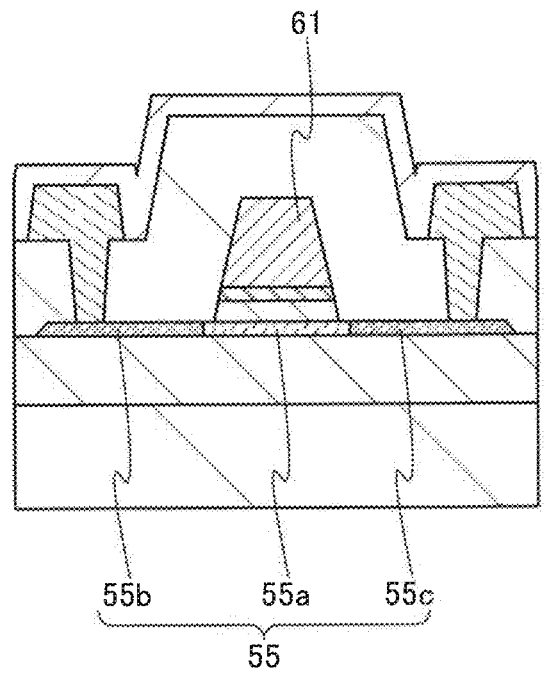

Still further alternatively, in the case where the buffer film 60 is formed using an insulating film, the second regions 55*b* and 55*c* do not necessarily overlap with the conductive film 61 and may have offset regions Loff as in a transistor illustrated in FIG. 10D.

In the case where the buffer film 60 in each of the transistors illustrated in FIGS. 10A to 10D is formed using a semiconductor film, the buffer film 60 and the conductive film 61 collectively serve as a gate electrode.

Thus, in the case where the buffer film 60 in FIG. 10A is formed using a semiconductor film, the interfaces of the first region 55*a* with the second regions 55*b* and 55*c* may be substantially aligned with the edges of the buffer film 60.

In the case where the buffer film 60 in FIG. 10B is formed using a semiconductor film, the overlap regions Lov are regions where the second regions 55*b* and 55*c* overlap with at least the buffer film 60.

In the case where the buffer film 60 in FIG. 10D is formed using a semiconductor film, the channel length is the width of a region which is in the first region 55*a* and overlaps with the buffer film 60.
<Structure 2 of Semiconductor Device>

Structures of transistors included in semiconductor devices will be described with reference to FIGS. 11A to 11D.

Figure 11A:
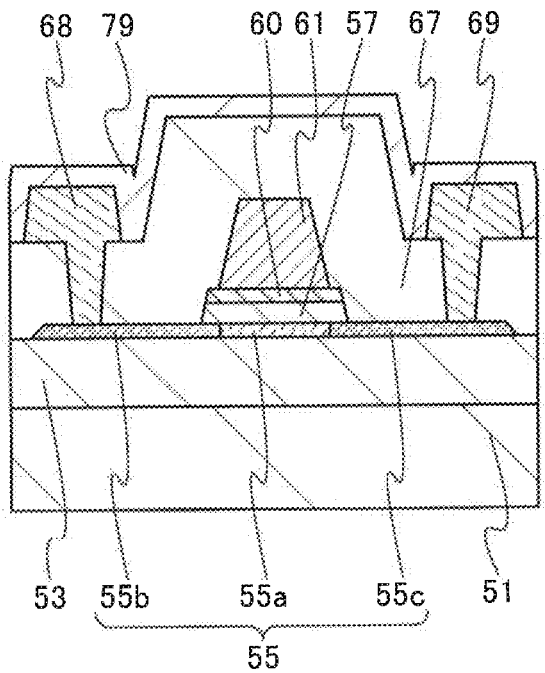
FIGS. 11A to 11D are cross-sectional views each illustrating one embodiment of a semiconductor device.

A transistor illustrated in FIG. 11A is different from that in FIG. 10A in that an edge of the buffer film 60 extends beyond the conductive film 61. This means that the area of the top surface of the buffer film 60 is larger than the area of the top surface of the conductive film 61. Furthermore, a side surface of the insulating film 57 is substantially aligned with the side surface of the buffer film 60.

Other components are the same as those of the transistor illustrated in FIG. 10A; thus, detailed descriptions thereof are omitted here.

In the case where the buffer film 60 of the transistor illustrated in FIG. 11A is formed using an insulating film, the interfaces of the first region 55*a* with the second regions 55*b* and 55*c* may be substantially aligned with edges of the conductive film 61.

Figure 11B:
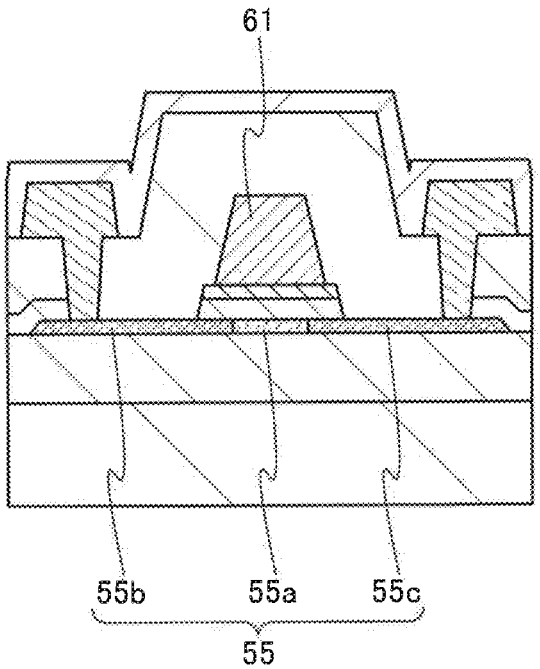

Alternatively, in the case where the buffer film 60 is formed using an insulating film, the second regions 55*b* and 55*c* may each have an overlap region Lov overlapping with part of the conductive film 61 as in a transistor illustrated in FIG. 11B.

Figure 11C:
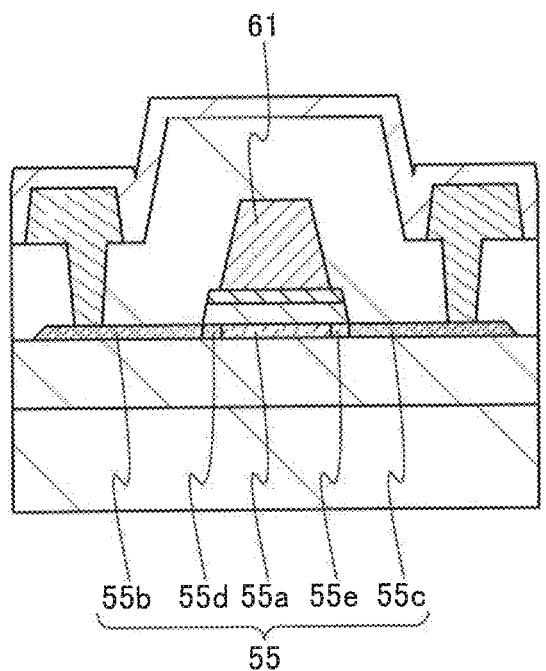

Further alternatively, in the case where the buffer film 60 is formed using an insulating film, the third region 55*d* may be provided between the first region 55*a* and the second region 55*b* and the third region 55*e* may be provided between the first region 55*a* and the second region 55*c* as in a transistor illustrated in FIG. 11C.

Figure 11D:
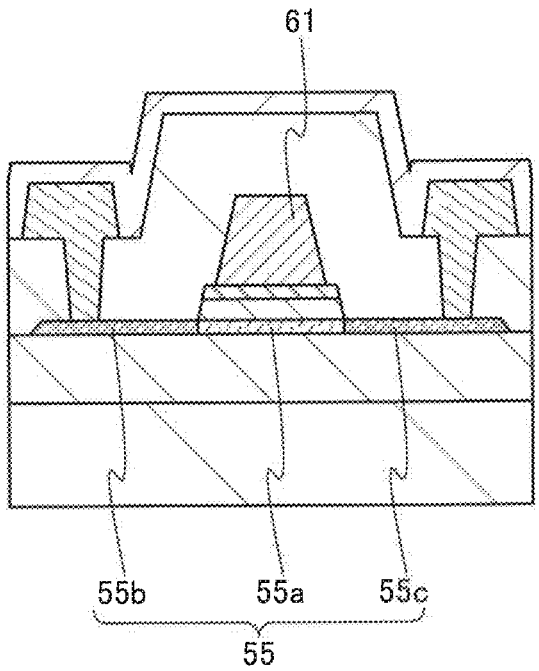

Still further alternatively, in the case where the buffer film 60 is formed using an insulating film, the second regions 55*b* and 55*c* do not necessarily overlap with the conductive film 61 and may have offset regions Loff as in a transistor illustrated in FIG. 11D.

In the case where the buffer film 60 in each of the transistors illustrated in FIGS. 11A to 11D is a semiconductor, the buffer film 60 and the conductive film 61 collectively serve as a gate electrode.

Thus, in the case where the buffer film 60 in FIG. 11A is a semiconductor, the interfaces of the first region 55*a* with the second regions 55*b* and 55*c* may be substantially aligned with the edges of the buffer film 60.

In the case where the buffer film 60 in FIG. 11B is a semiconductor, the overlap regions Lov are regions where the second regions 55b and 55c overlap with at least the buffer film 60.

In the case where the buffer film 60 in FIG. 11D is a semiconductor, the channel length is the width of a region which is in the first region 55a and overlaps with the buffer film 60.

<Structure 3 of Semiconductor Device>

Structures of transistors included in semiconductor devices will be described with reference to FIGS. 12A to 12D.

Figure 12A:
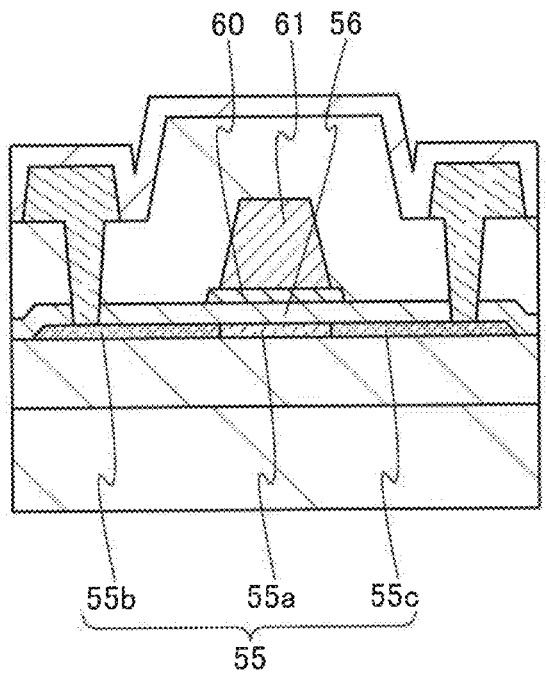
FIGS. 12A to 12D are cross-sectional views each illustrating one embodiment of a semiconductor device.

A transistor illustrated in FIG. 12A is different from the transistors in FIGS. 11A to 11D in that the insulating film 56 positioned between the oxide semiconductor film 55 and the buffer film 60 is not etched. In other words, the insulating film 56 covers a surface of the oxide semiconductor film 55 on the buffer film 60 side.

Other components are the same as those of the transistor illustrated in FIG. 11A; thus, detailed descriptions thereof are omitted here.

In the case where the buffer film 60 of the transistor illustrated in FIG. 12A is formed using an insulating film, the interfaces of the first region 55a with the second regions 55b and 55c may be substantially aligned with edges of the conductive film 61.

Figure 12B:
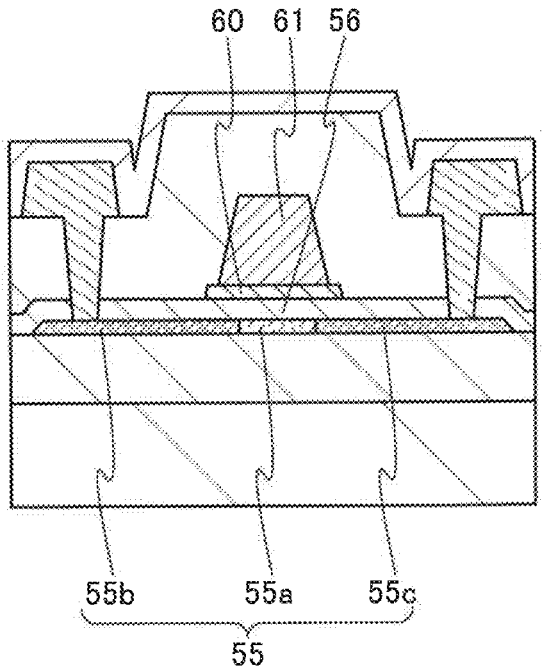

Alternatively, in the case where the buffer film 60 is formed using an insulating film, the second regions 55b and 55c may each have an overlap region Lov overlapping with part of the conductive film 61 as in a transistor illustrated in FIG. 12B.

Figure 12C:
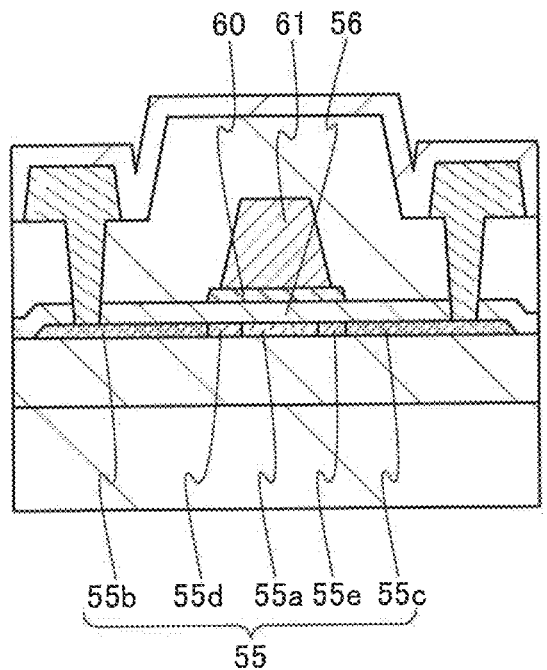

Further alternatively, in the case where the buffer film 60 is formed using an insulating film, the third region 55d may be provided between the first region 55a and the second region 55b and the third region 55e may be provided between the first region 55a and the second region 55c as in a transistor illustrated in FIG. 12C.

Figure 12D:
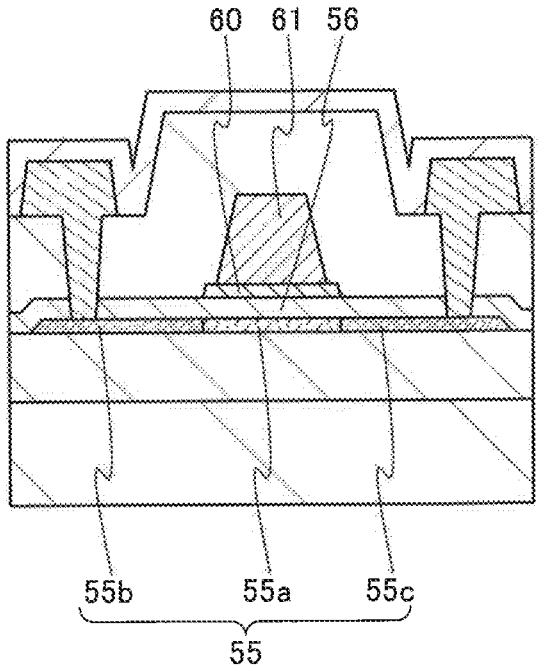

Still further alternatively, in the case where the buffer film 60 is formed using an insulating film, the second regions 55b and 55c do not necessarily overlap with the conductive film 61 and may have offset regions Loff as in a transistor illustrated in FIG. 12D.

In the case where the buffer film 60 in each of the transistors illustrated in FIGS. 12A to 12D is a semiconductor, the buffer film 60 and the conductive film 61 collectively serve as a gate electrode.

Thus, in the case where the buffer film 60 in FIG. 12A is a semiconductor, the interfaces of the first region 55a with the second regions 55b and 55c may be substantially aligned with the edges of the buffer film 60.

In the case where the buffer film 60 in FIG. 12B is a semiconductor, the overlap regions Lov are regions where the second regions 55b and 55c overlap with at least the buffer film 60.

In the case where the buffer film 60 in FIG. 12D is a semiconductor, the channel length is the width of a region which is in the first region 55a and overlaps with the buffer film 60.

<Method 1 for Manufacturing Semiconductor Device>

Next, a method for manufacturing the transistor illustrated in FIG. 10A will be described with reference to FIGS. 3A to 3D and FIGS. 13A to 13C.

As described in <Method for Manufacturing Semiconductor Device> in Embodiment 1, through the steps in FIGS. 3A to 3D, the insulating film 53 over the substrate 51, the oxide semiconductor film 54 over the insulating film 53, the insulating film 57 over the oxide semiconductor film 54, the buffer film 60 over the insulating film 57, and the conductive film 61 over the buffer film 60 are formed.

Figure 13A:
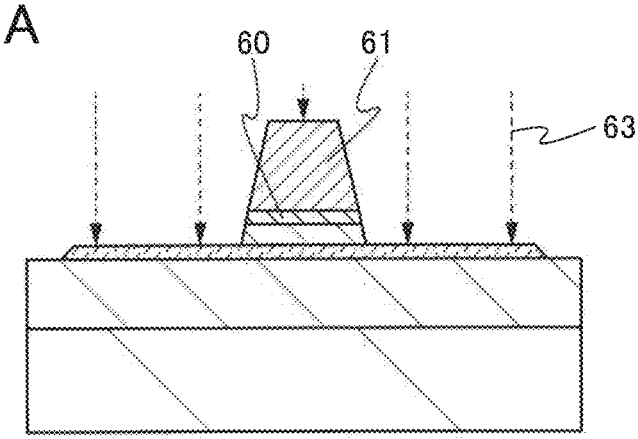
FIGS. 13A to 13C are cross-sectional views illustrating one embodiment of a manufacturing process of a semiconductor device.
Figure 13B:
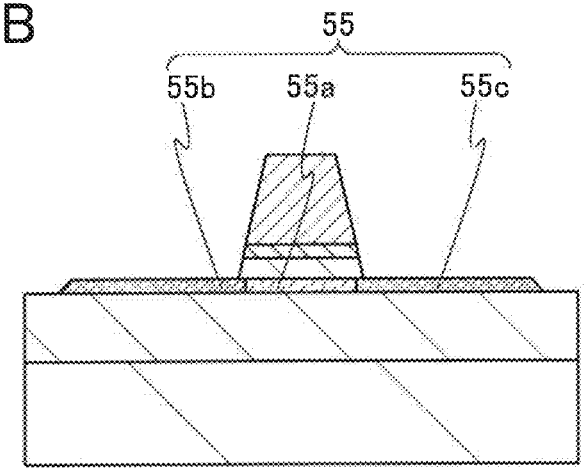
Figure 13C:
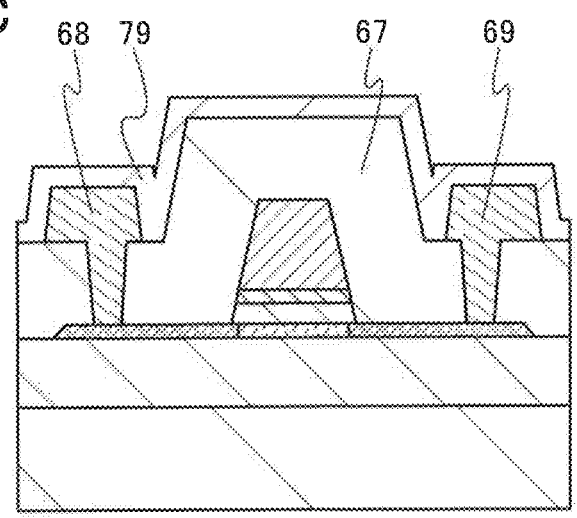

Then, as illustrated in FIG. 13A, the impurity element 63 is added to the oxide semiconductor film 54, using the buffer film 60 and the conductive film 61 as a mask. Here, as the impurity element 63, hydrogen and one or more of a rare gas, boron, nitrogen, fluorine, aluminum, and phosphorus are added concurrently or separately. As a result, the oxide semiconductor film 55 that includes the first region 55a to which the impurity element is not added and the second regions 55b and 55c containing the impurity element and hydrogen can be formed as illustrated in FIG. 13B.

Next, the insulating film 67 having openings may be formed over the oxide semiconductor film 55, the insulating film 57, the buffer film 60, and the conductive film 61. Then, the pair of conductive films 68 and 69 may be formed. After that, the insulating film 79 may be formed over the insulating film 67 and the pair of conductive films 68 and 69 (see FIG. 13C).

Through the above-described steps, the transistor illustrated in FIG. 10A can be fabricated.

<Method 2 for Manufacturing Semiconductor Device>

Next, a method for manufacturing the transistor illustrated in FIG. 11A will be described with reference to FIGS. 7A to 7D and FIGS. 8A and 8B.

As described in <Method 1 for Manufacturing Semiconductor Device> in Embodiment 2, through the steps in FIGS. 7A to 7D and FIG. 8A, the insulating film 53 over the substrate 51, the oxide semiconductor film 54 over the insulating film 53, the insulating film 57 over the oxide semiconductor film 54, the buffer film 60 over the insulating film 57, and the conductive film 61 over the buffer film 60 are formed.

Then, as illustrated in FIG. 8B, the impurity element 63 is added to the oxide semiconductor film 54, using the buffer film 60 and the conductive film 61 as a mask. Here, as the impurity element 63, hydrogen and one or more of a rare gas, boron, nitrogen, fluorine, aluminum, and phosphorus are added concurrently or separately. As a result, the oxide semiconductor film 55 that includes the first region 55a to which the impurity element is not added and the second regions 55b and 55c containing the impurity element and hydrogen can be formed as illustrated in FIG. 11A.

Next, the insulating film 67 having openings may be formed over the oxide semiconductor film 55, the insulating film 57, the buffer film 60, and the conductive film 61. Then, the pair of conductive films 68 and 69 may be formed. After that, the insulating film 79 may be formed over the insulating film 67 and the pair of conductive films 68 and 69.

Through the above-described steps, the transistor illustrated in FIG. 11A can be fabricated.

<Method 3 for Manufacturing Semiconductor Device>

Next, a method for manufacturing the transistor illustrated in FIG. 12A will be described with reference to FIGS. 7A to 7D and FIG. 9A.

As described in <Method 1 for Manufacturing Semiconductor Device> in Embodiment 2, through the steps in FIGS. 7A to 7D, the insulating film 53 over the substrate 51, the oxide semiconductor film 54 over the insulating film 53, the insulating film 56 over the oxide semiconductor film 54, the buffer film 60 over the insulating film 56, and the conductive film 61 over the buffer film 60 are formed.

Then, as illustrated in FIG. 9A, the impurity element 63 is added to the oxide semiconductor film 54, using the buffer film 60 and the conductive film 61 as a mask. Here, as the impurity element 63, hydrogen and one or more of a rare gas, boron, nitrogen, fluorine, aluminum, and phosphorus are added concurrently or separately. As a result, the oxide semiconductor film 55 that includes the first region 55a to which the impurity element is not added and the second regions 55b and 55c containing the impurity element and hydrogen can be formed as illustrated in FIG. 12A.

Next, the insulating film 67 having openings may be formed over the insulating film 56, the buffer film 60, and the conductive film 61. Openings may be formed in the insulating film 56 to expose part of the second regions 55b and 55c in the oxide semiconductor film 55. Then, the pair of conductive films 68 and 69 may be formed. After that, the insulating film 79 may be formed over the insulating film 67 and the pair of conductive films 68 and 69.

Through the above-described steps, the transistor illustrated in FIG. 12A can be fabricated.

The structures, the methods, and the like described in this embodiment can be combined as appropriate with any of the structures, the methods, and the like described in the other embodiments.

Embodiment 4

A method for adding excess oxygen to the insulating film 53 in Embodiments 1 to 3 will be described with reference to FIGS. 14A to 14C.

Figure 14A:
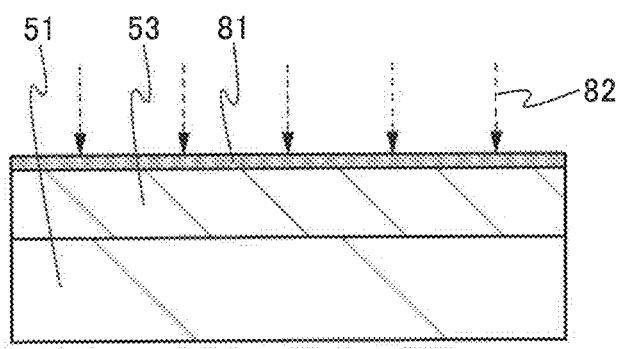
FIGS. 14A to 14C are cross-sectional views illustrating one embodiment of a manufacturing process of a semiconductor device.
Figure 14B:
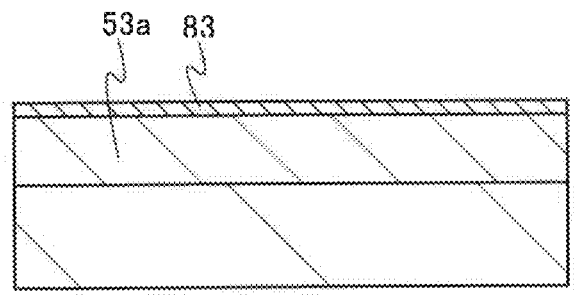

As illustrated in FIG. 14A, the insulating film 53 is formed over the substrate 51 and a buffer film 81 is formed over the insulating film 53. Then, in a manner similar to that described in Embodiment 1, oxygen 82 is added to the buffer film 81. Accordingly, an insulating film 53a to which oxygen is added and a buffer film 83 to which oxygen is added can be formed as illustrated in FIG. 14B.

The buffer film 81 can be formed as appropriate using a material and a formation method similar to those of the buffer film 58 described in Embodiment 1. The buffer film 83 is formed in a manner similar to that of the buffer film 59 described in Embodiment 1.

Figure 14C:
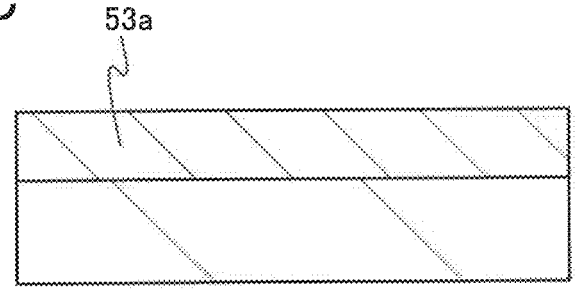

Then, the buffer film 83 may be removed as illustrated in FIG. 14C. Furthermore, an oxide semiconductor film may be formed over the insulating film 53a to which oxygen is added. As a result, oxygen contained in the insulating film 53a can be moved to the oxide semiconductor film by heat treatment to be performed later and oxygen vacancies in the oxide semiconductor film can be reduced.

The structures, the methods, and the like described in this embodiment can be combined as appropriate with any of the structures, the methods, and the like described in the other embodiments.

Embodiment 5

In this embodiment, transistors having structures applicable to Embodiments 1 to 4 and methods for manufacturing the transistors will be described with reference to FIGS. 15A to 15D, FIGS. 16A to 16D, FIGS. 17A to 17C, and FIGS. 18A to 18C. Here, the description will be made with reference to Embodiment 1.

<Structure of Semiconductor Device>

FIGS. 15A to 15D are cross-sectional views of top-gate self-aligned transistors that are examples of a transistor in a semiconductor device. Transistors described in this embodiment are different from those described in Embodiment 1 in that a gate insulating film has a stacked-layer structure.

Figure 15A:
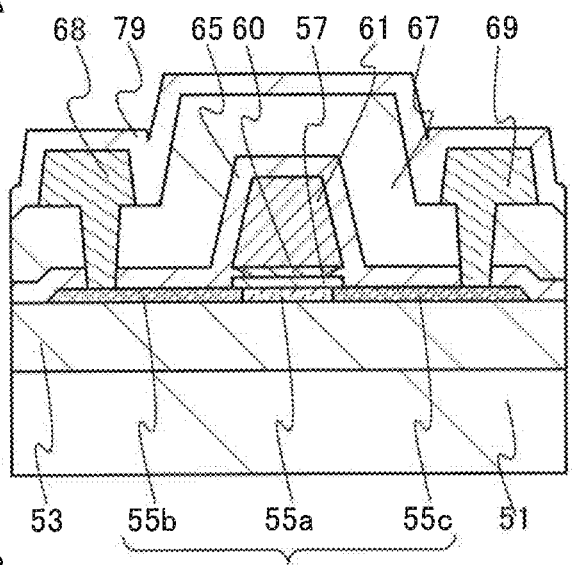
FIGS. 15A to 15D are each a cross-sectional view illustrating one embodiment of a semiconductor device.

A transistor illustrated in FIG. 15A includes the oxide semiconductor film 55, a gate insulating film in contact with the oxide semiconductor film 55, and the conductive film 61 in contact with the gate insulating film and overlapping with the oxide semiconductor film 55. In the gate insulating film, the insulating film 57 and the buffer film 60 are stacked in this order from the oxide semiconductor film 55 side. That is, the insulating film 57 is in contact with the oxide semiconductor film 55. The buffer film 60 is provided between the insulating film 57 and the conductive film 61. Although not shown in the drawing here, another insulating film may be provided between the insulating film 57 and the buffer film 60. Alternatively, another insulating film may be provided between the buffer film 60 and the conductive film 61.

As the insulating film 57, the insulating film 57 described in Embodiment 1 can be used as appropriate. Note that the insulating film 57 is preferably formed using a material that is unlikely to form a defect state at the interface with the oxide semiconductor film 55.

As the buffer film 60, the buffer film 60 described in Embodiment 1 can be used as appropriate. Note that the buffer film 60 is preferably formed using a material that is etched isotropically.

Other components are the same as those of the transistors described in Embodiment 1; thus, detailed descriptions thereof are omitted here.

In each of the transistors described in this embodiment, a side surface of the buffer film 60 has a depressed portion. Specifically, the buffer film 60 has a region with a smaller width than that of the conductive film 61. In other words, the side surface of the buffer film 60 has a region that is more on the inside than a side surface of the conductive film 61.

The insulating film 57 preferably has a thickness that allows an impurity element to be added to the second regions 55b and 55c. The thickness of insulating film 57 can be typically greater than or equal to 5 nm and less than or equal to 100 nm and preferably greater than or equal to 10 nm and less than or equal to 30 nm.

The buffer film 60 preferably has a thickness with which the buffer film 60 can serve as a gate insulating film with the insulating film 57.

In addition, in each of the transistors described in this embodiment, the second regions 55b and 55c in the oxide semiconductor film 55 each have a region overlapping with part of the conductive film 61.

Figure 15B:
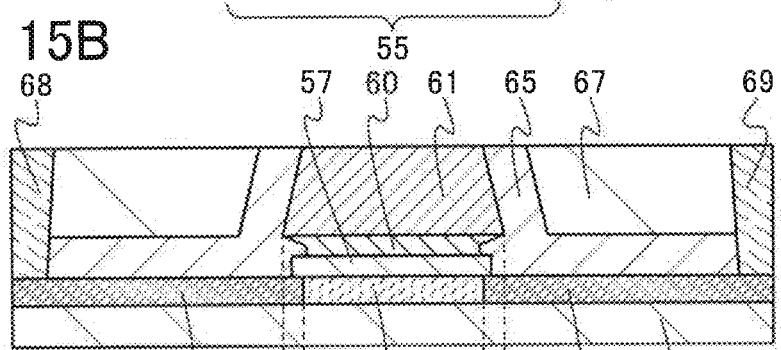
Figure 15C:
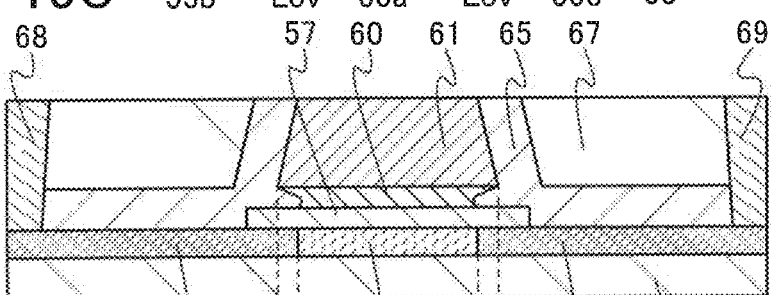
Figure 15D:
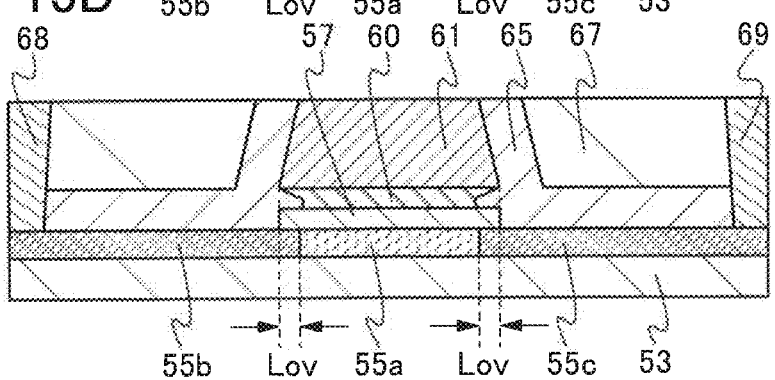

FIGS. 15B to 15D are each an enlarged cross-sectional view of the oxide semiconductor film 55 and its surroundings in the transistor illustrated in FIG. 15A.

As illustrated in FIG. 15B, part of or the entire side surface of the buffer film 60 is positioned more on the inside than a side surface of the conductive film 61. In addition, the width of the insulating film 57 is smaller than that of the conductive film 61. Moreover, the second regions 55b and 55c in the oxide semiconductor film 55 each have a region overlapping with part of the conductive film 61. Such a region can be referred to as an overlap region Lov.

Alternatively, as illustrated in FIG. 15C, part of or the entire side surface of the buffer film 60 is positioned more on the inside than a side surface of the conductive film 61. In addition, the width of the insulating film 57 is larger than that of the conductive film 61. Moreover, the second regions 55b and 55c in the oxide semiconductor film 55 each have the overlap region Lov overlapping with part of the conductive film 61.

Alternatively, as illustrated in FIG. 15D, part of or the entire side surface of the buffer film 60 is positioned more on the inside than a side surface of the conductive film 61. In addition, the width of the insulating film 57 is substantially the same as that of the conductive film 61. Moreover, the second regions 55b and 55c in the oxide semiconductor film 55 each have the overlap region Lov overlapping with part of the conductive film 61.

Note that the length of the overlap region Lov is preferably less than 20%, 10%, 5%, or 2% of a channel length L.

The insulating film 57 is formed using a material that is unlikely to form a defect state at the interface with the oxide semiconductor film 55. Since the insulating film 57 is in contact with the oxide semiconductor film 55, the density of defect states at the interface between the oxide semiconductor film 55 and the insulating film 57 can be reduced. The buffer film 60 is formed using a material that can be etched isotropically. Accordingly, the buffer film 60 having a width smaller than that of the conductive film 61 can be formed through etching with the use of the conductive film 61 as a mask. The etching rate of the buffer film 60 at an etching process may be different from that of the oxide semiconductor film. In that case, the buffer film 60 can be etched selectively and isotropically, with the oxide semiconductor film being exposed.

Since the insulating film 57 is thin, an impurity element can be added to the second regions 55b and 55c through the insulating film 57. Furthermore, hydrogen contained in the insulating film 65 can be diffused into the second regions 55b and 55c. Thus, the second regions 55b and 55c can be formed under the insulating film 57.

In each of the transistors illustrated in FIGS. 15A to 15D, a side surface of the buffer film 60 has a depressed portion. Thus, when an impurity element is added to the oxide semiconductor film 55 to form oxygen vacancies, the impurity element also enters the depressed portion at a side surface of a gate insulating film. Moreover, since the insulating film 57 is thin, an impurity element is added to the oxide semiconductor film 55 through the insulating film 57. As a result, the impurity element is added to and oxygen vacancies are formed in a region that is in the oxide semiconductor film 55 and overlaps with part of the conductive film 61.

In addition, hydrogen contained in the insulating film 65 is directly diffused or diffused through the insulating film 57 into a region of the oxide semiconductor film 55 to which the impurity element is added.

As a result, in a region that is in the oxide semiconductor film 55 and overlaps with part of the conductive film 61, the second regions 55b and 55c containing oxygen vacancies and hydrogen are formed.

That is, according to this embodiment, the second regions 55b and 55c containing oxygen vacancies and hydrogen are selectively formed in the oxide semiconductor film by selectively adding an impurity element to the oxide semiconductor film utilizing the shapes of the buffer film 60 and the insulating film 57, or by selectively making hydrogen diffuse into the oxide semiconductor film utilizing the shapes of the buffer film 60 and the insulating film 57. As described later in Embodiment 6, hydrogen is stable in an oxygen vacancy and is unlikely to be released from an oxygen vacancy. Thus, hydrogen contained in the second regions 55b and 55c is unlikely to be diffused into the first region 55a serving as a channel region, whereby deterioration in electric characteristics of the transistor can be reduced.

When hydrogen enters an oxygen vacancy and a donor level is formed in the vicinity of the conduction band, the conductivity is increased. Thus, the second regions 55b and 55c have functions of a source region and a drain region. A region in each of the second regions 55b and 55c, which overlaps with part of the conductive film 61, corresponds to an overlap region Lov. Since each of the transistors described in this embodiment has overlap regions Lov, a high-resistance region is not formed between the channel region and the source region or the drain region. For this reason, the transistors described in this embodiment have high on-state current. The electric characteristics of a transistor having high-resistance regions between the channel region and the source and drain regions are likely to deteriorate. In contrast, the electric characteristics of the transistors having the overlap regions Lov, which are described in this embodiment, are less likely to deteriorate; thus, the transistors are highly reliable.

Furthermore, in each of the transistors described in this embodiment, the second regions 55b and 55c in which oxygen vacancies are formed by addition of the impurity element contain hydrogen. This enables the resistivity of the second regions 55b and 55c to be reduced and variations in the resistivity of the second regions 55b and 55c among transistors to be reduced. In other words, by addition of the impurity element to the oxide semiconductor film for forming oxygen vacancies, the resistivity of the second regions 55b and 55c can be adjusted.

<Method 1 for Manufacturing Semiconductor Device>

Next, a method for manufacturing the transistor illustrated in FIG. 15A will be described with reference to FIGS. 16A to 16D and FIGS. 17A to 17C.

Figure 16A:
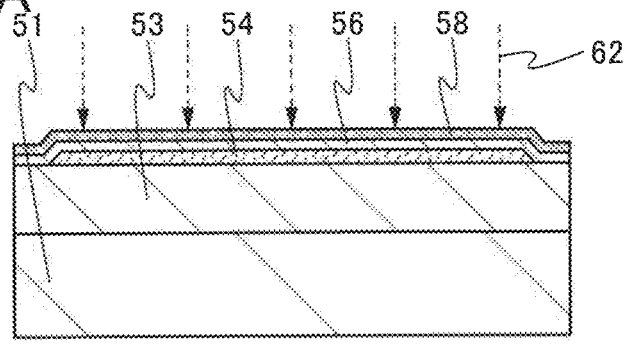
FIGS. 16A to 16D are cross-sectional views illustrating one embodiment of a manufacturing process of a semiconductor device.

In a manner similar to that described in Embodiment 1, the insulating film 53 over the substrate 51, the oxide semiconductor film 54 over the insulating film 53, the insulating film 56 over the oxide semiconductor film 54, and the buffer film 58 over the insulating film 56 are formed as illustrated in FIG. 16A. Then, the oxygen 62 is added to the buffer film 58. As a result, more oxygen can be added to the insulating film 56.

Here, a silicon oxide film is formed as the insulating film 56 and an ITO film is formed as the buffer film 58.

Figure 16B:
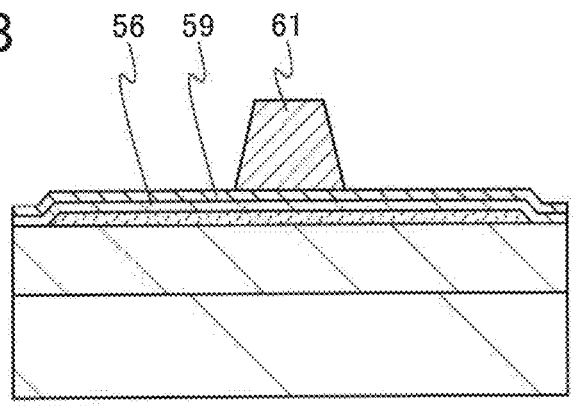

The buffer film 59 formed by addition of oxygen to the buffer film 58 is illustrated in FIG. 16B. The conductive film 61 is formed over the buffer film 59.

Figure 16C:
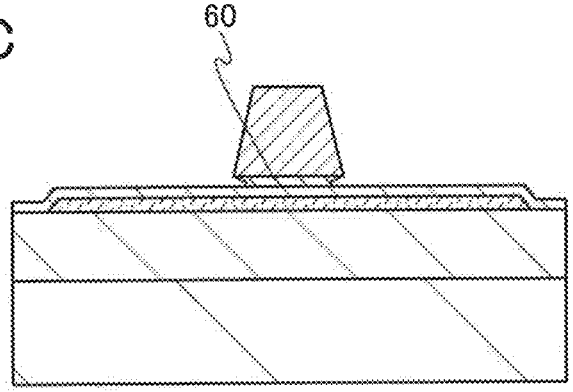

Next, as illustrated in FIG. 16C, the buffer film 59 is etched using the conductive film 61 as a mask to form the buffer film 60. Here, a wet etching method using an etchant with which the etching rate of the buffer film 59 is higher than that of the insulating film 56 can be used. Alternatively, a dry etching method using an etching gas with which the etching rate of the buffer film 59 is higher than that of the insulating film 56 and the buffer film 59 can be etched isotropically can be used. As a result, the buffer film 60 whose side surface has a depressed portion can be formed.

With the use of a solution containing oxalic acid as an etchant, the buffer film 59 can be selectively etched without removing the insulating film 56. In addition, the buffer film 59 can be etched isotropically. As a result, the buffer film 60 whose side surface has a depressed portion can be formed.

Figure 16D:
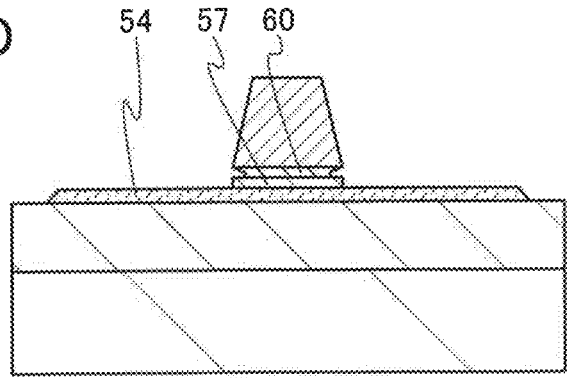

Then, as illustrated in FIG. 16D, the insulating film 56 is etched using the conductive film 61 as a mask to form the insulating film 57. Through the above steps, the insulating film 57 is formed and part of the oxide semiconductor film 54 can be exposed. Here, it is preferable to selectively etch the insulating film 56 without etching the oxide semiconductor film 54 in order to improve the yield. Thus, a dry etching method is preferably used.

Figure 17A:
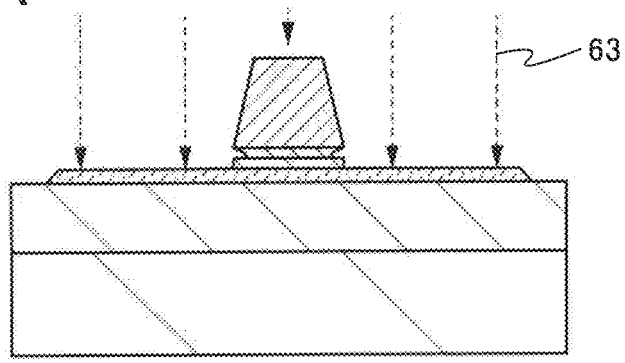
FIGS. 17A to 17C are cross-sectional views illustrating one embodiment of a manufacturing process of a semiconductor device.

Subsequently, in a manner similar to that described in Embodiment 1, the impurity element 63 is added to the oxide semiconductor film 54 using the conductive film 61 as a mask, as illustrated in FIG. 17A. As a result, the impurity element is added to an exposed portion of the oxide semiconductor film 54. In addition, the impurity element is added to the oxide semiconductor film 54 through the insulating film 57. Because of damages due to the addition of the impurity element 63, defects typified by oxygen vacancies are formed in the oxide semiconductor film 54.

Figure 17B:
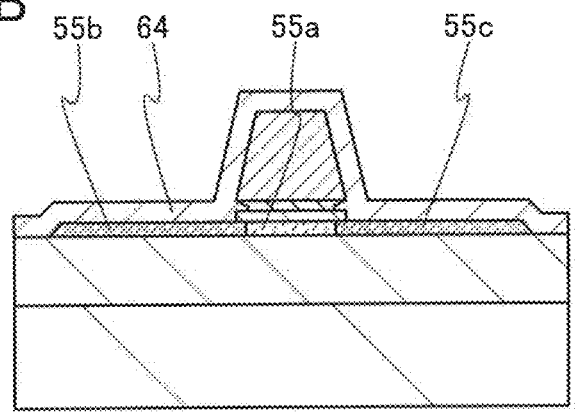

Next, in a manner similar to that described in Embodiment 1, the insulating film 64 containing hydrogen is formed over the oxide semiconductor film 54, the insulating film 57, and the conductive film 61 as illustrated in FIG. 17B.

The insulating film 64 contains hydrogen. Thus, when the oxide semiconductor film 54 is in contact with the insulating film 64 at a region to which the impurity element is added, hydrogen contained in the insulating film 64 is moved to the region to which the impurity element is added. As a result, the oxide semiconductor film 55 that includes the first region 55a to which the impurity element is not added and the second regions 55b and 55c containing the impurity element and hydrogen is formed. Note that hydrogen contained in the insulating film 64 is diffused into part of the oxide semiconductor film 55 through the insulating film 57. Thus, part of the second regions 55b and 55c may overlap with the insulating film 57. Through the above steps, the second regions 55b and 55c that overlap with part of the conductive film 61 can be formed.

Next, heat treatment may be performed to increase the conductivity of the second regions 55b and 55c.

Figure 17C:
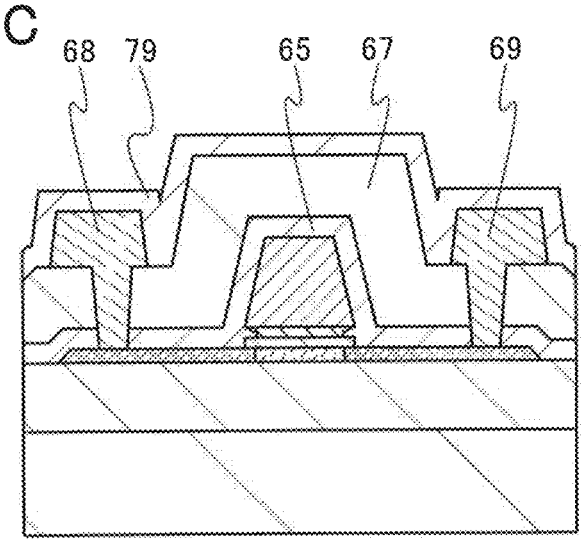

Then, as illustrated in FIG. 17C, an insulating film to be the insulating film 67 having openings may be formed over the insulating film 64 containing hydrogen. The insulating film can reduce parasitic capacitance between the conductive film 61 and the pair of conductive films 68 and 69 to be formed later.

Subsequently, in a manner similar to that described in Embodiment 1, the insulating film 64 containing hydrogen is partly etched to form the insulating film 65 having openings, so that the second regions 55b and 55c are partly exposed. After that, the pair of conductive films 68 and 69 may be formed. Next, the insulating film 79 may be formed over the insulating film 67 and the pair of conductive films 68 and 69.

Through the above-described steps, the transistor illustrated in FIG. 15A can be fabricated.

<Method 2 for Manufacturing Semiconductor Device>

A modification example of a method for forming the insulating film 57 and the buffer film 60 will be described.

Figure 18A:
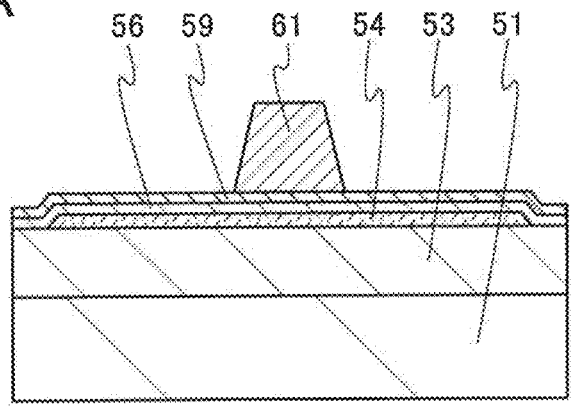
FIGS. 18A to 18C are cross-sectional views illustrating one embodiment of a manufacturing process of a semiconductor device.

In a manner similar to that described in Embodiment 1, the insulating film 53 over the substrate 51, the oxide semiconductor film 54 over the insulating film 53, the insulating film 56 over the oxide semiconductor film 54, the buffer film 59 over the insulating film 56, and the conductive film 61 over the buffer film 59 are formed as illustrated in FIG. 18A.

Figure 18B:
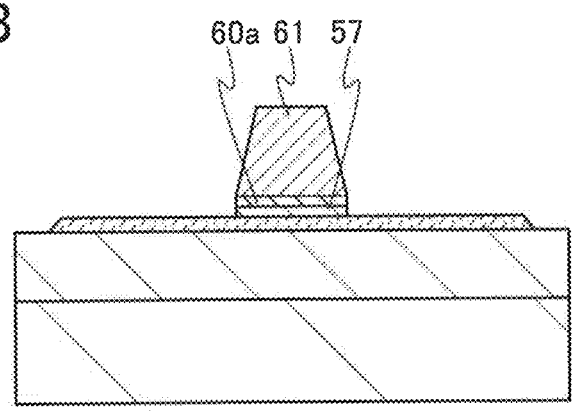

Next, as illustrated in FIG. 18B, the insulating film 56 and the buffer film 59 are etched using the conductive film 61 as a mask to form the insulating film 57 and a buffer film 60a.

It is preferable to etch the insulating film 56 and the buffer film 59 selectively without etching the oxide semiconductor film 54 in order to improve the yield. Accordingly, a dry etching method is employed here.

Figure 18C:
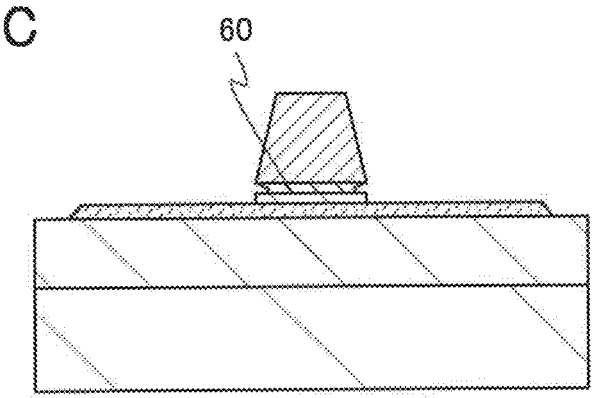

Next, as illustrated in FIG. 18C, the buffer film 60a is etched to form the buffer film 60 whose side surface has a depressed portion.

After that, through the steps similar to those described in <Method 1 for Manufacturing Semiconductor Device>, the transistor can be fabricated.

The structures, the methods, and the like described in this embodiment can be combined as appropriate with any of the structures, the methods, and the like described in the other embodiments.

Embodiment 6

In this embodiment, a reduction in resistivity of the second regions 55b and 55c in the oxide semiconductor film 55 that occurs when the second regions 55b and 55c in the oxide semiconductor film 55 contain oxygen vacancies and hydrogen will be described. Specifically, $V_OH$ formed in the second regions 55b and 55c in the oxide semiconductor film 55 will be described. Note that in this embodiment, a state in which a hydrogen atom H exists in an oxygen vacancy $V_O$ is expressed as $V_OH$.

<(1) Ease of Formation and Stability of $V_OH$>

In the case where an oxide semiconductor film (hereinafter referred to as IGZO) is a crystal, H preferentially diffuses along the a-b plane at a room temperature. In heat treatment at 450° C., H diffuses along the a-b plane and in the c-axis direction. Here, description is made on whether H easily enters an oxygen vacancy $V_O$ if the oxygen vacancy $V_O$ exists in IGZO.

Figure 19:
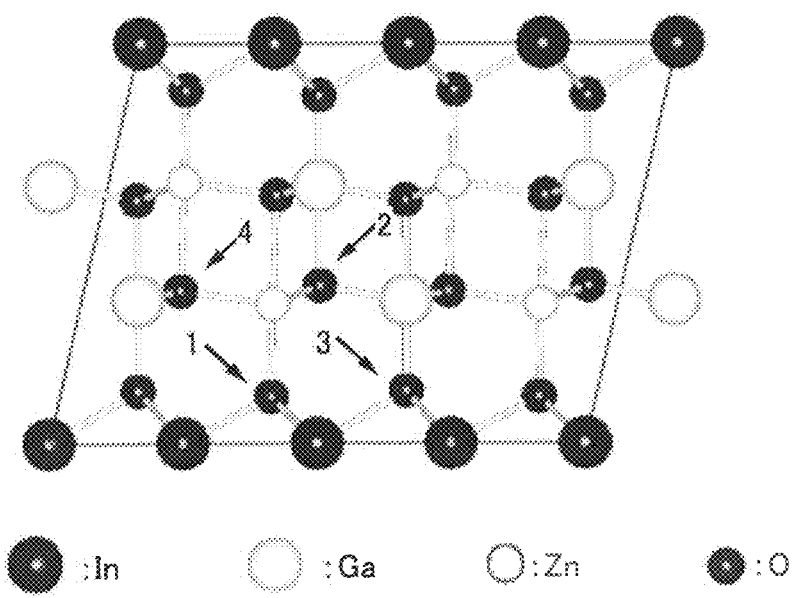
FIG. 19 illustrates a calculation model.

An $InGaZnO_4$ crystal model shown in FIG. 19 was used for calculation. The activation barrier ($E_a$) along the reaction path where H in $V_OH$ is released from $V_O$ and bonded to oxygen was calculated by a nudged elastic band (NEB) method. The calculation conditions are shown in Table 1.

TABLE 1

| | |
|---|---|
| Software | VASP |
| Calculation Method | NEB method |
| Functional | GGA-PBE |
| Pseudo potential | PAW |
| Cut-off energy | 500 eV |
| k-point | 2 × 2 × 3 |

In the $InGaZnO_4$ crystal model, there are oxygen sites 1 to 4 as shown in FIG. 19 which differ from each other in metal elements bonded to oxygen and the number of bonded metal elements. Here, calculation was made on the oxygen sites 1 and 2 in which an oxygen vacancy $V_O$ is easily formed.

First, calculation was made on the oxygen site 1 in which an oxygen vacancy $V_O$ is easily formed, which is herein the oxygen site that was bonded to three In atoms and one Zn atom.

Figure 20A:
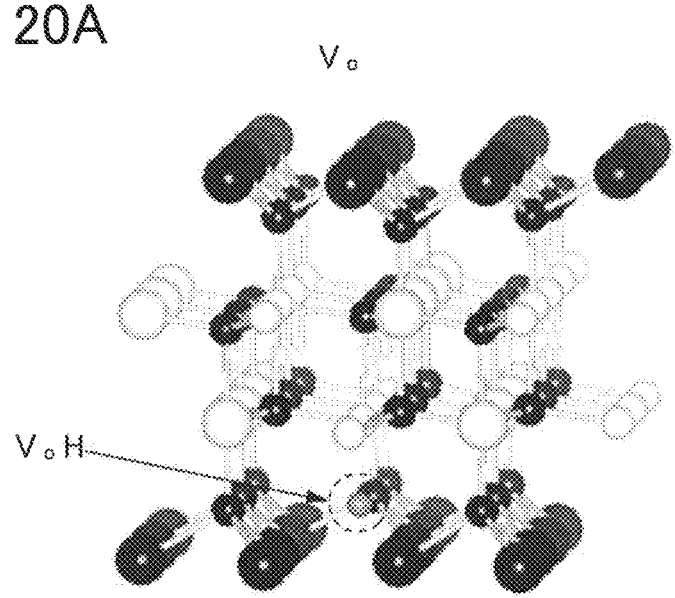
FIGS. 20A and 20B illustrate an initial state and a final state, respectively.
Figure 20B:
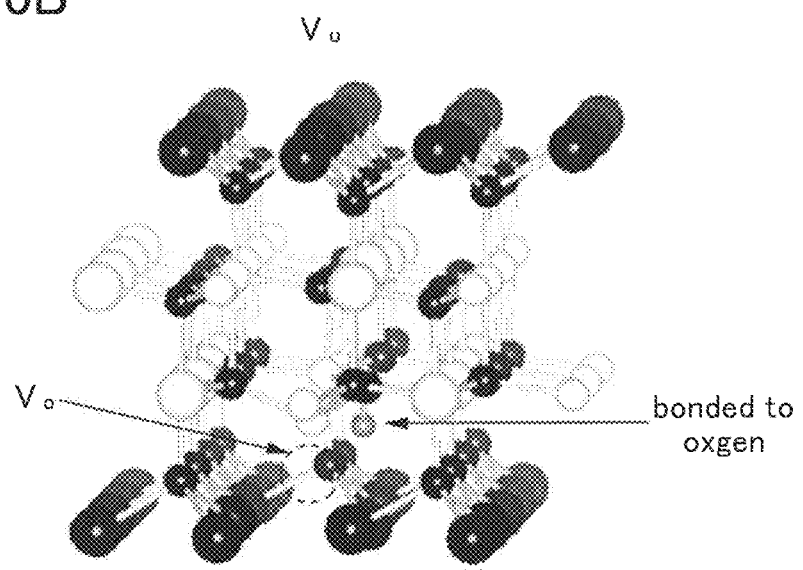
Figure 21:
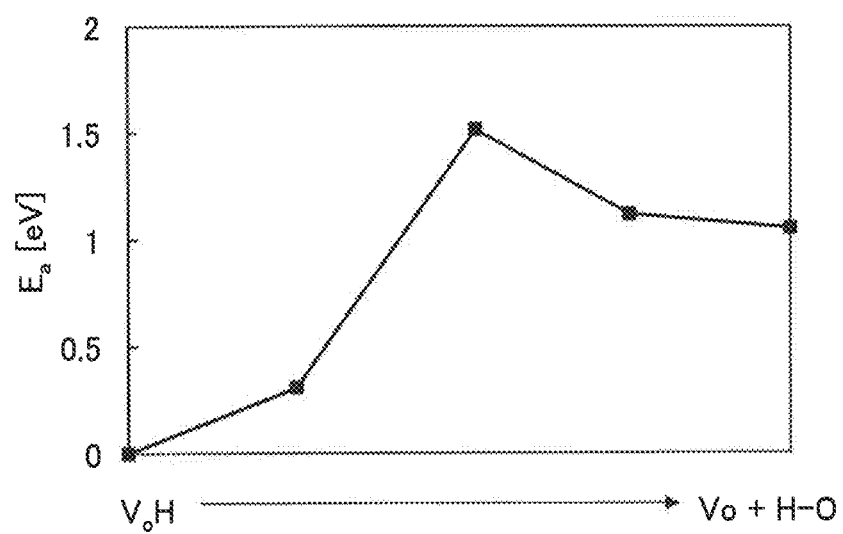
FIG. 21 shows an activation barrier.

FIG. 20A shows a model in the initial state and FIG. 20B shows a model in the final state. FIG. 21 shows the calculated activation barrier ($E_a$) in the initial state and the final state. Note that here, the initial state refers to a state in which H exists in an oxygen vacancy $V_O$ ($V_OH$), and the final state refers to a structure including an oxygen vacancy $V_O$ and a state in which H is bonded to oxygen bonded to one Ga atom and two Zn atoms (H—O).

From the calculation results, bonding of H in an oxygen vacancy $V_O$ to another oxygen atom needs an energy of approximately 1.52 eV, while entry of H bonded to O into an oxygen vacancy $V_O$ needs an energy of approximately 0.46 eV.

Reaction frequency (Γ) was calculated with use of the activation barriers ($E_a$) obtained by the calculation and Formula 1. In Formula 1, $k_B$ represents the Boltzmann constant and T represents the absolute temperature.

[Formula 1]

$$\Gamma = \nu \exp\left(-\frac{E_a}{k_B T}\right) \quad (1)$$

The reaction frequency at 350° C. was calculated on the assumption that the frequency factor $\nu=10^{13}$/s. The frequency of H transfer from the model shown in FIG. 20A to the model shown in FIG. 20B was $5.52\times10^0$/s, whereas the frequency of H transfer from the model shown in FIG. 20B to the model shown in FIG. 20A was $1.82\times10^9$/s. This suggests that H diffusing in IGZO is likely to form $V_OH$ if an oxygen vacancy $V_O$ exists in the neighborhood, and H is unlikely to be released from the oxygen vacancy $V_O$ once $V_OH$ is formed.

Next, calculation was made on the oxygen site 2 in which an oxygen vacancy $V_O$ is easily formed, which is herein the oxygen site that was bonded to one Ga atom and two Zn atoms.

Figure 22A:
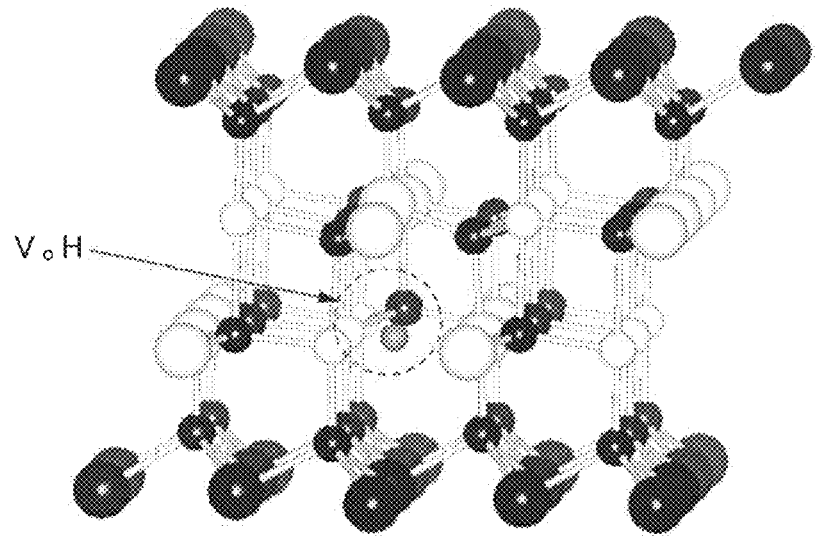
FIGS. 22A and 22B illustrate an initial state and a final state, respectively.
Figure 22B:
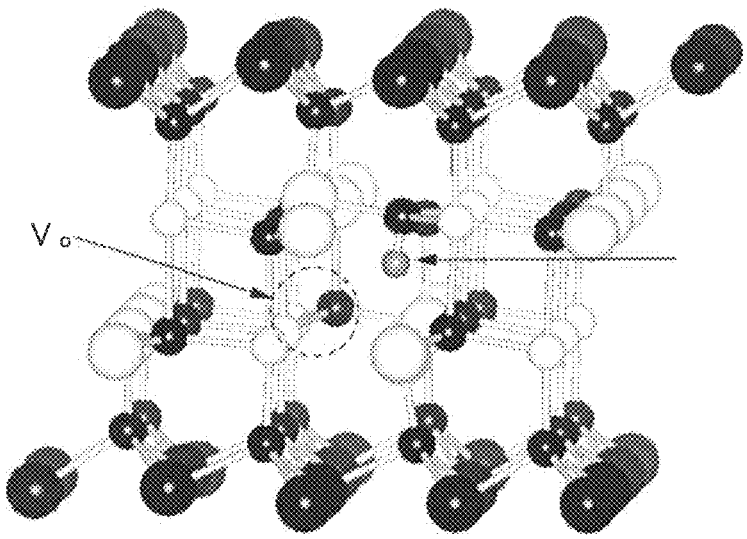
Figure 23:
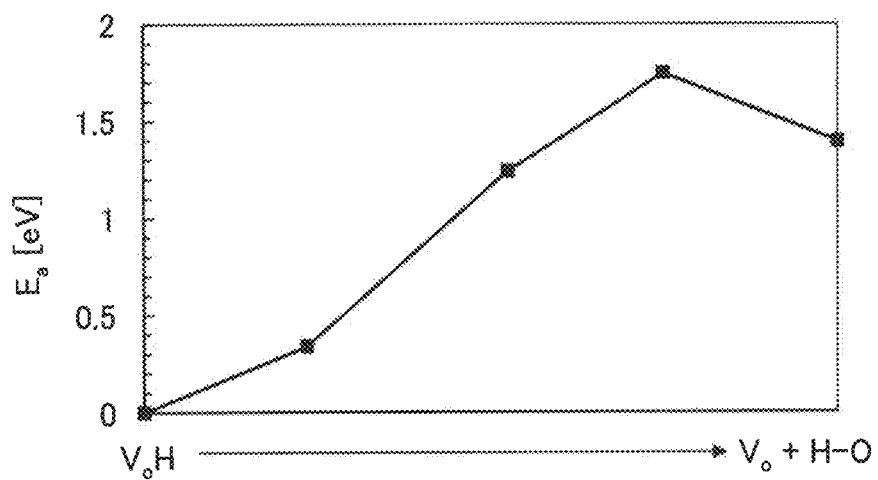
FIG. 23 shows an activation barrier.

FIG. 22A shows a model in the initial state and FIG. 22B shows a model in the final state. FIG. 23 shows the calculated activation barrier ($E_a$) in the initial state and the final state. Note that here, the initial state refers to a state in which H exists in an oxygen vacancy $V_O$ ($V_OH$), and the final state refers to a structure including an oxygen vacancy $V_O$ and a state in which H is bonded to oxygen bonded to one Ga atom and two Zn atoms (H—O).

From the calculation results, bonding of H in an oxygen vacancy $V_O$ to another oxygen atom needs an energy of approximately 1.75 eV, while entry of H bonded to O in an oxygen vacancy $V_O$ needs an energy of approximately 0.35 eV.

Reaction frequency (Γ) was calculated with use of the activation barriers ($E_a$) obtained by the calculation and the above Formula 1.

The reaction frequency at 350° C. was calculated on the assumption that the frequency factor $\nu=10^{13}$/s. The frequency of H transfer from the model shown in FIG. 22A to the model shown in FIG. 22B was $7.53\times10^{-2}$/s, whereas the frequency of H transfer from the model shown in FIG. 22B to the model shown in FIG. 22A was $1.44\times10^{10}$/s. This suggests that H is unlikely to be released from the oxygen vacancy $V_O$ once $V_OH$ is formed.

From the above results, it was found that H in IGZO easily diffused in heat treatment and if an oxygen vacancy $V_O$ existed, H was likely to enter the oxygen vacancy $V_O$ to be $V_OH$.

<(2) Transition Level of $V_OH$>

The calculation by the NEB method, which was described in <(1) Ease of Formation and Stability of $V_OH$>, indicates that in the case where an oxygen vacancy $V_O$ and H exist in IGZO, the oxygen vacancy $V_O$ and H easily form $V_OH$ and $V_OH$ is stable. To determine whether $V_OH$ is related to a carrier trap, the transition level of $V_OH$ was calculated.

The model used for calculation is the InGaZnO$_4$ crystal model (112 atoms). $V_OH$ models of the oxygen sites 1 and 2 shown in FIG. 19 were made to calculate the transition levels. The calculation conditions are shown in Table 2.

TABLE 2

| | |
|---|---|
| Software | VASP |
| Model | InGaZnO$_4$ crystal (112 atoms) |
| Functional | HSE06 |
| Mixture ratio of exchange terms | 0.25 |
| Pseudo potential | GGA-PBE |
| Cut-off energy | 800 eV |
| k-point | 1 × 1 × 1 |

The mixture ratio of exchange terms was adjusted to have a band gap close to the experimental value. As a result, the band gap of the InGaZnO$_4$ crystal model without defects was 3.08 eV that is close to the experimental value, 3.15 eV.

The transition level (ε(q/q')) of a model having defect D can be calculated by the following Formula 2. Note that $\Delta E(D^q)$ represents the formation energy of defect D at charge q, which is calculated by Formula 3.

[Formula 2]

$$\varepsilon(q/q') = \frac{\Delta E(D^q) - \Delta E(D^{q'})}{q' - q} \quad (2)$$

[Formula 3]

$$\Delta E(D^q) = E_{tot}(D^q) - E_{tot}(\text{bulk}) + \sum_i \Delta n_i \mu_i + q(\varepsilon_{VBM} + \Delta V_q + E_F) \quad (3)$$

In Formulae 2 and 3, $E_{tot}(D^q)$ represents the total energy of the model having defect D at the charge q in, $E_{tot}(\text{bulk})$ represents the total energy in a model without defects, $\Delta n_i$ represents a change in the number of atoms i contributing to defects $\mu_i$ represents the chemical potential of atom i, $\varepsilon_{VBM}$ represents the energy of the valence band maximum in the model without defects, $\Delta V_q$ represents the correction term relating to the electrostatic potential, and $E_F$ represents the Fermi energy.

Figure 24:
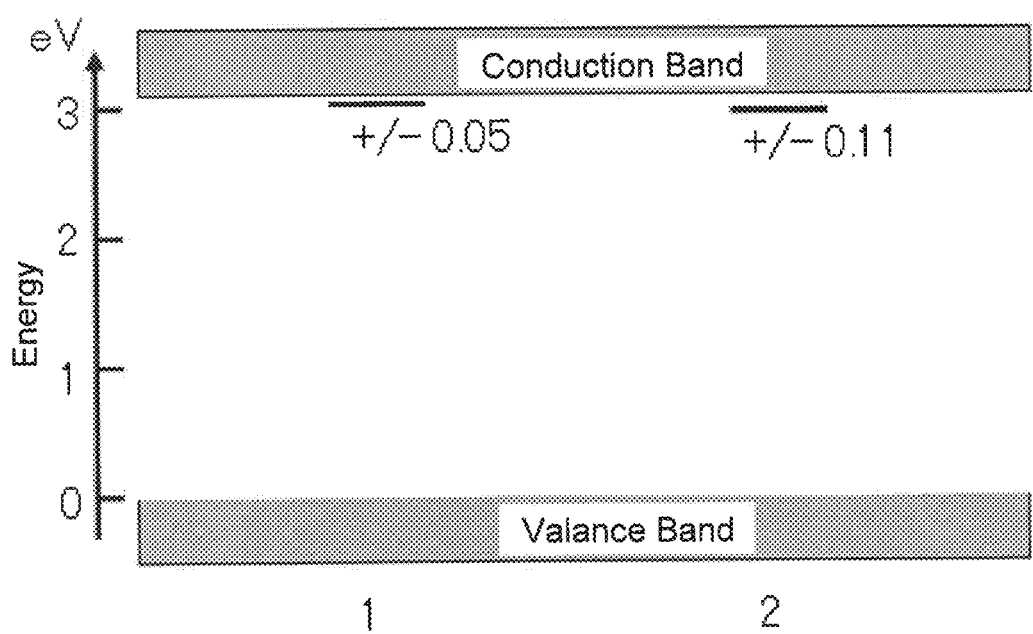
FIG. 24 shows the transition levels of $V_O H$.

FIG. 24 shows the transition levels of $V_OH$ obtained from the above formulae. The numbers in FIG. 24 represent the depth from the conduction band minimum. In FIG. 24, the transition level of $V_OH$ in the oxygen site 1 is at 0.05 eV from the conduction band minimum, and the transition level of $V_OH$ in the oxygen site 2 is at 0.11 eV from the conduction band minimum Therefore, these $V_OH$ would be related to electron traps; that is, $V_OH$ was found to behave as a donor. It was also found that IGZO including $V_OH$ had conductivity.

<(3) Temperature Dependence of Resistivity>

The temperature dependence of the resistivity of a film formed using an oxide conductor (hereinafter referred to as an oxide conductor film) will be described with reference to FIG. 25.

In this embodiment, samples each including an oxide conductor film were fabricated. As the oxide conductor film, an oxide conductor film (OC_SiN$_x$) formed by making an oxide semiconductor film in contact with a silicon nitride film, an oxide conductor film (OC_Ar dope+SiN$_x$) formed by making an oxide semiconductor film in contact with a silicon nitride film after addition of argon to the oxide semiconductor film with a doping apparatus, or an oxide conductor film (OC_Ar plasma+SiN$_x$) formed by making an oxide semiconductor film in contact with a silicon nitride film after exposure of the oxide semiconductor film to argon plasma with a plasma treatment apparatus was formed. The silicon nitride film contains hydrogen.

A method for fabricating the sample including the oxide conductor film (OC_SiN$_x$) is described below. A 400-nm-thick silicon oxynitride film was deposited over a glass substrate by a plasma CVD method and then exposed to oxygen plasma so that an oxygen ion was added to the silicon oxynitride film, whereby a silicon oxynitride film from which oxygen is released by being heated was formed. Next, a 100-nm-thick In—Ga—Zn oxide film was formed over the silicon oxynitride film by a sputtering method using a sputtering target with an atomic ratio of In:Ga:Zn=1:1:1.2, and heat treatment at 450° C. in a nitrogen atmosphere and subsequently heat treatment at 450° C. in a mixed gas atmosphere of nitrogen and oxygen were performed. Next, a 100-nm-thick silicon nitride film was deposited by a plasma CVD method. Then, the film was subjected to heat treatment in a mixed gas atmosphere of nitrogen and oxygen at 350° C.

A method for fabricating the sample including the oxide conductor film (OC_Ar dope+SiN$_x$) is described below. A 400-nm-thick silicon oxynitride film was deposited over a glass substrate by a plasma CVD method and then exposed to oxygen plasma so that an oxygen ion was added to the silicon oxynitride film, whereby a silicon oxynitride film from which oxygen is released by being heated was formed. Next, a 100-nm-thick In—Ga—Zn oxide film was formed over the silicon oxynitride film by a sputtering method using a sputtering target with an atomic ratio of In:Ga:Zn=1:1:1.2, and heat treatment at 450° C. in a nitrogen atmosphere and subsequently heat treatment at 450° C. in a mixed gas atmosphere of nitrogen and oxygen were performed. Next, with a doping apparatus, argon with a dose of $5\times10^{14}/cm^2$ was added to the In—Ga—Zn oxide film at an accelerating voltage of 10 kV, whereby an oxygen vacancy was formed in the In—Ga—Zn oxide film Next, a 100-nm-thick silicon nitride film was deposited by a plasma CVD method. Then, the film was subjected to heat treatment in a mixed gas atmosphere of nitrogen and oxygen at 350° C.

A method for fabricating the sample including the oxide conductor film (OC_Ar plasma+SiN$_x$) is described below. A 400-nm-thick silicon oxynitride film was deposited over a glass substrate by a plasma CVD method and then exposed to oxygen plasma, whereby a silicon oxynitride film from which oxygen is released by being heated was formed. Next, a 100-nm-thick In—Ga—Zn oxide film was formed over the silicon oxynitride film by a sputtering method using a sputtering target with an atomic ratio of In:Ga:Zn=1:1:1.2, and heat treatment at 450° C. in a nitrogen atmosphere and subsequently heat treatment at 450° C. in a mixed gas atmosphere of nitrogen and oxygen were performed. Next, argon plasma was generated with a plasma treatment apparatus, and an accelerated argon ion was made to collide against the In—Ga—Zn oxide film, whereby an oxygen vacancy was generated. Next, a 100-nm-thick silicon nitride film was deposited by a plasma CVD method. Then, the film was subjected to heat treatment in a mixed gas atmosphere of nitrogen and oxygen at 350° C.

Figure 25:
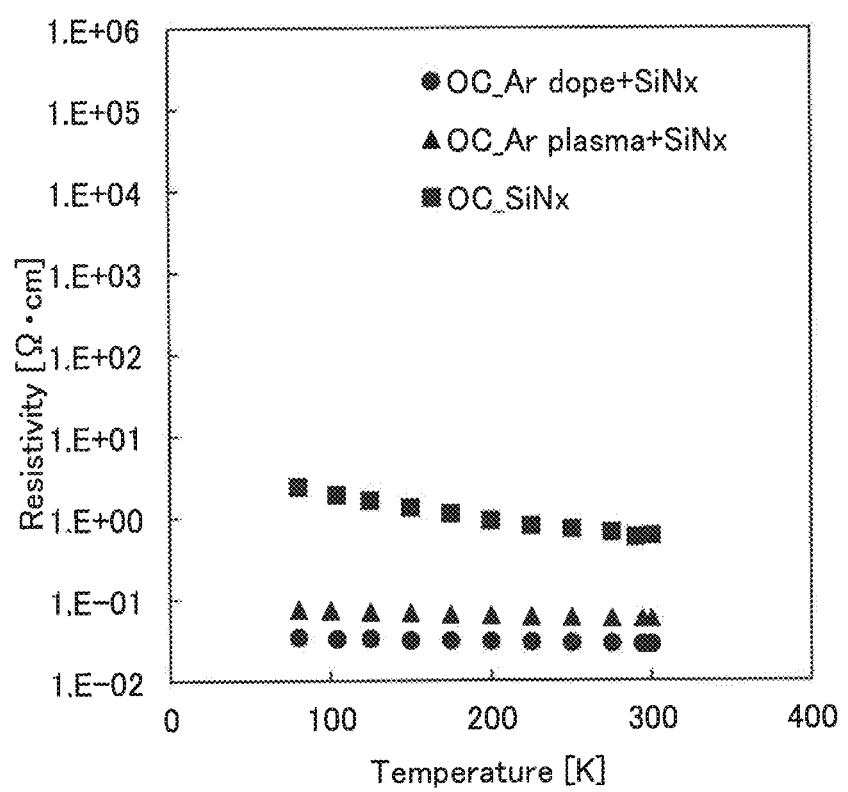
FIG. 25 shows temperature dependence of resistivity.

Next, FIG. 25 shows the measured resistivity of the samples. The measurement of resistivity was performed by the four-probe Van der Pauw method. In FIG. 25, the horizontal axis represents measurement temperature, and the vertical axis represents resistivity. Measurement results of the oxide conductor film (OC_SiN$_x$) are plotted as squares, measurement results of the oxide conductor film (OC_Ar dope+SiN$_x$) are plotted as circles, and measurement results of the oxide conductor film (OC_Ar plasma+SiN$_x$) are plotted as triangles.

Note that although not shown in the graph, an oxide semiconductor film that is not in contact with a silicon nitride film has high resistivity that is difficult to measure. This indicates that the oxide conductor film has lower resistivity than the oxide semiconductor film.

As is seen from FIG. 25, there is a small variation in the resistivity of the oxide conductor film (OC_Ar dope+SiN$_x$) and the oxide conductor film (OC_Ar plasma+SiN$_x$), each of which includes oxygen vacancies and hydrogen. Typically, the variation in resistivity at temperatures from 80 K to 290 K is lower than ±20%. Alternatively, the variation in resistivity at temperatures from 150 K to 250 K is lower than ±10%. In other words, the oxide conductor is a degenerate semiconductor and it is suggested that the conduction band edge agrees with or substantially agrees with the Fermi level. Thus, when the oxide conductor film is used for a source region and a drain region of a transistor, an ohmic contact is made between the oxide conductor film and conductive films functioning as a source electrode and a drain electrode, thereby reducing the contact resistance between the oxide conductor film and the conductive films functioning as the source and drain electrodes. Since the temperature dependence of the resistivity of an oxide conductor is low, the amount of change in the contact resistance between the oxide conductor film and the conductive films functioning as the source and drain electrodes is small; thus, a highly reliable transistor can be fabricated.

The structures, the methods, and the like described in this embodiment can be combined as appropriate with any of the structures, the methods, and the like described in the other embodiments.

Embodiment 7

A structure of a gate electrode that can be applicable to Embodiments 1 to 6 will be described with reference to FIG. 26.

Figure 26:
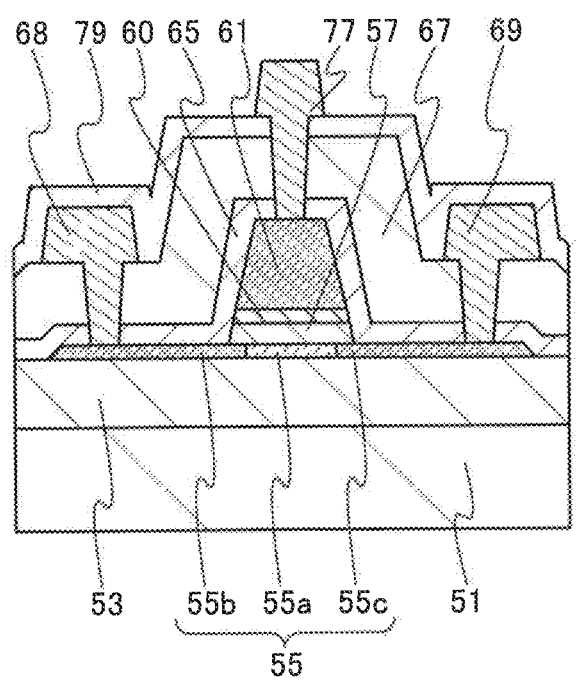
FIG. 26 is a cross-sectional view illustrating one embodiment of a semiconductor device.

In this embodiment, the conductive film 61 may be formed of a conductive oxide semiconductor film similarly to the second regions 55b and 55c in the oxide semiconductor film 55 (see FIG. 26). The conductive oxide semiconductor film has a light-transmitting property like the oxide semiconductor film 55. This enables a transistor with a light-transmitting property to be fabricated.

Note that the conductive oxide semiconductor film has higher resistivity than a conductive film formed of a metal; thus, a conductive film 77 connected to the conductive film 61 is preferably formed over the insulating film 67 in the case where a large substrate is used as the substrate 51.

Next, a method for manufacturing the transistor illustrated in FIG. 26 will be described with reference to FIGS. 3A to 3D and FIGS. 4A to 4C.

In a step shown in FIG. 3C, an oxide semiconductor film is formed instead of the conductive film 61.

After that, the insulating film 57 is formed as in FIG. 4A, and then the impurity element 63 is added to the oxide semiconductor film 54 and the oxide semiconductor film over the insulating film 57.

Then, the insulating film 64 containing hydrogen is formed as illustrated in FIG. 4B. Accordingly, the conductive film 61 (see FIG. 26) can be formed to have a structure similar to the structures of the second regions 55b and 55c in the oxide semiconductor film 55.

Next, the insulating film 67 having openings is formed, and then the pair of conductive films 68 and 69 is formed. After that, the insulating film 79 having an opening is formed, and then the conductive film 77 connected to the conductive film 61 (see FIG. 26) is formed in a manner similar to that of the pair of conductive films 68 and 69.

Through the above-described steps, a self-aligned transistor can be fabricated.

The structures, the methods, and the like described in this embodiment can be combined as appropriate with any of the structures, the methods, and the like described in the other embodiments.

Embodiment 8

In this embodiment, a structure of an oxide semiconductor film that can be used in any of the above embodiments will be described with reference to FIGS. 27A to 27D. Note that although description is made here using the transistor described in Embodiment 1, this embodiment can be applied as appropriate to the transistor described in any of the above embodiments.

Figure 27A:
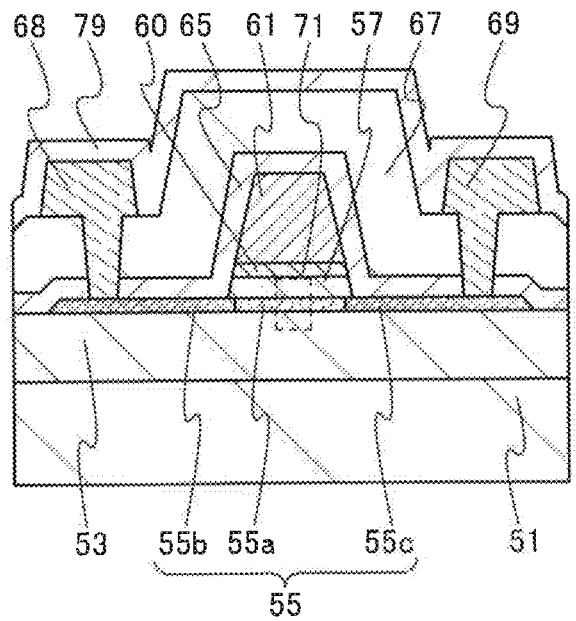
FIGS. 27A to 27D are each a cross-sectional view illustrating one embodiment of a semiconductor device.
Figure 27B:
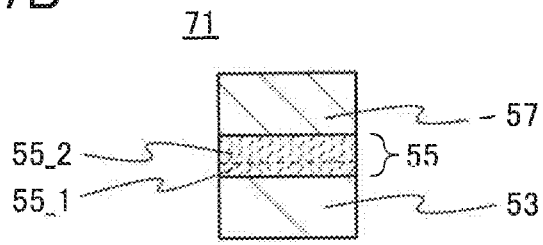
Figure 27C:
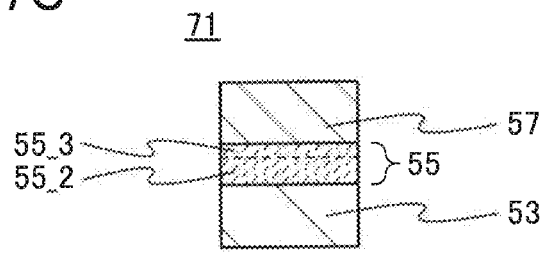
Figure 27D:
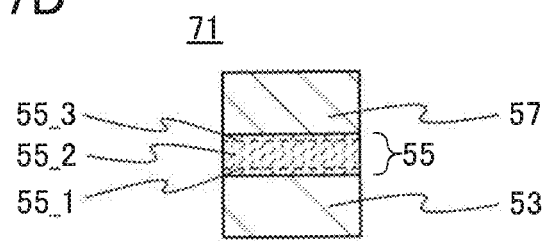

The transistor illustrated in FIG. 27A has the same structure as the transistor illustrated in FIG. 1A, which is described in Embodiment 1, except that the structure of the oxide semiconductor film 55 is different. FIGS. 27B to 27D are enlarged views of the region 71 including the oxide semiconductor film 55 and its surroundings.

As illustrated in FIG. 27B, the oxide semiconductor film 55 includes a first oxide semiconductor film 55_1 that is in contact with the insulating film 53 and a second oxide semiconductor film 55_2 that is in contact with the first oxide semiconductor film 551 and the insulating film 57.

Alternatively, as illustrated in FIG. 27C, the oxide semiconductor film 55 includes the second oxide semiconductor film 55_2 that is in contact with the insulating film 53 and a third oxide semiconductor film 55_3 that is in contact with the second oxide semiconductor film 55_2 and the insulating film 57.

Further alternatively, as illustrated in FIG. 27D, the oxide semiconductor film 55 includes the first oxide semiconductor film 55_1 that is in contact with the insulating film 53, the second oxide semiconductor film 55_2 that is in contact with the first oxide semiconductor film 551, and the third oxide semiconductor film 55_3 that is in contact with the second oxide semiconductor film 55_2 and the insulating film 57.

In the case where the first oxide semiconductor film 551, the second oxide semiconductor film 552, and the third oxide semiconductor film 553 are each an In-M-Zn oxide film (M is Al, Ti, Ga, Y, Zr, Sn, La, Ce, Nd, or Hf), when In:M:Zn=$x_1$:$y_1$:$z_1$ [atomic ratio] is satisfied in the first oxide semiconductor film 551 and the third oxide semiconductor film 55_3 and InM:Zn=$x_2$:$y_2$:$z_2$ [atomic ratio] is satisfied in the second oxide semiconductor film 55_2, $y_1/x_1$ is larger than $y_2/x_2$, preferably $y_1/x_1$ is 1.5 times or more as large as $y_2/x_2$. It is further preferable that $y_1/x_1$ be twice or more as large as $y_2/x_2$. It is still further preferable that $y_1/x_1$ be three or more times as large as $y_2/x_2$. In that case, $y_1$ is preferably larger than or equal to $x_1$ in the first oxide semiconductor film 551 and the third oxide semiconductor film 553, in which case a transistor including the second oxide semiconductor film 55_2 can have stable electric characteristics. However, when $y_1$ is three or more times as large as $x_1$, the field-effect mobility of the transistor including the second oxide semiconductor film 55_2 is reduced. Thus, it is preferable that $y_1$ be less than three times $x_1$.

In the case where the second oxide semiconductor film 552 is an In-M-Zn oxide film (M is Ga, Y, Zr, La, Ce, or Nd) and a target having the atomic ratio of metal elements of In:M:Zn=$x_1$:$y_1$:$z_1$ is used for forming the second oxide semiconductor film 55_2, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film is easily formed as the second oxide semiconductor film 55_2. Typical examples of the atomic ratio of In to M and Zn of the target are 1:1:1, 1:1:1.2, 2:1:1.5, 2:1:2.3, and 3:1:2.

In the case where the first oxide semiconductor film 551 and the third oxide semiconductor film 55_3 are each an In-M-Zn oxide film (M is Ga, Y, Zr, La, Ce, or Nd) and a target having an atomic ratio of metal elements of In:M:Zn=$x_2$:$y_2$:$z_2$ is used for forming the first oxide semiconductor film 55_1 and the third oxide semiconductor film 55_3, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film is easily formed as the first oxide semiconductor film 55_1 and the third oxide semiconductor film 55_3. Typical examples of the atomic ratio of In to M and Zn in the target are 1:3:2, 1:3:4, 1:3:6, 1:3:8, 1:4:3, 1:4:4, 1:4:5, 1:4:6, 1:6:3, 1:6:4, 1:6:5, 1:6:6, 1:6:7, 1:6:8, and 1:6:9.

Note that the proportion of each metal element in the atomic ratio of each of the first oxide semiconductor film 551, the second oxide semiconductor film 552, and the third oxide semiconductor film 55_3 varies within a range of ±40% of any of the above atomic ratios as an error.

The atomic ratio is not limited to the above, and the atomic ratio may be appropriately set in accordance with required semiconductor characteristics.

Furthermore, the first oxide semiconductor film 55_1 and/or the third oxide semiconductor film 55_3 can be formed using gallium oxide. The use of gallium oxide for the first oxide semiconductor film 551 and the third oxide semiconductor film 553 can reduce leakage current of the transistor.

In FIG. 27D, the first oxide semiconductor film 551 and the third oxide semiconductor film 55_3 may have the same composition. For example, an In—Ga—Zn oxide having an atomic ratio of In:Ga:Zn=1:3:2, 1:3:4, or 1:4:5 may be used for the first oxide semiconductor film 551 and the third oxide semiconductor film 553.

Alternatively, in FIG. 27D, the first oxide semiconductor film 55_1 and the third oxide semiconductor film 55_3 may have different compositions. For example, an In—Ga—Zn oxide having an atomic ratio of In:Ga:Zn=1:3:2 may be used for the first oxide semiconductor oxide film 55_1, and an In—Ga—Zn oxide having an atomic ratio of In:Ga:Zn=1:3:4 or 1:4:5 may be used for the third oxide semiconductor film 553.

The thicknesses of the first oxide semiconductor film 551 and the third oxide semiconductor film 55_3 are each greater than or equal to 3 nm and less than or equal to 100 nm, preferably greater than or equal to 3 nm and less than or equal to 50 nm. The thickness of the second oxide semiconductor film 55_2 is greater than or equal to 3 nm and less than or equal to 200 nm, preferably greater than or equal to 3 nm and less than or equal to 100 nm, further preferably greater than or equal to 3 nm and less than or equal to 50 nm. Note that when the thickness of each of the first oxide semiconductor film 55_1 and the third oxide semiconductor film 553 is smaller than that of the second oxide semiconductor film 552, the amount of threshold voltage shift of the transistor can be reduced. In addition, to prevent oxygen contained in the third oxide semiconductor film 55_3 from diffusing to the pair of conductive films 68 and 69 and thus oxidizing the pair of conductive films 68 and 69, it is preferable that the thickness of the third oxide semiconductor film 553 be small.

The interface between the first oxide semiconductor film 551 and the second oxide semiconductor film 55_2 and the interface between the second oxide semiconductor film 55_2 and the third oxide semiconductor film 55_3 can be observed by scanning transmission electron microscopy (STEM).

Any of the crystal structures of the oxide semiconductor film 55 described in Embodiment 1 can be used as appropriate for the first oxide semiconductor film 55_1, the second oxide semiconductor film 55_2, and the third oxide semiconductor film 553.

By providing an oxide semiconductor film in which oxygen vacancies are less likely to be generated than in the second oxide semiconductor film 55_2 on and/or under the second oxide semiconductor film 552 so as to be in contact with the second oxide semiconductor film 55_2, oxygen vacancies in the second oxide semiconductor film 55_2 can be reduced. In addition, the second oxide semiconductor film 55_2 is in contact with the first oxide semiconductor film 55_1 and/or the third oxide semiconductor film 55_3 containing one or more metal elements contained in the second oxide semiconductor film 55_2; thus, the interface between the first oxide semiconductor film 55_1 and the second oxide semiconductor film 55_2 and the interface between the second oxide semiconductor film 552 and the third oxide semiconductor film 55_3 have extremely low interface state density. Thus, oxygen vacancies in the second oxide semiconductor film 552 can be reduced.

In the case where the second oxide semiconductor film 552 is in contact with an insulating film containing a different constituent element (e.g., a gate insulating film including a silicon oxide film), an interface state might be formed and the interface state might form a channel. At this time, a second transistor having a different threshold voltage appears, so that an apparent threshold voltage of the transistor is varied. However, since the first oxide semiconductor film 55_1 that contains one or more metal elements contained in the second oxide semiconductor film 552 is in contact with the second oxide semiconductor film 552, an interface state is not easily formed at the interface between the first oxide semiconductor film 551 and the second oxide semiconductor film 552. Thus, with the first oxide semiconductor film 55_1, variations in the electric characteristics of the transistor, such as threshold voltage, can be reduced.

In the case where a channel is formed at the interface between the insulating film 57 and the second oxide semiconductor film 55_2, interface scattering occurs at the interface and the field-effect mobility of the transistor is decreased. However, since the third oxide semiconductor film 55_3 that contains one or more metal elements contained in the second oxide semiconductor film 55_2 is in contact with the second oxide semiconductor film 552, carrier scattering does not easily occur at the interface between the second oxide semiconductor film 55_2 and the third oxide semiconductor film 55_3 and the field-effect mobility of the transistor can be increased.

The first oxide semiconductor film 55_1 and the third oxide semiconductor film 55_3 also serve as barrier films that prevent formation of an impurity state due to the entry of the constituent elements of the insulating film 53 and the insulating film 57 into the second oxide semiconductor film 552.

For example, in the case where the insulating film 53 and the insulating film 57 contain silicon, silicon contained in the insulating film 53 and the insulating film 57 or carbon that might be contained in the insulating film 53 and the insulating film 57 might enter the first oxide semiconductor film 55_1 and/or the third oxide semiconductor film 55_3 at a depth of several nanometers from the interfaces. When an impurity such as silicon or carbon enters the second oxide semiconductor film 55_2, an impurity state is formed. The impurity state serves as a donor and generates an electron, so that the second oxide semiconductor film 55_2 might become an n-type.

However, when the thicknesses of the first oxide semiconductor film 55_1 and the third oxide semiconductor film 55_3 are larger than several nanometers, the impurity such as silicon or carbon that has entered the first oxide semiconductor film 551 and the third oxide semiconductor film 553 does not reach the second oxide semiconductor film 552, so that the influence of impurity states is reduced.

Thus, the transistor described in this embodiment is a transistor in which variations in the electric characteristics such as threshold voltage are reduced.

<Band Structure>

Figure 28A:
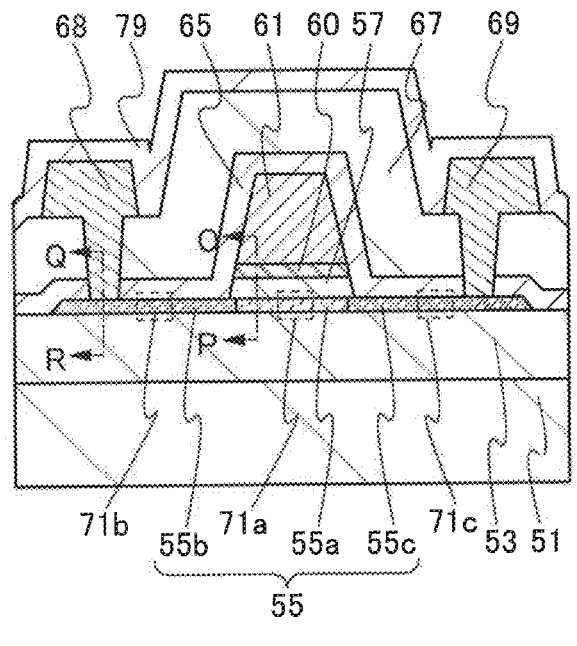
FIGS. 28A to 28F illustrate structures and band diagrams of a transistor of one embodiment of the present invention.
Figure 28B:
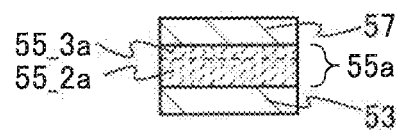
Figure 28C:
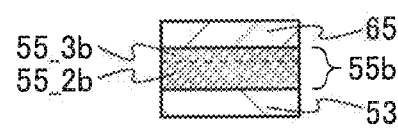
Figure 28D:
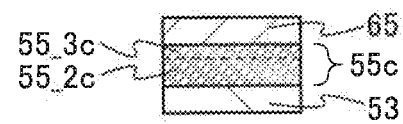

Next, band structures along given cross sections of the transistor illustrated in FIG. 28A, which is a typical example of the transistor described in this embodiment, is described. FIG. 28B, FIG. 28C, and FIG. 28D are enlarged views of a region 71a, a region 71b, and a region 71c, respectively, surrounded by dashed lines in FIG. 28A. The transistor illustrated in FIG. 28A includes the oxide semiconductor film 55 having the first region 55a and the second regions 55b and 55c. As illustrated in FIG. 28B, the first region 55a includes a first region 552a and a first region 55_3a between the insulating films 53 and 57. Furthermore, as illustrated in FIG. 28C, the second region 55b includes a second region 55_2b and a second region 55_3b between the insulating film 53 and the insulating film 65 containing hydrogen. In addition, as illustrated in FIG. 28D, the second region 55c includes a second region 55_2c and a second region 55_3c between the insulating film 53 and the insulating film 65 containing hydrogen.

Figure 28E:
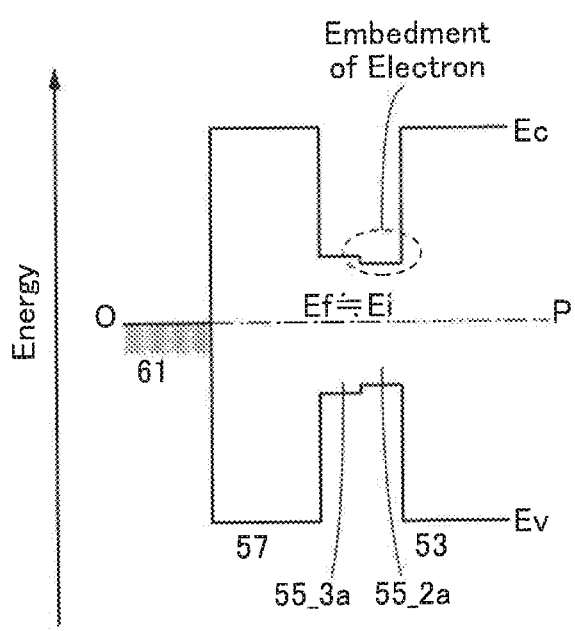

FIG. 28E is a band structure in the O-P cross section including a channel region of the transistor illustrated in FIG. 28A. The first region 55_3a is assumed to have a slightly larger energy gap than the first region 55_2a. The insulating film 53 and the insulating film 57 are each assumed to have a sufficiently larger energy gap than the first region 55_2a and the first region 55_3a. Furthermore, the Fermi levels (denoted by Ef) of the first region 552a, the first region 55_3a, the insulating film 53, and the insulating film 57 are assumed to be equal to the intrinsic Fermi levels thereof (denoted by Ei). The work function of the conductive film 61 is assumed to be equal to the Fermi levels. Note that the conduction band minimum is denoted by Ec, and the valence band maximum is denoted by Ev.

When a gate voltage is set to be higher than or equal to the threshold voltage of the transistor, an electron flows preferentially in the first region 55_2a owing to the energy difference between the conduction band minimums of the first region 55_2a and the first region 55_3a. That is, it is probable that an electron is embedded in the first region 552a.

Accordingly, in the transistor according to one embodiment of the present invention, the embodiment of an electron reduces the influence of interface scattering. Therefore, resistance in the channel region of the transistor according to one embodiment of the present invention is low.

Figure 28F:
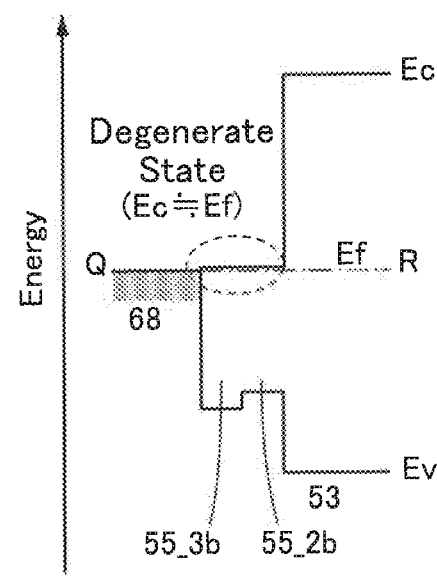

FIG. 28F shows a band structure in the Q-R cross section including a source region or a drain region of the transistor illustrated in FIG. 28A. Note that the second regions 552b and 552c and the second regions 55_3b and 55_3c are assumed to be in a degenerate state. The conduction band minimum of the second region 55_2b is assumed to be approximately at the same level as the Fermi level of the first region 55_2a. Furthermore, the conduction band minimum of the second region 55_3b is assumed to be approximately at the same level as the Fermi level of the first region 55_3a. The same applies to the second region 55_2c and the second region 55_3c.

At this time, an ohmic contact is made between the conductive film 68 and the second region 55_3b because an energy barrier therebetween is sufficiently low. An ohmic contact is also made between the second region 55_3b and the second region 552b. Similarly, an ohmic contact is made between the conductive film 69 and the second region 55_3c because an energy barrier therebetween is sufficiently low. An ohmic contact is also made between the second region 55_3c and the second region 552c. Therefore, electron transfer is conducted smoothly between the conductive films 68 and 69 and the first regions 55_2a and 55_3a.

As described above, the transistor of one embodiment of the present invention is a transistor in which resistance in the channel region is low, since electron transfer between the channel region and the source and drain electrodes is conducted smoothly. That is, the transistor has excellent switching characteristics.

The structures, the methods, and the like described in this embodiment can be combined as appropriate with any of the structures, the methods, and the like described in the other embodiments.

Embodiment 9

Figure 29A:
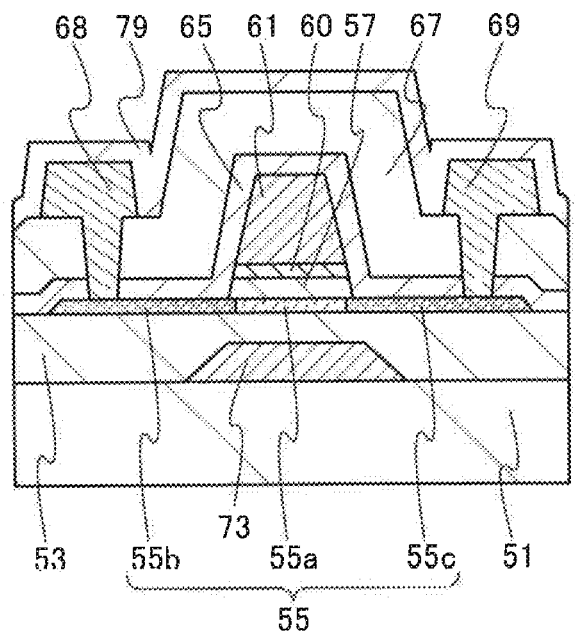
FIGS. 29A and 29B are cross-sectional views illustrating one embodiment of a semiconductor device.

In this embodiment, a structure of a transistor that can be used in the above-described Embodiments will be described with reference to FIGS. 29A and 29B. Note that although description is made here using the transistor described in Embodiment 1, this embodiment can be applied as appropriate to the transistor described in the above-described Embodiments. FIG. 29A is a cross-sectional view of the transistor in the channel length direction, and FIG. 29B is a cross-sectional view of the transistor in the channel width direction.

Figure 29B:
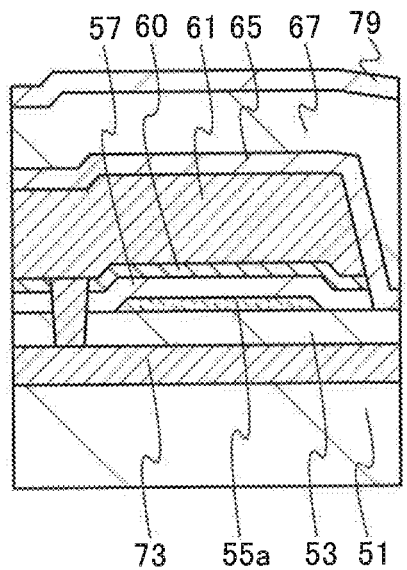

As illustrated in FIGS. 29A and 29B, a transistor described in this embodiment includes a gate electrode 73 that overlaps with the oxide semiconductor film 55 with the insulating film 53 provided therebetween.

By making the potential of the gate electrode 73 different from the potential of the conductive film 61, the threshold voltage of the transistor can be controlled and the transistor can be a normally-off transistor. Furthermore, by making the conductive film 61 and the gate electrode 73 connected to each other in an opening provided in the insulating films 53 and 57 as illustrated in FIG. 29B, the potential of the gate electrode 73 can be the same as the potential of the conductive film 61, whereby on-state current of the transistor can be increased.

Other components are the same as those of the transistor described in Embodiment 1; thus, detailed descriptions thereof are omitted here.

The structures, the methods, and the like described in this embodiment can be combined as appropriate with any of the structures, the methods, and the like described in the other embodiments.

Embodiment 10

In this embodiment, details of an oxide semiconductor that can be used in any of the above embodiments will be described below.
<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.
<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 30A:
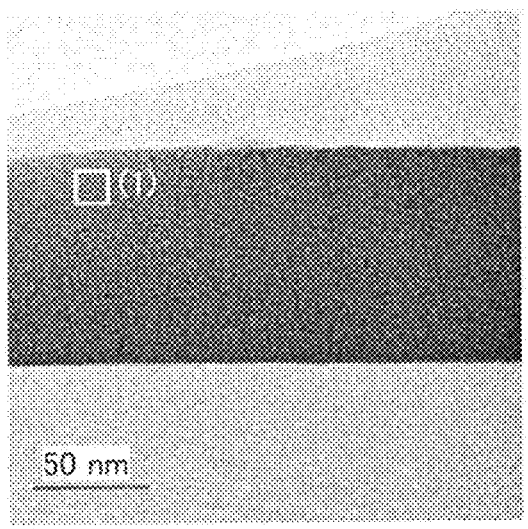
FIGS. 30A to 30D are Cs-corrected high-resolution TEM images of a cross section of a CAAC-OS and a cross-sectional schematic view of a CAAC-OS.

A CAAC-OS observed with TEM is described below. FIG. 30A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 30B:
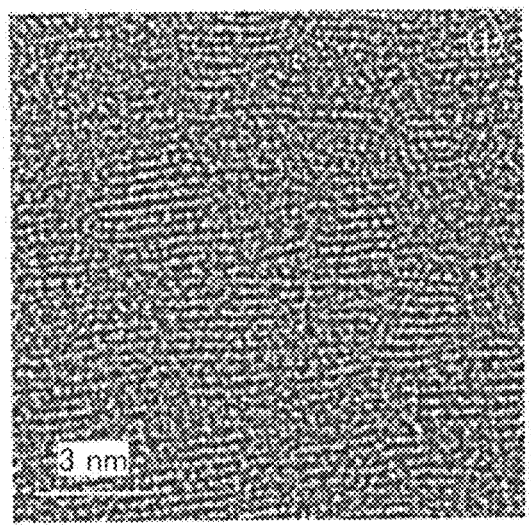

FIG. 30B is an enlarged Cs-corrected high-resolution TEM image of a region (1) in FIG. 30A. FIG. 30B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 30C:
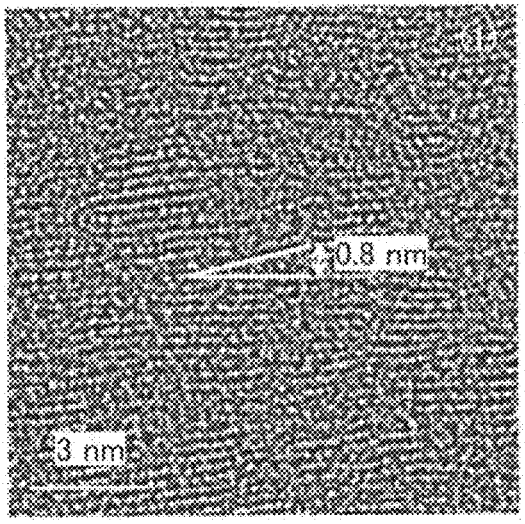

As shown in FIG. 30B, the CAAC-OS has a characteristic atomic arrangement. The characteristic atomic arrangement is denoted by an auxiliary line in FIG. 30C. FIGS. 30B and 30C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 30D:
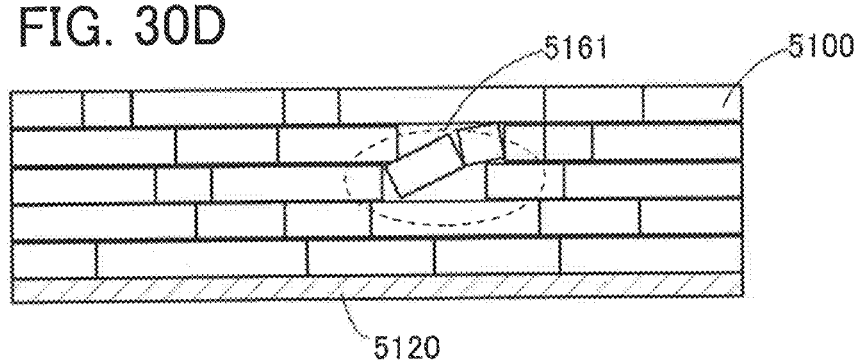

Here, according to the Cs-corrected high-resolution TEM images, the schematic arrangement of pellets 5100 of a CAAC-OS over a substrate 5120 is illustrated by such a structure in which bricks or blocks are stacked (see FIG. 30D). The part in which the pellets are tilted as observed in FIG. 30C corresponds to a region 5161 shown in FIG. 30D.

Figure 31A:
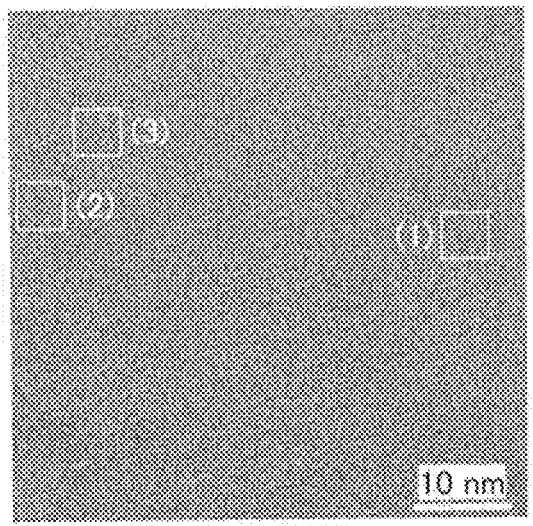
FIGS. 31A to 31D are Cs-corrected high-resolution TEM images of a plane of a CAAC-OS.
Figure 31B:
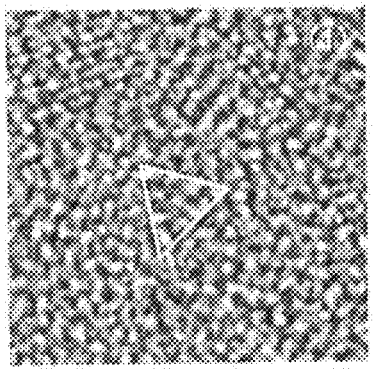
Figure 31C:
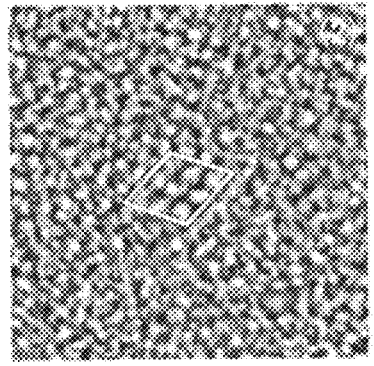
Figure 31D:
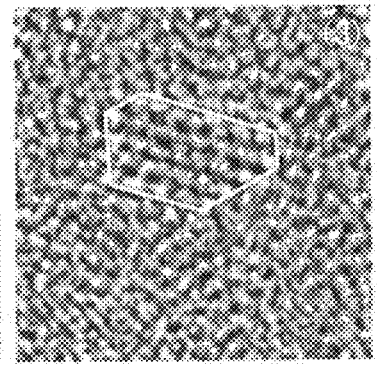

FIG. 31A shows a Cs-corrected high-resolution TEM image of a plane of the CAAC-OS observed from a direction substantially perpendicular to the sample surface. FIGS. 31B, 31C, and 31D are enlarged Cs-corrected high-resolution TEM images of regions (1), (2), and (3) in FIG. 31A, respectively. FIGS. 31B, 31C, and 31D indicate that metal atoms are arranged in a triangular, quadrangular, or hexagonal configuration in a pellet. However, there is no regularity of arrangement of metal atoms between different pellets.

Figure 32A:
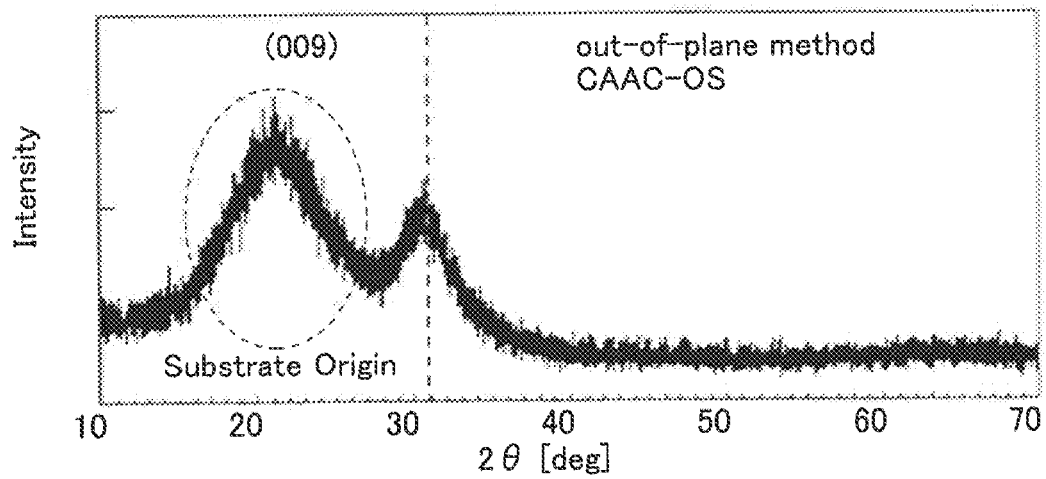
FIGS. 32A to 32C show the results of structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 32A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 32B:
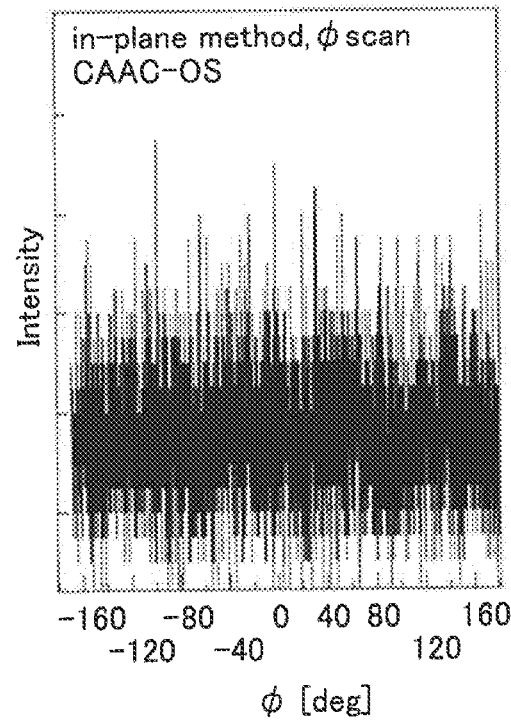
Figure 32C:
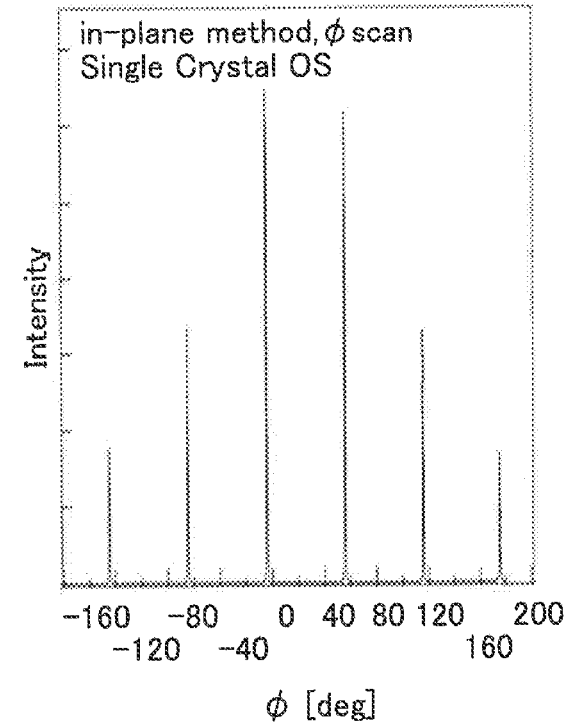

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 32B, a peak is not clearly observed. In contrast, in the case of a single crystal oxide semiconductor of InGaZnO$_4$, when φ scan is performed with 2θ fixed at around 56°, as shown in FIG. 32C, six peaks which are derived from crystal planes equivalent to the (110) plane are observed. Accordingly, the structural analysis using XRD shows that the directions of a-axes and b-axes are irregularly oriented in the CAAC-OS.

Figure 33A:
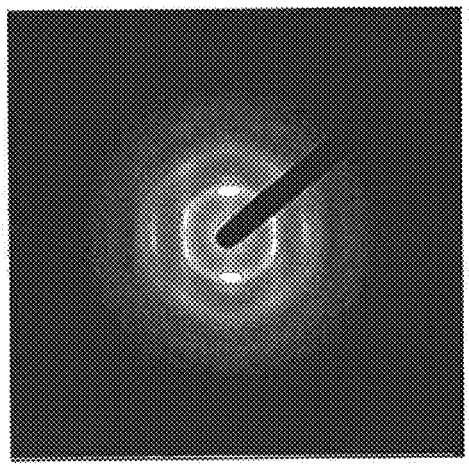
FIGS. 33A and 33B show electron diffraction patterns of a CAAC-OS.
Figure 33B:
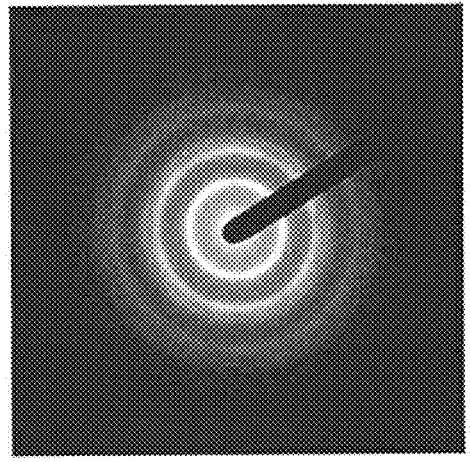

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 33A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 33B shows a diffraction pattern obtained in such a manner that an electron beam with a probe diameter of 300 nm is incident on the same sample in a direction perpendicular to the sample surface. As shown in FIG. 33B, a ring-like diffraction pattern is observed. Thus, the electron diffraction also indicates that the a-axes and b-axes of the pellets included in the CAAC-OS do not have regular alignment. The first ring in FIG. 33B is considered to be derived from the (010) plane, the (100) plane, and the like of the InGaZnO$_4$ crystal. The second ring in FIG. 33B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density. Specifically, an oxide semiconductor film with a carrier density of lower than $8\times10^{11}/cm^3$, preferably lower than $1\times10^{11}/cm^3$, further preferably lower than $1\times10^{10}/cm^3$, and is higher than or equal to $1\times10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 34:
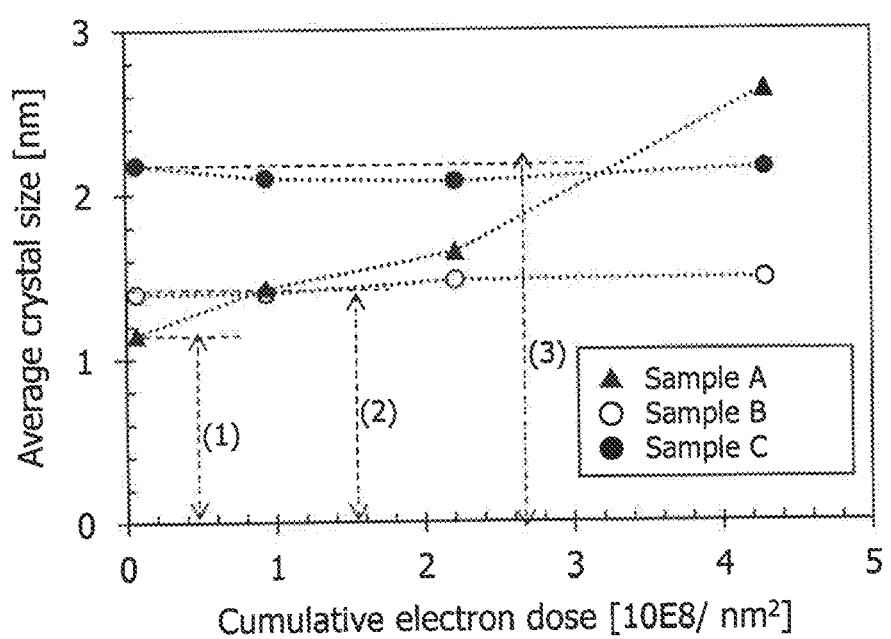
FIG. 34 shows a change in crystal part of an In—Ga—Zn oxide induced by electron irradiation.

FIG. 34 shows change in the average size of crystal parts (at 22 points to 45 points) in each sample. Note that the crystal part size corresponds to the length of a lattice fringe. FIG. 34 indicates that the crystal part size in the a-like OS increases with an increase in the cumulative electron dose. Specifically, as shown by (1) in FIG. 34, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 34, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

The structures, methods, and the like described in this embodiment can be used as appropriate in combination with any of the structures, methods, and the like described in the other embodiments.

Embodiment 11

In this embodiment, a structure of an input/output device of one embodiment of the present invention will be described with reference to FIGS. 35A to 35C and FIGS. 36A to 36C. Note that an input/output device can also be referred to as a touch panel.

Figure 35A:
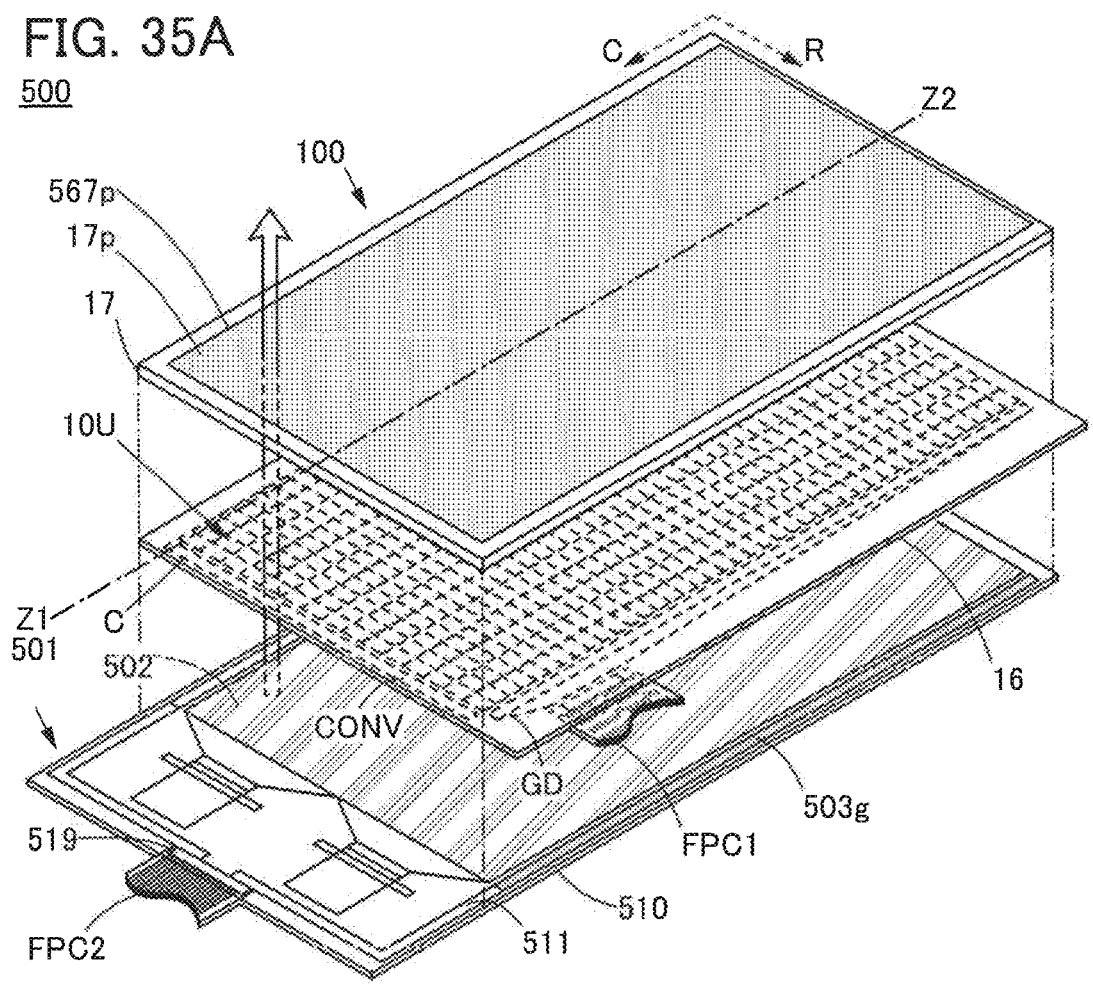
FIGS. 35A to 35C are projection views illustrating a structure of an input/output device of one embodiment.
Figure 35B:
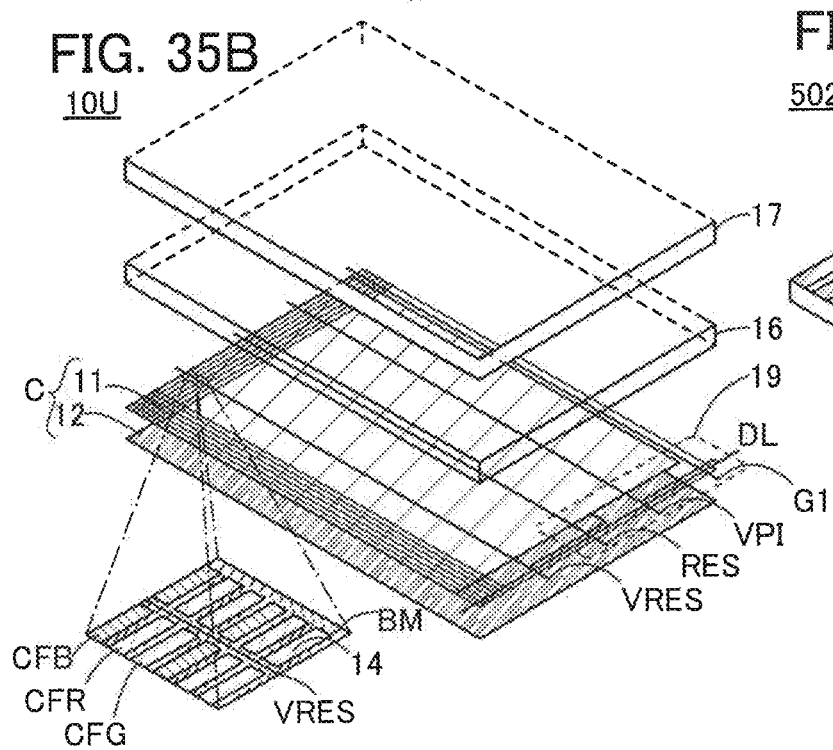

FIGS. 35A and 35B are projection drawings illustrating a structure of an input/output device of one embodiment of the present invention.

FIG. 35A is a projection drawing of an input/output device 500 of one embodiment of the present invention, and FIG. 35B is a projection drawing illustrating a structure of a sensor unit 10U included in the input/output device 500.

Figure 36A:
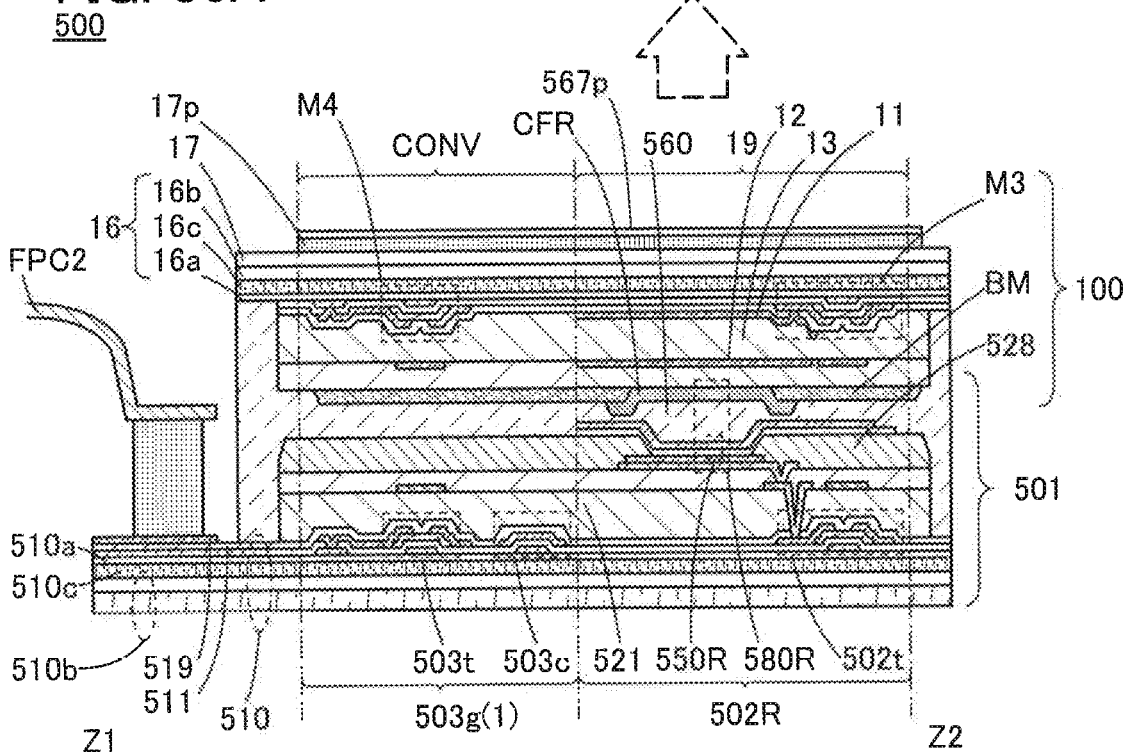
FIGS. 36A to 36C are cross-sectional views each illustrating a structure of an input/output device of one embodiment.
Figure 36B:
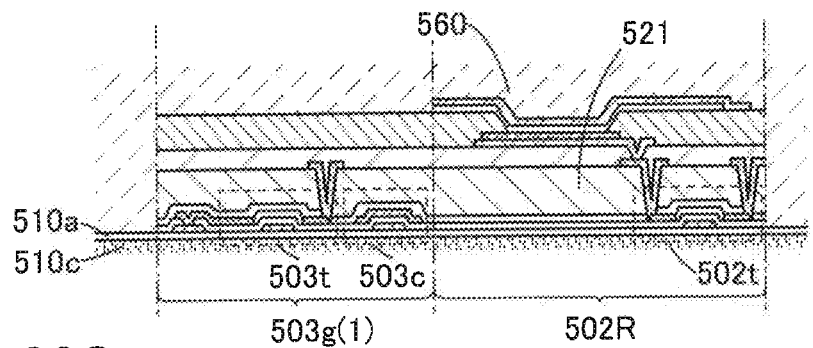
Figure 36C:
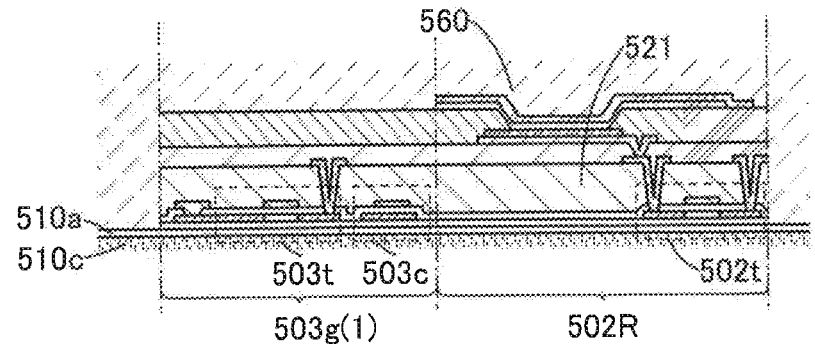

FIGS. 36A to 36C are cross-sectional views illustrating a structure of the input/output device 500 of one embodiment of the present invention.

FIG. 36A is a cross-sectional view taken along line Z1-Z2 of the input/output device 500 of one embodiment of the present invention in FIG. 35A.

<Structure Example of Input/Output Device>

The input/output device 500 described in this embodiment includes a flexible input device 100 and a display portion 501. The flexible input device 100 includes a plurality of sensor units 10U arranged in matrix and each provided with window portions 14 transmitting visible light, a scan line G1 electrically connected to a plurality of sensor units 10U placed in the row direction (indicated by arrow R in the drawing), a signal line DL electrically connected to a plurality of sensor units 10U placed in the column direction (indicated by arrow C in the drawing), and a flexible base material 16 supporting the sensor unit 10U, the scan line G1, and the signal line DL. The display portion 501 includes a plurality of pixels 502 overlapping with the window portions 14 and arranged in matrix and a flexible second base material 510 supporting the pixels 502 (see FIGS. 35A to 35C).

The sensor unit 10U includes a sensor element C overlapping with the window portion 14 and a sensor circuit 19 electrically connected to the sensor element C (see FIG. 35B).

The sensor element C includes an insulating layer 13, and a first electrode 11 and a second electrode 12 between which the insulating layer 13 is sandwiched (see FIG. 36A).

A selection signal is supplied to the sensor circuit 19, and the sensor circuit 19 supplies a sensor signal DATA based on the change in capacitance of the sensor element C.

The scan line G1 can supply the selection signal, the signal line DL can supply the sensor signal DATA, and the sensor circuit 19 is placed to overlap with gaps between the plurality of window portions 14.

In addition, the input/output device 500 described in this embodiment includes a coloring film between the sensor unit 10U and the pixel 502 overlapping with the window portion 14 of the sensor unit 10U.

The input/output device 500 described in this embodiment includes the flexible input device 100 including the plurality of sensor units 10U, each of which is provided with the window portions 14 transmitting visible light, and the flexible display portion 501 including the plurality of pixels 502 overlapping with the window portions 14. The coloring film is included between the window portion 14 and the pixel 502.

With such a structure, the input/output device can supply a sensor signal based on the change in the capacitance and positional information of the sensor unit supplying the sensor signal, can display image data relating to the positional information of the sensor unit, and can be bent. As a result, a novel input/output device with high convenience or high reliability can be provided.

The input/output device 500 may include a flexible substrate FPC 1 to which a signal from the input device 100 is supplied and/or a flexible substrate FPC 2 supplying a signal including image data to the display portion 501.

In addition, a protective film 17$p$ protecting the input/output device 500 by preventing damage and/or an anti-reflective film 567$p$ that weakens the intensity of external light reflected by the input/output device 500 may be included.

Moreover, the input/output device 500 includes a scan line driver circuit 503$g$ which supplies the selection signal to a scan line of the display portion 501, a wiring 511 supplying a signal, and a terminal 519 electrically connected to the flexible substrate FPC 2.

Components of the input/output device 500 are described below. Note that these components cannot be clearly distinguished and one component also serves as another component or include part of another component in some cases.

For example, the input device 100 including the coloring film overlapping with the plurality of window portions 14 also serves as a color filter.

Furthermore, for example, the input/output device 500 in which the input device 100 overlaps with the display portion 501 serves as the input device 100 as well as the display portion 501.

<Whole Structure>

The input/output device 500 includes the input device 100 and the display portion 501 (see FIG. 35A).

<Input Device 100>

The input device 100 includes the plurality of sensor units 10U and the flexible base material 16 supporting the sensor units. For example, the plurality of sensor units 10U is arranged in matrix with 40 rows and 15 columns on the flexible base material 16.

<Window Portion 14, Coloring Film, and Light-Blocking Film BM>

The window portion 14 transmits visible light.

A coloring film transmitting light of a predetermined color is provided to overlap with the window portion 14. For example, a coloring film CFB transmitting blue light, a coloring film CFG transmitting green light, or a coloring film CFR transmitting red light, is included (see FIG. 35B).

Note that, in addition to the coloring films transmitting blue light, green light, and/or red light, coloring films transmitting light of various colors such as a coloring film transmitting white light and a coloring film transmitting yellow light can be included.

For a coloring film, a metal material, a pigment, dye, or the like can be used.

A light-blocking film BM is provided to surround the window portions 14. The light-blocking film BM does not easily transmit light as compared to the window portion 14.

For the light-blocking film BM, carbon black, a metal oxide, a composite oxide containing a solid solution of a plurality of metal oxides, or the like can be used.

The scan line G1, the signal line DL, a wiring VPI, a wiring RES, a wiring VRES, and the sensor circuit 19 are provided to overlap with the light-blocking film BM.

Note that a light-transmitting overcoat layer covering the coloring film and the light-blocking film BM can be provided.

<Sensor Element C>

The sensor element C includes the first electrode 11, the second electrode 12, and the insulating layer 13 between the first electrode 11 and the second electrode 12 (see FIG. 36A).

The first electrode 11 is formed apart from other regions, for example, is formed into an island shape. A layer that can be formed in the same process as that of the first electrode 11 is preferably placed close to the first electrode 11 so that the user of the input/output device 500 does not recognize the first electrode 11. Further preferably, the number of the window portions 14 placed in the gap between the first electrode 11 and the layer placed close to the first electrode 11 is reduced as much as possible. In particular, the window portion 14 is preferably not placed in the gap.

The second electrode 12 is provided to overlap with the first electrode 11, and the insulating layer 13 is provided between the first electrode 11 and the second electrode 12.

When an object whose dielectric constant is different from that of the air gets closer to the first electrode 11 or the second electrode 12 of the sensor element C that is put in the air, the capacitance of the sensor element C is changed. Specifically, when a finger or the like gets closer to the sensor element C, the capacitance of the sensor element C is changed. Thus, the sensor element C can be used in a proximity sensor.

The capacitance of the sensor element C that can be changed in shape, for example, is changed depending on the change in shape.

Specifically, when a finger or the like is in contact with the sensor element C, and the gap between the first electrode 11 and the second electrode 12 becomes small, the capacitance of the sensor element C is increased. Accordingly, the sensor element C can be used in a tactile sensor.

Specifically, when the sensor element C is bent, the gap between the first electrode 11 and the second electrode 12 becomes small, whereby the capacitance of the sensor element C is increased. Accordingly, the sensor element C can be used in a bend sensor.

The first electrode 11 and the second electrode 12 include a conductive material.

For example, an inorganic conductive material, an organic conductive material, a metal material, a conductive ceramic material, or the like can be used for the first electrode 11 and the second electrode 12.

Specifically, a metal element selected from aluminum, chromium, copper, tantalum, titanium, molybdenum, tungsten, nickel, silver, and manganese; an alloy including any of the above-described metal elements; an alloy including any of the above-described metal elements in combination; or the like can be used. It is preferable that the first electrode 11 and the second electrode 12 have a thickness that allows light to pass through.

Alternatively, a conductive oxide such as indium oxide, indium tin oxide, indium zinc oxide, zinc oxide, or zinc oxide to which gallium is added can be used.

Alternatively, graphene or graphite can be used. The film including graphene can be formed, for example, by reducing a film containing graphene oxide. As a reducing method, a method with application of heat, a method using a reducing agent, or the like can be employed.

Alternatively, a conductive polymer can be used.

<Sensor Circuit 19>

The sensor circuit 19 includes transistors M1 to M3, for example In addition, the sensor circuit 19 includes wirings supplying a power supply potential and a signal. For example, the signal line DL, the wiring VPI, a wiring CS, the scan line G1, the wiring RES, and the wiring VRES are included. Note that the specific structure example of the sensor circuit 19 will be described in detail in Embodiment 12.

Note that the sensor circuit 19 may be placed not to overlap with the window portion 14. For example, a wiring is placed not to overlap with the window portion 14, whereby one side of the input device 100 can be visually recognized easily from the other side of the input device 100.

Transistors that can be formed in the same process can be used as the transistors M1 to M3, for example.

The transistor M1 includes a semiconductor film. For example, for the semiconductor film, an element belonging to group 4, a compound semiconductor, or an oxide semiconductor can be used. Specifically, a semiconductor containing silicon, a semiconductor containing gallium arsenide, an oxide semiconductor containing indium, or the like can be used. Any of the transistors described in the above embodiments can be used as the transistor M1 as appropriate.

For the wiring, a conductive material can be used.

For example, an inorganic conductive material, an organic conductive material, a metal material, a conductive ceramic material, or the like can be used for the wiring. Specifically, a material which is the same as those of the first electrode 11 and the second electrode 12 can be used.

For the scan line G1, the signal line DL, the wiring VPI, the wiring RES, and the wiring VRES, a metal material such as aluminum, gold, platinum, silver, nickel, titanium, tungsten, chromium, molybdenum, iron, cobalt, copper, or palladium, or an alloy material containing any of these metal materials can be used.

The sensor circuit 19 may be formed on the base material 16 by processing a film formed over the base material 16.

Alternatively, the sensor circuit 19 formed on another base material may be transferred to the base material 16.

<Base Material 16>

For the flexible base material 16, an organic material, an inorganic material, or a composite material of an organic material and an inorganic material can be used.

For the base material 16, a material with a thickness of 5 μm or more and 2500 μm or less, preferably 5 μm or more and 680 μm or less, further preferably 5 μm or more and 170 μm or less, further preferably 5 μm or more and 45 μm or less, further preferably 8 μm or more and 25 μm or less can be used.

Furthermore, a material with which passage of impurities is inhibited can be preferably used for the base material 16. For example, materials with a vapor permeability of lower than or equal to $10^{-5}$ g/(m$^2$·day), preferably lower than or equal to $10^{-6}$ g/(m$^2$·day) can be favorably used.

The base material 16 can be favorably formed using a material whose coefficient of linear expansion is substantially equal to that of the base material 510. For example, the coefficient of linear expansion of the materials are preferably lower than or equal to $1\times10^{-3}$/K, further preferably lower than or equal to $5\times10^{'}$/K, and still further preferably lower than or equal to $1\times10^{-5}$/K.

Examples of the material of the base material 16 are organic materials such as a resin, a resin film, and a plastic film.

Another examples of the material of the base material 16 are inorganic materials such as a metal plate and a thin glass plate with a thickness of more than or equal to 10 μm and less than or equal to 50 μm.

Another example of the material of the base material 16 is a composite material such as a resin film to which a metal plate, a thin glass plate, or a film of an inorganic material is attached with the use of a resin film.

Another example of the material of the base material 16 is a composite material such as a resin or a resin film into which a fibrous or particulate metal, glass, or inorganic material is dispersed.

The resin film can be formed using a thermosetting resin or an ultraviolet curable resin.

Specifically, a resin film or resin plate of polyester, polyolefin, polyamide, polyimide, polycarbonate, an acrylic resin, or the like can be used.

Specifically, non-alkali glass, soda-lime glass, potash glass, crystal glass, or the like can be used.

Specifically, a metal oxide film, a metal nitride film, a metal oxynitride film, or the like can be used. For example, silicon oxide, silicon nitride, silicon oxynitride, an alumina film, or the like can be used.

Specifically, stainless steel, aluminum, or the like in which an opening is provided can be used.

Specifically, an acrylic resin, a urethane resin, an epoxy resin, or a resin having a siloxane bond can be used.

For example, a stack in which a flexible base material 16b, a barrier film 16a that prevents diffusion of impurities, and a resin film 16c attaching the barrier film 16a to the base material 16b are stacked can be preferably used for the base material 16 (see FIG. 36A).

Specifically, a film containing a stacked-layer material of a 600-nm-thick silicon oxynitride film and a 200-nm-thick silicon nitride film can be used as the barrier film 16a.

Alternatively, a film including a stacked-layer material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order can be used as the barrier film 16a.

A resin film or resin plate of polyester, polyolefin, polyamide, polyimide, polycarbonate, an acrylic resin, or the like, a stack of two or more of the above materials, or the like can be used as the base material 16b.

For example, materials that contain polyester, polyolefin, polyamide (e.g., nylon or aramid), polyimide, polycarbonate, or a resin having an acrylic bond, a urethane bond, an epoxy bond, or a siloxane bond can be used for the resin film 16c.

<Protective Base Material 17, Protective Film 17p>

A flexible protective base material 17 and/or the protective film 17p can be provided. The flexible protective base material 17 or the protective film 17p protects the input device 100 by preventing damage.

For example, a resin film or resin plate of polyester, polyolefin, polyamide, polyimide, polycarbonate, an acrylic resin, or the like, a stack of two or more of the above materials, or the like can be used as the protective base material 17.

For example, a hard coat layer or a ceramic coat layer can be used as the protective film 17p. Specifically, a layer containing an ultraviolet curable resin or aluminum oxide may be formed to overlap with the second electrode 12.

<Display Portion 501>

Figure 35C:
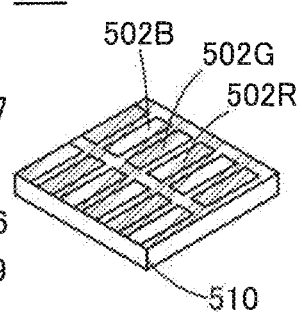

The display portion 501 includes the plurality of pixels 502 arranged in matrix (see FIG. 35C).

For example, the pixel 502 includes a sub-pixel 502B, a sub-pixel 502G, and a sub-pixel 502R, and each sub-pixel includes a display element and a pixel circuit for driving the display element.

In the pixel 502, the sub-pixel 502B is placed to overlap with the coloring film CFB, the sub-pixel 502G is placed to overlap with the coloring film CFG, and the sub-pixel 502R is placed to overlap with the coloring film CFR.

In this embodiment, an example of using an organic electroluminescent element that emits white light as a display element will be described; however, the display element is not limited to such element.

For example, organic electroluminescent elements that emit light of different colors may be included in different sub-pixels so that the light of different colors can be emitted from different sub-pixels.

Other than organic electroluminescent elements, any of various display elements such as display elements (electronic ink) that perform display by an electrophoretic method, an electronic liquid powder (registered trademark) method, an electrowetting method, or the like; MEMS shutter display elements; optical interference type MEMS display elements; and liquid crystal elements can be used.

Furthermore, this embodiment can be used in a transmissive liquid crystal display, a transflective liquid crystal display, a reflective liquid crystal display, a direct-view liquid crystal display, or the like. In the case of a transflective liquid crystal display or a reflective liquid crystal display, some of or all of pixel electrodes have functions of reflective electrodes. For example, some or all of pixel electrodes are formed to contain aluminum, silver, or the like. In such a case, a memory circuit such as an SRAM can be provided under the reflective electrodes, leading to lower power consumption. A structure suitable for employed display elements can be selected from among a variety of structures of pixel circuits.

In the display portion, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, a metal insulator metal (MIM), a thin film diode (TFD), or the like can also be used. Since such an element requires the smaller number of manufacturing steps, manufacturing cost can be reduced or yield can be improved. Alternatively, since the size of the element is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or the yield can be improved. Furthermore, since an active element (a non-linear element) is not used, the aperture ratio can be improved, so that power consumption can be reduced or higher luminance can be achieved, for example <Base Material 510>

For the base material 510, a flexible material can be used. For example, the material that can be used for the base material 16 can be used for the base material 510.

For example, a stack in which a flexible base material 510b, a barrier film 510a that prevents diffusion of impurities, and a resin film 510c attaching the barrier film 510a to the flexible base material 510b are stacked can be preferably used for the base material 510 (see FIG. 36A).

<Sealant 560>

A sealant 560 bonds the base material 16 to the base material 510. The sealant 560 has a refractive index higher than that of the air. In the case where light is extracted to the sealant 560 side, the sealant 560 can reduce the refractive index difference between the sealant 560 and a layer in contact with the sealant 560.

The pixel circuits and the light-emitting elements (e.g., a light-emitting element 550R) are provided between the base material 510 and the base material 16.

<Configuration of Pixel>

The sub-pixel 502R includes a light-emitting module 580R.

The sub-pixel 502R includes the light-emitting element 550R and the pixel circuit that can supply electric power to the light-emitting element 550R and includes a transistor 502t. Furthermore, the light-emitting module 580R includes the light-emitting element 550R and an optical element (e.g., a coloring film CFR).

The light-emitting element 550R includes a lower electrode, an upper electrode, and a layer containing a light-emitting organic compound between the lower electrode and the upper electrode.

The light-emitting module 580R includes the coloring film CFR on the light extraction side. The coloring film transmits light of a particular wavelength and is, for example, a layer that selectively transmits light of red, green, or blue color. Other sub-pixels may be placed to overlap with the window portion in which the coloring film is not provided, whereby light from the light-emitting element will be emitted not through the coloring film.

In the case where the sealant 560 is provided on the light extraction side, the sealant 560 is in contact with the light-emitting element 550R and the coloring film CFR.

The coloring film CFR is positioned in a region overlapping with the light-emitting element 550R. Accordingly, part of light emitted from the light-emitting element 550R passes through the coloring film CFR and is emitted to the outside of the light-emitting module 580R as indicated by an arrow in FIG. 36A.

The light-blocking layer BM is provided to surround the coloring film (e.g., the coloring film CFR).

<Configuration of Pixel Circuit>

An insulating film 521 covering the transistor 502t included in the pixel circuit is provided. The insulating film 521 can be used as a film for planarizing unevenness caused by the pixel circuits. A stacked film including a layer that can prevent diffusion of impurities can be used as the insulating film 521. This can prevent the reliability of the transistor 502t or the like from being lowered by diffusion of impurities.

The lower electrode is placed over the insulating film 521, and a partition wall 528 is provided over the insulating film 521 to cover an end portion of the lower electrode.

A layer containing a light-emitting organic compound is sandwiched between the lower electrode and the upper electrode, whereby a light-emitting element (e.g., the light-emitting element 550R) is formed. The pixel circuit supplies power to the light-emitting element.

Over the partition wall 528, a spacer that controls the gap between the base material 16 and the base material 510 is provided.

<Configuration of Scan Line Driver Circuit>

A scan line driver circuit 503g(1) includes a transistor 503t and a capacitor 503c. Note that transistors that can be formed in the same process and over the same substrate as those of the pixel circuit can be used in the driver circuit.

<Converter CONV>

Various circuits that can convert the sensor signal DATA supplied from the sensor unit 10U and supply the converted signal to the flexible substrate FPC 1 can be used as a converter CONV (see FIG. 35A and FIG. 36A).

For example, a transistor M4 shown can be used for the converter CONV.

<Other Structure>

The display portion 501 is provided with an anti-reflective film 567p positioned in a region overlapping with pixels. As the anti-reflective film 567p, for example, a circular polarizing plate can be used.

The display portion 501 includes the wirings 511 through which signals can be supplied. The wirings 511 are provided with the terminal 519. Note that the flexible substrate FPC 2 through which a signal such as an image signal or a synchronization signal is supplied is electrically connected to the terminal 519.

Note that a printed wiring board (PWB) may be attached to the flexible substrate FPC 2.

The display portion 501 includes wirings such as scan lines, signal lines, and power supply lines. Any of various conductive films can be used as the wirings.

Specifically, a metal element selected from aluminum, chromium, copper, tantalum, titanium, molybdenum, tungsten, nickel, yttrium, zirconium, silver, and manganese; an alloy including any of the above-described metal elements; an alloy including any of the above-described metal elements in combination; or the like can be used. In particular, one or more elements selected from aluminum, chromium, copper, tantalum, titanium, molybdenum, and tungsten are preferably included. In particular, an alloy of copper and manganese is suitably used in microfabrication with the use of a wet etching method.

Alternatively, a stacked structure in which an alloy film or a nitride film which contains one or more elements selected from titanium, tantalum, tungsten, molybdenum, chromium, neodymium, and scandium is stacked over an aluminum film can be used.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Alternatively, a light-transmitting conductive material including indium oxide, tin oxide, or zinc oxide may be used.

<Modification Example of Display Portion>

Any of various kinds of transistors can be used in the display portion 501.

FIGS. 36A and 36B illustrate a structure of the case where bottom-gate transistors are used in the display portion 501.

For example, a semiconductor film containing an oxide semiconductor, amorphous silicon, or the like can be used in the transistor 502t and the transistor 503t illustrated in FIG. 36A.

A structure in the case of using top-gate transistors in the display portion 501 is illustrated in FIG. 36C.

For example, a semiconductor film including a polycrystalline silicon film, a single crystal silicon film that is transferred from a single crystal silicon substrate, or the like can be used in the transistor 502t and the transistor 503t illustrated in FIG. 36C. Alternatively, any of the transistors described in the above embodiments can be used as the transistor 502t and the transistor 503t.

This embodiment can be combined with any of the other embodiments in this specification as appropriate.

Embodiment 12

In this embodiment, a configuration and a driving method of the sensor circuit that can be used in the sensor unit of the input/output device of one embodiment of the present invention will be described with reference to FIGS. 37A, 37B1, and 37B2.

FIGS. 37A, 37B1, and 37B2 illustrate a configuration and a driving method of the sensor circuit 19 and the converter CONV of one embodiment of the present invention.

FIG. 37A is a circuit diagram illustrating configurations of the sensor circuit 19 and the converter CONV of one embodiment of the present invention, and FIGS. 37B1 and 37B2 are timing charts illustrating driving methods.

The sensor circuit 19 of one embodiment of the present invention includes the first transistor M1 whose gate is electrically connected to the first electrode 11 of the sensor element C and whose first electrode is electrically connected to the wiring VPI that can supply, for example, a ground potential (see FIG. 37A).

Furthermore, the second transistor M2 whose gate is electrically connected to the scan line G1 that can supply a selection signal, whose first electrode is electrically connected to a second electrode of the first transistor M1, and whose second electrode is electrically connected to the signal line DL that can supply, for example, the sensor signal DATA may be included.

Furthermore, the third transistor M3 whose gate is electrically connected to the wiring RES that can supply a reset signal, whose first electrode is electrically connected to the first electrode 11 of the sensor element C, and whose second electrode is electrically connected to the wiring VRES that can supply, for example, a ground potential may be included.

The capacitance of the sensor element C is changed when an object gets closer to the first electrode 11 or the second electrode 12 or when a gap between the first electrode 11 and the second electrode 12 is changed, for example. Thus, the sensor circuit 19 can supply the sensor signal DATA based on the change in the capacitance of the sensor element C.

Note that a node at which the first electrode 11 of the sensor element C, the gate of the first transistor M1, and the first electrode of the third transistor are electrically connected to each other is referred to as a node A.

The wiring VRES and the wiring VPI each can supply a ground potential, for example, and the wiring VPO and the wiring BR each can supply a high power supply potential, for example.

Furthermore, the wiring RES can supply a reset signal, the scan line G1 can supply a selection signal, and the wiring CS can supply a control signal for controlling the potential of the second electrode 12 of the sensor element.

Furthermore, the signal line DL can supply the sensor signal DATA, and a terminal OUT can supply a signal converted based on the sensor signal DATA.

Any of various circuits that can convert the sensor signal DATA and supply the converted signal to the terminal OUT can be used as the converter CONV. For example, a source follower circuit, a current mirror circuit, or the like may be formed by the electrical connection between the converter CONV and the sensor circuit 19.

Specifically, by using the converter CONV including the transistor M4, a source follower circuit can be formed (see FIG. 37A). Note that a transistor that can be formed in the same process as those of the first transistor M1 to the third transistor M3 may be used as the transistor M4.

The transistors M1 to M3 each include a semiconductor film. For example, for the semiconductor film, an element belonging to group 4, a compound semiconductor, or an oxide semiconductor can be used. Specifically, a semiconductor containing silicon, a semiconductor containing gallium arsenide, an oxide semiconductor containing indium, or the like can be used. In addition, any of the transistors described in the above embodiments can be used as the transistors M1 to M3.

<Driving Method of Sensor Circuit 19>

A driving method of the sensor circuit 19 will be described.

<First Step>

In a first step, a reset signal that turns on and then turns off the third transistor is supplied to the gate, and the potential of the first electrode of the sensor element C is set to a predetermined potential (see a period T1 in FIG. 37B1).

Specifically, the reset signal is supplied from the wiring RES. The third transistor to which the reset signal is supplied sets the potential of the node A to a ground potential, for example (see FIG. 37A).

<Second Step>

In a second step, a selection signal that turns on the second transistor M2 is supplied to the gate of the second transistor M2, and the second electrode of the first transistor is electrically connected to the signal line DL.

Specifically, the selection signal is supplied from the scan line G1. Through the second transistor M2 to which the selection signal is supplied, the second electrode of the first transistor is electrically connected to the signal line DL (see a period T2 in FIG. 37B1).

<Third Step>

In a third step, a control signal is supplied to the second electrode of the sensor element, and a potential changed based on the control signal and the capacitance of the sensor element C is supplied to the gate of the first transistor M1.

Specifically, a rectangular control signal is supplied from the wiring CS. The sensor element C in which the rectangular control signal is supplied to the second electrode 12 increases the potential of the node A based on the capacitance of the sensor element C (see the latter half in the period T2 in FIG. 37B1).

For example, in the case where the sensor element is put in the air, when an object whose dielectric constant is higher than that of the air is placed closer to the second electrode 12 of the sensor element C, the capacitance of the sensor element C is apparently increased.

Thus, the change in the potential of the node A caused by the rectangular control signal becomes smaller than that in the case where an object whose dielectric constant is higher than that of the air is not placed close to the second electrode 12 of the sensor element C (see a solid line in FIG. 37B2).
<Fourth Step>

In a fourth step, a signal obtained by the change in the potential of the gate of the first transistor M1 is supplied to the signal line DL.

For example, a change in current due to the change in the potential of the gate of the first transistor M1 is supplied to the signal line DL.

The converter CONV converts the change in the current flowing through the signal line DL into a change in voltage and supplies the voltage.
<Fifth Step>

In a fifth step, a selection signal for turning off the second transistor is supplied to the gate of the second transistor.

This embodiment can be combined with any of the other embodiments in this specification as appropriate.

Embodiment 13

In this embodiment, electronic devices that can be formed using a semiconductor device of one embodiment of the present invention will be described with reference to FIGS. 38A to 38G.

FIGS. 38A to 38D show electronic devices. These electronic devices can include a housing 600, a display portion 601, a speaker 603, an LED lamp 604, operation keys 605 (including a power switch or an operation switch), a connection terminal 606, a sensor 607 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 608, and the like.

Figure 38A:
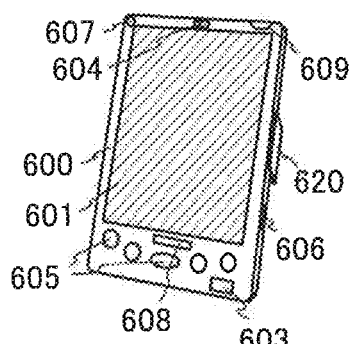
FIGS. 38A to 38G each illustrate an electronic device.
Figure 38B:
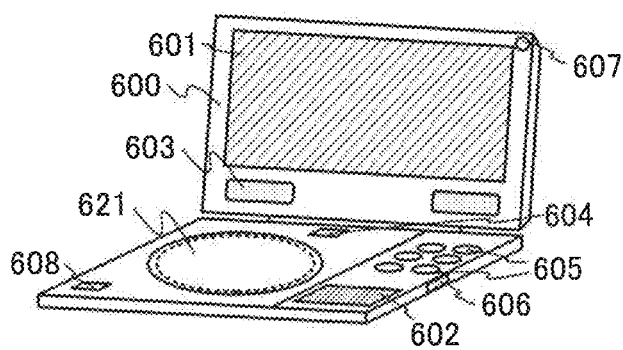
Figure 38C:
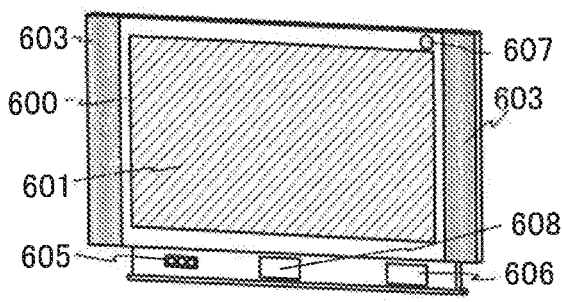
Figure 38D:
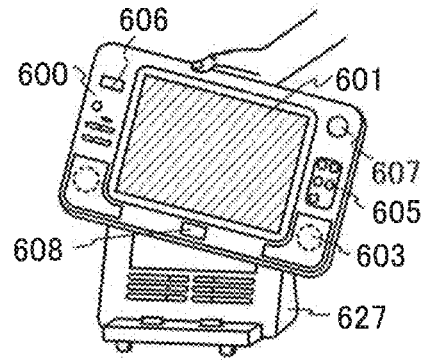

FIG. 38A shows a mobile computer that can include a switch 609, an infrared port 620, and the like in addition to the above components. FIG. 38B shows a portable image reproducing device (e.g., a DVD player) that is provided with a memory medium and can include a second display portion 602, a memory medium reading portion 621, and the like in addition to the above components. FIG. 38C shows a television receiver, which can include a tuner, an image processing portion, and the like in addition to the above components. FIG. 38D shows a portable television receiver that can include a charger 627 capable of transmitting and receiving signals, and the like in addition to the above components.

Figure 38E:
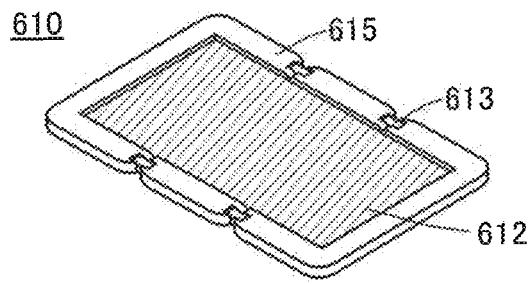
Figure 38F:
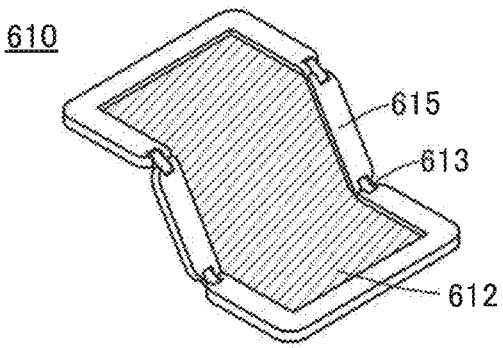
Figure 38G:
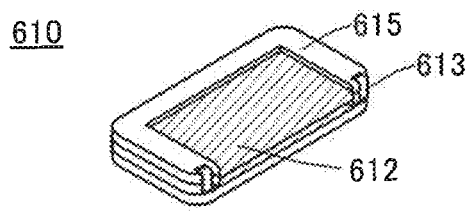

FIGS. 38E to 38G show a foldable portable information terminal 610. FIG. 38E shows the portable information terminal 610 that is opened. FIG. 38F shows the portable information terminal 610 that is being opened or being folded. FIG. 38G shows the portable information terminal 610 that is folded. The portable information terminal 610 is highly portable when folded. When the portable information terminal 610 is opened, a seamless large display region is highly browsable.

A display portion 612 is supported by three housings 615 joined together by hinges 613. By folding the portable information terminal 610 at a connection portion between two housings 615 with the hinges 613, the portable information terminal 610 can be reversibly changed in shape from an opened state to a folded state. A display device according to one embodiment of the present invention can be used for the display portion 612. For example, a display device that can be bent with a radius of curvature of greater than or equal to 1 mm and less than or equal to 150 mm can be used.

The electronic devices illustrated in FIGS. 38A to 38G can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Furthermore, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that the electronic devices illustrated in FIGS. 38A to 38G can have a variety of functions, not limited to the above functions.

Electronic devices described in this embodiment are characterized by having a display portion for displaying some sort of information. Note that the semiconductor device of one embodiment of the present invention can also be used for an electronic device that does not have a display portion.

The structure described in this embodiment can be used in appropriate combination with the structure described in any of the other embodiments.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive films, insulating films, semiconductor films, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

This application is based on Japanese Patent Application serial no. 2014-051798 filed with Japan Patent Office on Mar. 14, 2014, the entire contents of which are hereby incorporated by reference.

What is claimed is:

1. A method for manufacturing a semiconductor device comprising:
    forming an oxide semiconductor film;
    forming an insulating film over the oxide semiconductor film;
    forming a metal oxide film over and in contact with the insulating film, the metal oxide film including indium and zinc;
    adding oxygen to the insulating film through the metal oxide film;
    performing a heat treatment after adding oxygen;
    forming a conductive film over the metal oxide film after performing the heat treatment; and
    processing the insulating film and the metal oxide film so that a side surface of the insulating film, a side surface of the metal oxide film, and a side surface of the conductive film are aligned,
    wherein the metal oxide film and the conductive film are collectively configured to be a gate electrode of a transistor.

2. A method for manufacturing a semiconductor device comprising:
    forming an oxide semiconductor film;
    forming an insulating film over the oxide semiconductor film;
    forming a metal oxide film over and in contact with the insulating film, the metal oxide film including indium and zinc;
    adding oxygen to the insulating film through the metal oxide film;
    performing a heat treatment after forming the metal oxide film;
    forming a conductive film over the metal oxide film after performing the heat treatment; and
    processing the insulating film and the metal oxide film so that a side surface of the insulating film, a side surface of the metal oxide film, and a side surface of the conductive film are aligned,
    wherein the conductive film includes a region overlapping with the oxide semiconductor film with the insulating film and the metal oxide film interposed therebetween, and
    wherein the metal oxide film and the conductive film are collectively configured to be a gate electrode of a transistor.

3. A method for manufacturing a semiconductor device comprising:
    forming an oxide semiconductor film;
    forming an insulating film over the oxide semiconductor film;
    forming a first metal oxide film over and in contact with the insulating film, the first metal oxide film including indium and zinc;
    adding oxygen to the insulating film through the first metal oxide film;
    performing a heat treatment after forming the first metal oxide film;
    forming a conductive film as a first gate electrode over the first metal oxide film after performing the heat treatment;
    processing each of the insulating film and the first metal oxide film so that a first region and a second region in the oxide semiconductor film are exposed to form an gate insulating film and a second metal oxide film, respectively; and
    forming a nitride insulating film over the first region, the second region, and the first gate electrode so that the nitride insulating film being in contact with a top surface of the first region, a top surface of the second region, a top surface and a side surface of the first gate electrode, a side surface of the second metal oxide film, and a side surface of the gate insulating film,
    wherein the oxide semiconductor film further includes a third region between the first region and the second region, wherein the first gate electrode includes a region overlapping with the third region with the gate insulating film and the second metal oxide film interposed therebetween, wherein the side surface of the gate insulating film, the side surface of the second metal oxide film, and the side surface of the first gate electrode are aligned, and wherein the second metal oxide film and the first gate electrode are collectively configured to be a second gate electrode of a transistor.

4. A method for manufacturing a semiconductor device comprising:

forming an oxide semiconductor film;

performing a first heat treatment to the oxide semiconductor film;

forming an insulating film over the oxide semiconductor film after performing the first heat treatment;

forming a metal oxide film over and in contact with the insulating film, the metal oxide film including indium and zinc;

adding oxygen to the insulating film through the metal oxide film;

performing a second heat treatment after forming the metal oxide film;

forming a conductive film over the metal oxide film after performing the second heat treatment, and processing the insulating film and the metal oxide film so that a side surface of the insulating film, a side surface of the metal oxide film, and a side surface of the conductive film are aligned, wherein the metal oxide film and the conductive film are configured to collectively be a gate electrode of a transistor.

5. A method for manufacturing a semiconductor device comprising:

forming an oxide semiconductor film;

performing a first heat treatment to the oxide semiconductor film;

forming an insulating film over the oxide semiconductor film after performing the first heat treatment;

forming a metal oxide film over and in contact with the insulating film, the metal oxide film including indium and zinc;

adding oxygen to the insulating film through the metal oxide film;

performing a second heat treatment after forming the metal oxide film;

forming a conductive film over the metal oxide film after performing the second heat treatment; and processing the insulating film and the metal oxide film so that a side surface of the insulating film, a side surface of the metal oxide film, and a side surface of the conductive film are aligned, wherein the conductive film includes a region overlapping with the oxide semiconductor film with the insulating film and the metal oxide film interposed therebetween, and wherein the metal oxide film and the conductive film are collectively configured to be a gate electrode of a transistor.

6. A method for manufacturing a semiconductor device comprising:

forming an oxide semiconductor film;

performing a first heat treatment to the oxide semiconductor film;

forming an insulating film over the oxide semiconductor film after performing the first heat treatment;

forming a first metal oxide film over and in contact with the insulating film, the first metal oxide film including indium and zinc;

adding oxygen to the insulating film through the first metal oxide film;

performing a second heat treatment after forming the first metal oxide film;

forming a conductive film as a first gate electrode over the first metal oxide film after performing the second heat treatment;

processing each of the insulating film and the first metal oxide film so that a first region and a second region in the oxide semiconductor film are exposed to form an gate insulating film and a second metal oxide film, respectively; and forming a nitride insulating film over the first region, the second region, and the first gate electrode so that the nitride insulating film being in contact with a top surface of the first region, a top surface of the second region, a top surface and a side surface of the first gate electrode, a side surface of the second metal oxide film, and a side surface of the gate insulating film, wherein the oxide semiconductor film further includes a third region between the first region and the second region, wherein the first gate electrode includes a region overlapping with the third region with the gate insulating film and the second metal oxide film interposed therebetween, wherein the side surface of the gate insulating film, the side surface of the second metal oxide film, and the side surface of the first gate electrode are aligned, and wherein the second metal oxide film and the first gate electrode are collectively configured to be a second gate electrode of a transistor.

* * * * *